(12) United States Patent
Sugaya et al.

(10) Patent No.: US 11,362,059 B2
(45) Date of Patent: Jun. 14, 2022

(54) MANUFACTURING METHOD AND MANUFACTURING APPARATUS FOR STACKED SUBSTRATE, AND PROGRAM

(71) Applicant: NIKON CORPORATION, Tokyo (JP)

(72) Inventors: Isao Sugaya, Tokyo (JP); Atsushi Kamashita, Tokyo (JP); Hajime Mitsuishi, Tokyo (JP); Minoru Fukuda, Tokyo (JP)

(73) Assignee: Nikon Corporation, Tokyo (JP)

( * ) Notice: Subject to any disclaimer, the term of this patent is extended or adjusted under 35 U.S.C. 154(b) by 49 days.

(21) Appl. No.: 16/862,982

(22) Filed: Apr. 30, 2020

(65) Prior Publication Data

US 2020/0273836 A1 Aug. 27, 2020

Related U.S. Application Data

(63) Continuation of application No. PCT/JP2018/037624, filed on Oct. 9, 2018.

(30) Foreign Application Priority Data

Nov. 2, 2017 (JP) ................................. 2017-213066

(51) Int. Cl.
*H01L 23/00* (2006.01)
*H01L 33/00* (2010.01)
(Continued)

(52) U.S. Cl.
CPC .......... *H01L 24/80* (2013.01); *H01L 21/2007* (2013.01); *H01L 22/22* (2013.01);
(Continued)

(58) Field of Classification Search
CPC ... H01L 21/2007; H01L 21/187; H01L 22/12; H01L 22/22; H01L 2224/80894; H01L 2224/80895; H01L 2224/80896
See application file for complete search history.

(56) References Cited

U.S. PATENT DOCUMENTS

2017/0278803 A1  9/2017  Sugaya et al.

FOREIGN PATENT DOCUMENTS

| JP | 2012-038860 A | 2/2012 |
|----|---------------|--------|
| JP | 2013-098186 A | 5/2013 |

(Continued)

OTHER PUBLICATIONS

Notice of Reasons for Refusal from the Japanese Patent Office, issued in the counterpart Japanese Patent Application No. 2019-550958 dated Nov. 4, 2020.

(Continued)

*Primary Examiner* — David A Zarneke

(74) *Attorney, Agent, or Firm* — Finnegan, Henderson, Farabow, Garrett & Dunner, L.L.P.

(57) ABSTRACT

A manufacturing method for manufacturing a stacked substrate by bonding two substrates includes: acquiring information about crystal structures of a plurality of substrates; and determining a combination of two substrates to be bonded to each other, based on the information about the crystal structures. In the manufacturing method described above, the information about the crystal structures may include at least one of plane orientations of bonding surfaces and crystal orientations in a direction in parallel with the bonding surfaces. In the manufacturing methods described above, the determining may include determining a combination of the two substrates with a misalignment amount after bonding being equal to or smaller than a predetermined threshold.

8 Claims, 42 Drawing Sheets

(51) Int. Cl.
  *H01L 21/20* (2006.01)
  *H01L 21/66* (2006.01)
  *H01L 21/18* (2006.01)

(52) U.S. Cl.
  CPC ............ *H01L 24/08* (2013.01); *H01L 24/741* (2013.01); *H01L 33/0093* (2020.05); *H01L 21/187* (2013.01); *H01L 22/12* (2013.01); *H01L 2224/0224* (2013.01); *H01L 2224/08145* (2013.01); *H01L 2224/8013* (2013.01); *H01L 2224/80895* (2013.01); *H01L 2224/80896* (2013.01)

(56) References Cited

FOREIGN PATENT DOCUMENTS

| | | |
|---|---|---|
| JP | 2017-112322 A | 6/2017 |
| KR | 10-2017-0094327 A | 8/2017 |
| TW | 201633367 A | 9/2016 |
| WO | WO 2016/093284 A1 | 6/2016 |

OTHER PUBLICATIONS

Written Opinion of the International Searching Authority for International Application No. PCT/JP2018/037624 dated Nov. 6, 2018.
International Preliminary Report on Patentability, in corresponding international application No. PCT/JP2018/037624, dated May 5, 2020.
Notice of Reasons for Refusal issued by Japanese Patent Office in counterpart Japanese Patent Application No. 2019-550958, dated Jul. 6, 2021.
International Search Report of International Application No. PCT/JP2018/037624 dated Nov. 6, 2018.
Notification of Reasons for Refusal issued by Korean Patent Office in counterpart Korean Patent Application No. 10-2020-7011083, dated Jun. 18, 2021.
Notice of Reasons for Refusal issued by Japanese Patent Office in counterpart Japanese Patent Application No. 2019-550958, dated Jan. 11, 2022.

629

| FIRST SUBSTRATE | SECOND SUBSTRATE |
|---|---|
| (100) 0° | (100) 45°<br>(100) 315° |
| (100) 45° | (100) 90°<br>(100) 0° |
| (100) 90° | (100) 135°<br>(100) 45° |
| ⋮ | ⋮ |
| (100) 315° | (100) 270°<br>(100) 0° |

FIG. 5

MANUFACTURING METHOD AND MANUFACTURING APPARATUS FOR STACKED SUBSTRATE, AND PROGRAM

The contents of the following Japanese patent application are incorporated herein by reference:
NO. 2017-213066 filed in JP on Nov. 2, 2017.
NO. PCT/JP2018/037624 filed on Oct. 9, 2018.

BACKGROUND

1. Technical Field

The present invention relates to a manufacturing method and a manufacturing apparatus for a stacked substrate, and a program.

2. Related Art

There have been techniques of manufacturing a stacked substrate by bonding a plurality of substrates to each other (see, for example, PTL1).
[PTL1] JP-A-2013-098186
When a stacked substrate is manufactured, in a process of bonding substrates, misalignment and deformation not found before the bonding may occur due to anisotropy of the substrates.

GENERAL DISCLOSURE

A first aspect of the present invention provides a manufacturing method for manufacturing a stacked substrate by bonding two substrates, the method including: acquiring information about crystal structures of a plurality of substrates; and determining a combination of two substrates to be bonded to each other, based on the information about the crystal structures.

A second aspect of the present invention provides a manufacturing method for manufacturing a stacked substrate by bonding two substrates, the method including: acquiring information about rigidity distributions of a plurality of substrates; and determining a combination of two substrates to be bonded to each other, based on the information about the rigidity distributions.

A third aspect of the present invention provides a manufacturing method for manufacturing a stacked substrate by bonding two substrates, the method including: aligning the two substrates with at least one of plane orientations of bonding surfaces of the two substrates, crystal orientations in a direction in parallel with the bonding surfaces, and rigidity distributions being different from each other; and bonding the two substrates aligned.

A fourth aspect of the present invention provides a manufacturing apparatus for manufacturing a stacked substrate by bonding two substrates, the apparatus including: an acquiring unit that acquires information about crystal structures of a plurality of substrates; and a determining unit that determines a combination of the two substrates to be bonded to each other, based on the information about the crystal structures.

A fifth aspect of the present invention provides a manufacturing apparatus for manufacturing a stacked substrate by bonding two substrates, the apparatus including: an acquiring unit that acquires information about rigidity distributions of a plurality of substrates; and a determining unit that determines a combination of two substrates to be bonded to each other, based on the information about the rigidity distributions.

A sixth aspect of the present invention provides a manufacturing apparatus for manufacturing a stacked substrate by bonding two substrates, the apparatus including: an aligning unit that aligns the two substrates with at least one of plane orientations of bonding surfaces of the two substrates, crystal orientations in a direction in parallel with the bonding surfaces, and rigidity distributions being different from each other; and a bonding unit that bonds the two substrates aligned.

A seventh aspect of the present invention provides an exposure device that forms a pattern on a substrate, in which the exposure device exposes the substrate to form a pattern, based on a rotation angle of the substrate in a bonding surface with respect to another substrate to be bonded to the substrate, and the rotation angle is set based on information about at least one of crystal structures and rigidity distributions of the substrate and the other substrate.

An eighth aspect of the present invention provides a program causing an electronic computer to execute steps of: in manufacturing a stacked substrate by bonding two substrates, acquiring information about crystal structures of a plurality of substrates; and determining a combination of the two substrates to be bonded to each other, based on the information about the crystal structures.

A ninth aspect of the present invention provides a program causing an electronic computer to execute steps of: in manufacturing a stacked substrate by bonding two substrates, acquiring information about rigidity distributions of a plurality of substrates; and determining a combination of two substrates to be bonded to each other, based on the information about the rigidity distributions.

A tenth aspect of the present invention provides a stacked semiconductor device comprising two substrates stacked to each other, in which at least one of plane orientations of bonding surfaces of the two substrates, crystal orientations in a direction in parallel with the bonding surfaces of the two substrates, and rigidity distributions of the two substrates are different from each other.

The summary clause does not necessarily describe all necessary features of the embodiments of the present invention. The present invention may also be a sub-combination of the features described above.

BRIEF DESCRIPTION OF THE DRAWINGS

FIG. 5 is a diagram illustrating a table 629 stored in a storage unit 620.

DESCRIPTION OF EXEMPLARY EMBODIMENTS

Hereinafter, the present invention will be described through embodiments of the invention. The embodiments described below are not intended to limit the invention within the scope of the claims. Not all the combinations of features described in the embodiments are essential for means for solving problems according to the present invention.

Figure 1:
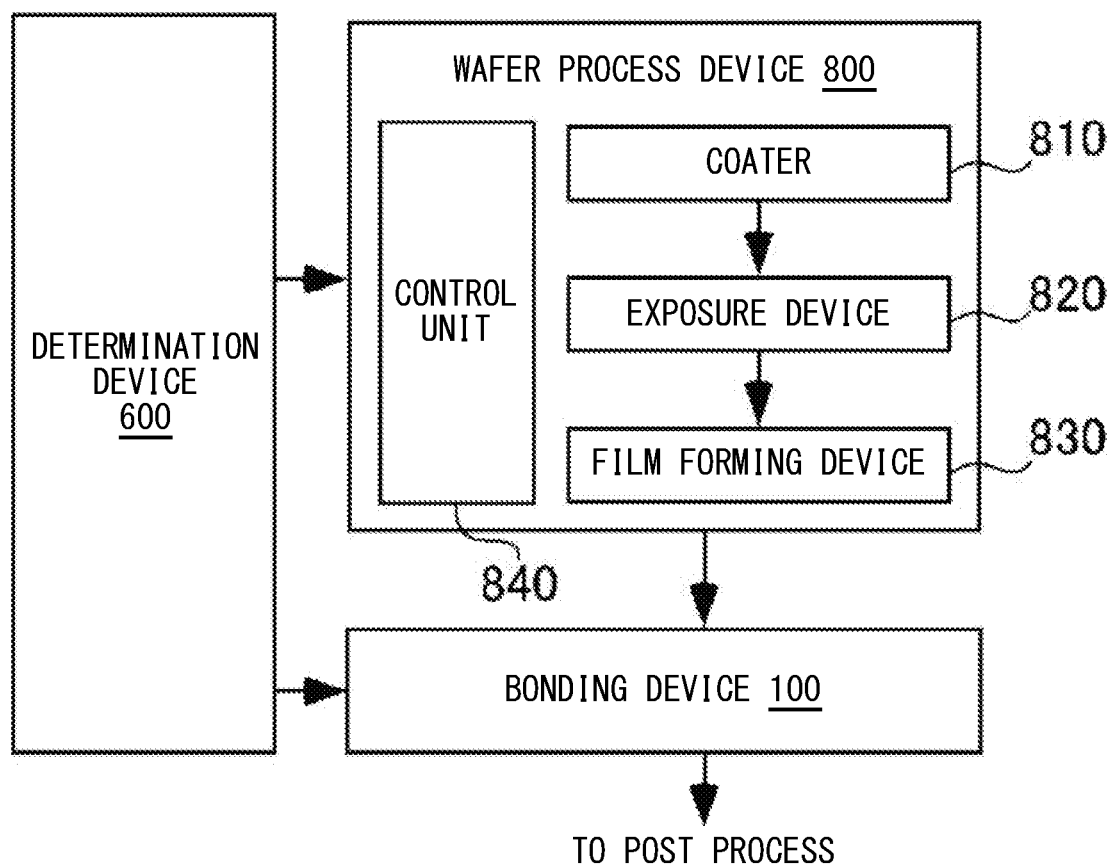
FIG. 1 is a block diagram of a manufacturing apparatus 901.

FIG. 1 is a block diagram illustrating a manufacturing apparatus 901 that manufactures a stacked substrate by bonding substrates to each other. The manufacturing apparatus 901 includes a wafer process device 800, a bonding device 100, and a determination device 600.

The "bonding" of substrates includes permanently integrating two substrates laid one on top of the other, to obtain bonding strength exceeding a predetermined value. Furthermore, when the substrates include electrical connection terminals, the "bonding" includes electrically coupling the connection terminals of the two substrates to each other to achieve a state where electrical conduction is secured between the substrates.

A process such as annealing may be employed to increase the bonding strength of the substrates laid one on top of the other to the predetermined value, or to establish the electrical connection between the substrates. In such cases, a provisional bonded state, which is a state where the two substrates are temporarily coupled to each other before the annealing, may be referred to as a bonded state. In such a case, the substrates provisionally bonded to each other can be separated from each other to be reused without wearing in some cases.

The wafer process device 800 includes a coater 810, an exposure device 820, a film forming device 830, and a control unit 840. Furthermore, the wafer process device 800 may further include a drying device, an etching device, a cleaning device, a thinning device, and the like.

In the wafer process device 800, the coater 810 performs resist coating on a substrate such as a semiconductor monocrystalline wafer loaded thereto, to form a resist layer. The exposure device 820 patterns the resist layer by using a reticle prepared in advance. The film forming device 830 forms, on the substrate, a thin film on which structures such as an element or wiring are formed by using the resist layer thus patterned. In the wafer process device 800, the process described above is repeated, so that the structures are stacked to form a three-dimensional structure on the substrate.

In the wafer process device 800, the control unit 840 sets process conditions for stages such as coating, exposure, film forming, etching, and cleaning to the components, so that the structure is formed under appropriate conditions. Furthermore, the control unit 840 sets the process condition to the exposure device 820 to control a process of correcting deformation, magnification, and the like with respect to a design specification, for the pattern formed on the substrate.

Figure 2:
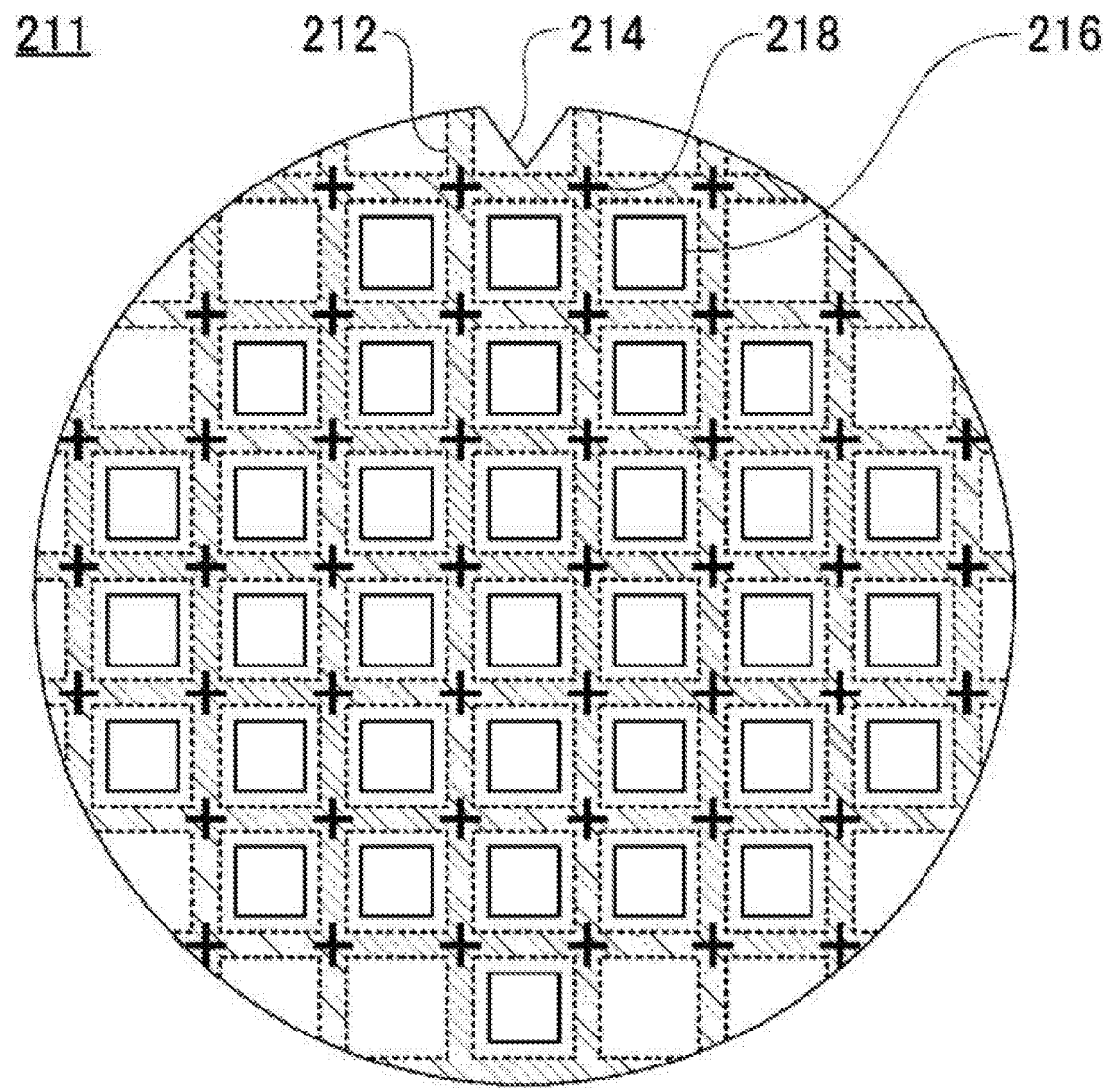
FIG. 2 is a schematic plan view of a first substrate 211.

FIG. 2 is a schematic plan view of a first substrate 211 manufactured by the wafer process device 800 in one example. The first substrate 211 includes a notch 214, a plurality of circuit regions 216, and a plurality of alignment marks 218.

The circuit regions 216 are periodically arranged in a plane direction of the first substrate 211, on the surface of the first substrate 211. Each of the circuit regions 216 is provided with structures such as wiring, an element, and a protection film. The circuit region 216 is provided with a connection portion, such as a pad and a bump, to be an electrical connection terminal when the first substrate 211 is coupled to another first substrate 211, a lead frame, or the like. The connection portion is also one of the structures formed on the surface of the first substrate 211.

The alignment mark 218 is an example of the structures formed on the surface of the first substrate 211, and is disposed at a predetermined relative position with respect to the connection portion and the like in the circuit region 216. Thus, the circuit region 216 can be aligned with reference to the alignment mark 218. A structure material other than the semiconductor substrate having the structure as described above, such as an unprocessed semiconductor substrate, glass substrate, or the like, may be bonded to the first substrate 211. In such a case, no alignment is required, and thus the alignment mark 218 is not required.

In the first substrate 211, scribe lines 212 are provided between the plurality of circuit regions 216. The scribe lines 212 not structures but virtual cutting lines along which the first substrate 211 including the circuit regions 216 is cut into pieces by dicing. The scribe lines 212 also serve as reserving spaces for dicing, to be finally removed from the first substrate 211. Thus, the alignment marks 218, which would not be required in the first substrate 211 completed as a semiconductor device, may be provided on the scribe lines 212.

For example, the first substrate 211 is manufactured by forming the structure on a silicon monocrystalline substrate by the wafer process device 800. As a material of the first substrate 211, a SiGe substrate or a Ge monocrystalline substrate doped with Ge, or group III-V, group II-VI group, or other compound semiconductor wafers may be used.

Referring back to FIG. 1, in the manufacturing apparatus 901, the bonding device 100 forms a stacked substrate by bonding a plurality of substrates, two substrates for example, that are manufactured by the wafer process device 800. In the stacked substrate, the circuits and the like formed on the two substrates are coupled to each other, so that a structure of a larger scale can be formed than with a single-layer substrate. The stacked substrate may be prepared by bonding substrates formed of different materials or by different processes, so that a semiconductor device with high performance unachievable by a single substrate can be formed. The structure of the bonding device 100 will be described later with reference to FIG. 10.

In the manufacturing apparatus 901, the determination device 600 determines at least a part of the process conditions set to the wafer process device 800 and the bonding device 100. For example, the process conditions determined by the determination device 600 are set to the components in the wafer process device 800 by the control unit 840 of the wafer process device 800, to be reflected on the substrate preparation by the wafer process device 800. Furthermore, a part of the process conditions determined by the determination device 600 may be set to the bonding device 100 to bond substrates.

Figure 3:
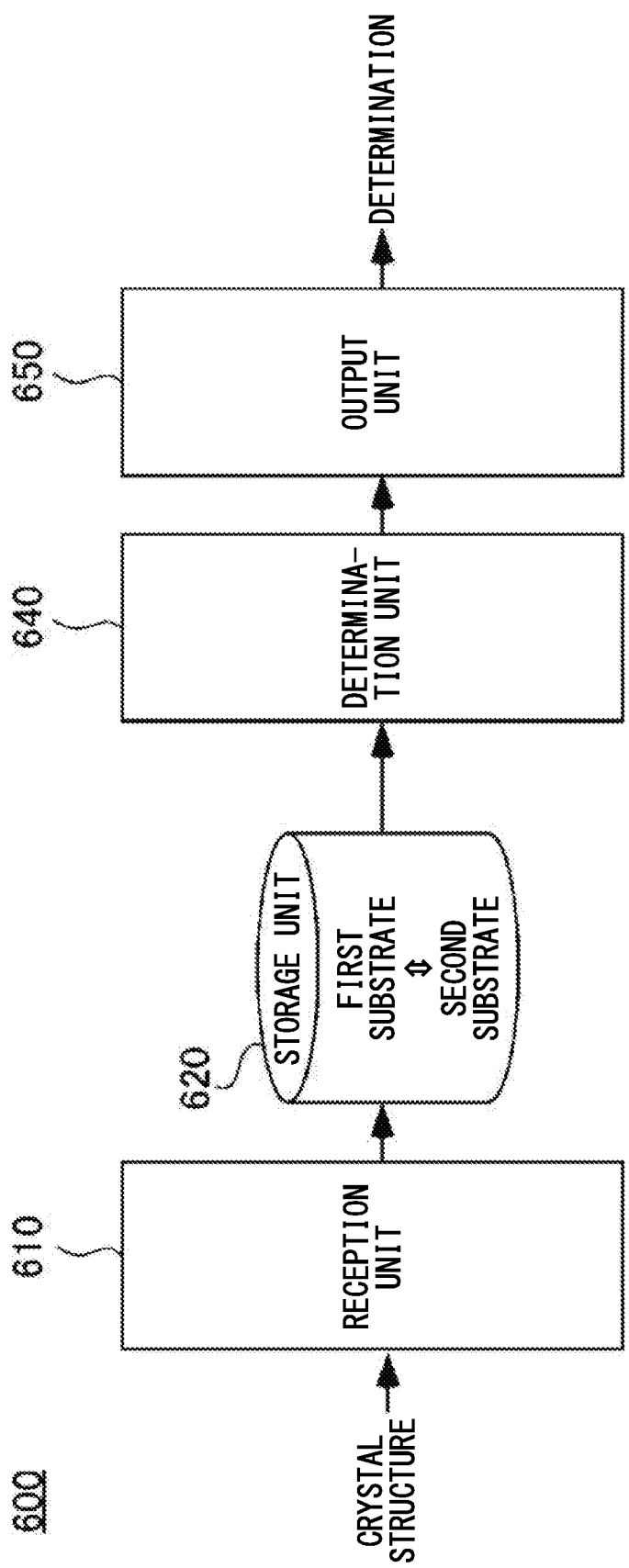
FIG. 3 is a block diagram of a determination device 600.
Figure 4:
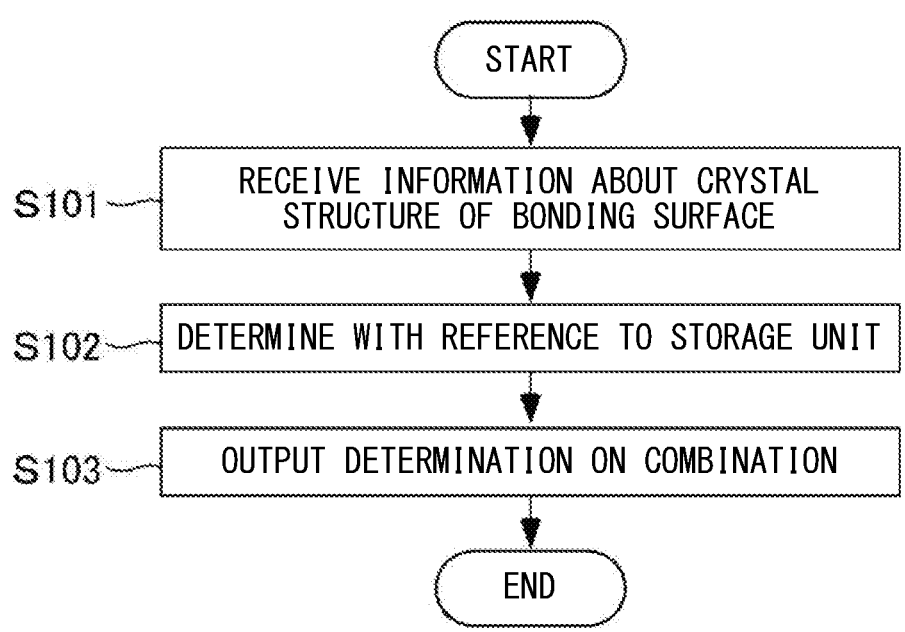
FIG. 4 is a flowchart illustrating a procedure of operations of the determination device 600.

FIG. 3 is a block diagram illustrating an example of the determination device 600 in the manufacturing apparatus 901. The determination device 600 includes a reception unit 610, a storage unit 620, a determining unit 640, and an output unit 650. FIG. 4 is a flowchart illustrating an operation of the determination device 600.

The reception unit 610 receives information about the first substrate 211 to be bonded by the bonding device 100 (step S101 in FIG. 4). This information received by the reception unit 610 includes information about a crystal structure on a bonding surface of the first substrate 211, that is, a bonding surface to come into contact with and be coupled to another substrate when the first substrate 211 is bonded. The information about the crystal structure of the first substrate 211 may include information indicating the composition of the first substrate 211, information indicating a plane orientation of the bonding surface, and information about plane orientation indicating the direction of a crystal orientation in parallel with the bonding surface. The crystal orientation in a direction in parallel with the bonding surface includes a crystal orientation in a direction orthogonal to a side surface of the first substrate 211. The information may include the position of the notch 214 corresponding to the crystal orientation in parallel with the bonding surface of the first substrate 211. The position of the notch 214 in the first substrate 211 can be represented by a direction from the center of the first substrate 211 to the position of the notch 214, and the information indicates an angle of rotation about the center of the first substrate 211 in a clockwise direction from the state illustrated in FIG. 2, which defined as 0°, for example. In the rotated state, the crystal orientation in a direction in parallel with the bonding surface is tilted in the rotation direction in the bonding surface, from the state with the rotation angle of 0°. A state where the first substrate 211 is rotated with respect to a second substrate 213 is a state as a result of tilting the crystal orientation of the first substrate 211, from a state where the crystal orientation in a direction in parallel with the bonding surface of the first substrate 211 is aligned with the crystal orientation along the bonding surface of the second substrate 213.

The storage unit 620 in the determination device 600 stores information indicating a combination of a set of substrates including the first substrate 211 that are bonded to manufacture the stacked substrate, with a predetermined condition satisfied. Such information about a combination of substrates can be prepared by performing an experiment or analysis in advance. The information about a combination may be revised with reference to the misalignment amount or the warpage amount of a substrate in the stacked substrate manufactured by the manufacturing apparatus 901 in operation.

Herein, the predetermined condition to be satisfied by the stacked substrate refers to, for example, the misalignment between the substrates in the stacked substrate manufactured by the bonding not exceeding a predetermined threshold. For example, the predetermined threshold means a maximum value of the misalignment amount, between the two substrates forming the stacked substrate in a stage with the stacked substrate formed, with which electrical connection can be maintained between a circuit of one substrate and a circuit of the other substrate.

The predetermined condition to be satisfied by the stacked substrate may further include an amount of deformation, such as warpage, of the stacked substrate as a whole. The amount of deformation can be expressed by a physical quantity such as a level difference on the substrate surface measured through observation. Furthermore, a minimum bonding strength between two bonded substrates with which electrical connection can be practically maintained between the circuits of the two substrates may also be used as the above-described predetermined threshold.

FIG. 5 is a diagram illustrating an example of a table 629 stored in the storage unit 620. As illustrated in the figure, in the table 629 stored in the storage unit 620, a plurality of combinations between the first substrate 211 and the second substrate 213 are listed.

Here, the column of the first substrate 211 corresponds to the information about the crystal structure on the bonding surface of a substrate serving as a candidate of one of the substrates of the combination, received by the reception unit 610 of the determination device 600. In the illustrated example, a plane orientation (100) in the bonding surface of the first substrate 211 and a position 0° of the notch 214 corresponding to the crystal orientation in parallel with the bonding surface are stored in the left column of the table 629. The description such as "(100)" is a mirror index for displaying the plane orientation.

The column for the second substrate 213 indicates the information about the crystal structure of the other substrate that can be bonded to the first substrate 211 described in the left column, to be a combination satisfying the predetermined condition. In the illustrated example, the right column of the table 629 stores the second substrate 213 that is a substrate with the same plane orientation (100) and a different notch position relative to the bonding surface of the first substrate 211.

Referring back to FIG. 3, when the reception unit 610 receives the information about the first substrate 211, the determining unit 640 refers to the table 629 in the storage unit 620 to determine the second substrate 213 to be combined (step S102 in FIG. 4). In the illustrated example, when the information (100) and 0° about the crystal structure of the first substrate 211 on the top row of the left column is received, the determining unit 640 determines (100) 45° or (100) 315° on the top row of the right column. In this manner, the determination device 600 determines the second substrate 213 combined with the first substrate 211, with no calculation process such as analysis or pattern matching.

In the determination device 600, the determination made by the determining unit 640 is output to the outside via the output unit 650 (step S103 in FIG. 4). In step S103, the output unit 650 of the determination device 600 may display the determination made by the determining unit 640 on a display device for example, to inform the user of the determination. In the manufacturing apparatus 901, the wafer process device 800 may be informed of the determination to manufacture the second substrate 213 satisfying the determined specification.

When the second substrate 213 is a substrate requiring no precise alignment, such as an unprocessed supporting substrate, in particular, the bonding device 100 may be informed of the determination made by the determining unit 640 to adjust the position of the notch of the second substrate to be bonded to the first substrate 211.

Figure 6:
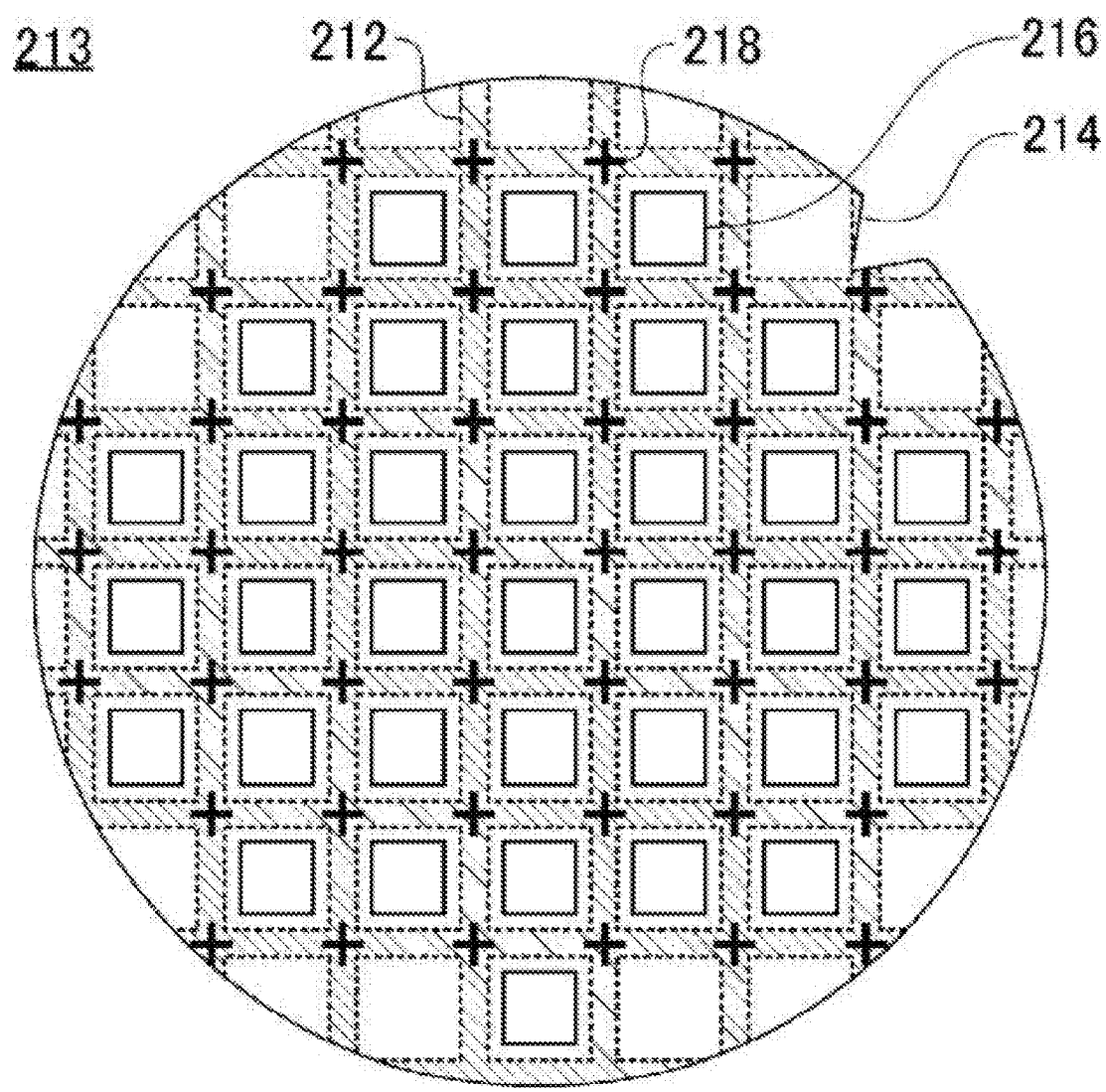
FIG. 6 is a schematic plan view of a substrate 213.

FIG. 6 is a plan view schematically illustrating the second substrate 213 with a crystal structure of (100) 45° appearing on the bonding surface. As illustrated in the figure, the second substrate 213 includes a notch 214, circuit regions 216, and alignment marks 218.

The alignment marks 218 of the second substrate 213 are arranged at positions enabling alignment between the circuit regions 216 of the first substrate and the circuit regions 216 of the second substrate 213. Thus, when the stacked substrate is formed in an aligned state achieved with the alignment marks 218, the circuit regions 216 of the first substrate are electrically coupled to the circuit regions 216 of the second substrate 213.

The position of the notch 214 in the second substrate 213 is rotated clockwise by 45° from the position of the notch of the first substrate 211 as viewed from the bonding surface side. In this state, the crystal orientation of the second substrate 213 is tilted by 45° from the state where the crystal orientation in the direction in parallel with the bonding surface of the first substrate 211 and the crystal orientation along the bonding surface of the second substrate 213 are aligned. Thus, when the alignment is achieved with the alignment marks 218, the first substrate 211 and the second substrate 213 are bonded to each other while having the same plane orientation (100) and with the crystal orientations in parallel with the bonding surfaces rotated by 45°.

The second substrate 213 is manufactured with the wafer process device 800 notified of information indicating a determination made by the determination device 600 that the substrate to be combined with the first substrate 211 is "a substrate with the direction of the crystal orientation in parallel with the bonding surface being rotated by 45° with respect to the first substrate 211, in the bonding surface". The control unit 840 of the wafer process device 800 that has acquired the information about the determination from the determination device 600 loads a wafer with a surface as a surface (100) to the exposure device 820, to form a pattern of the structure in a state where the notch 214 of the wafer is rotated by 45° with respect to the position of the notch 214 of the first substrate 211. Specifically, the exposure device 820 exposes the substrate to light to form the pattern, based on the rotation angle determined by the determination device 600. As a result, the second substrate 213 with the specification illustrated in FIG. 6 is manufactured.

Next, a procedure for manufacturing a stacked substrate 230 by bonding the first substrate 211 and the second substrate 213 to each other, and misalignment between the first substrate and the second substrate occurring in the procedure will be described. Then, information about crystals referred to in the storage unit 620 will be described.

Figure 7:
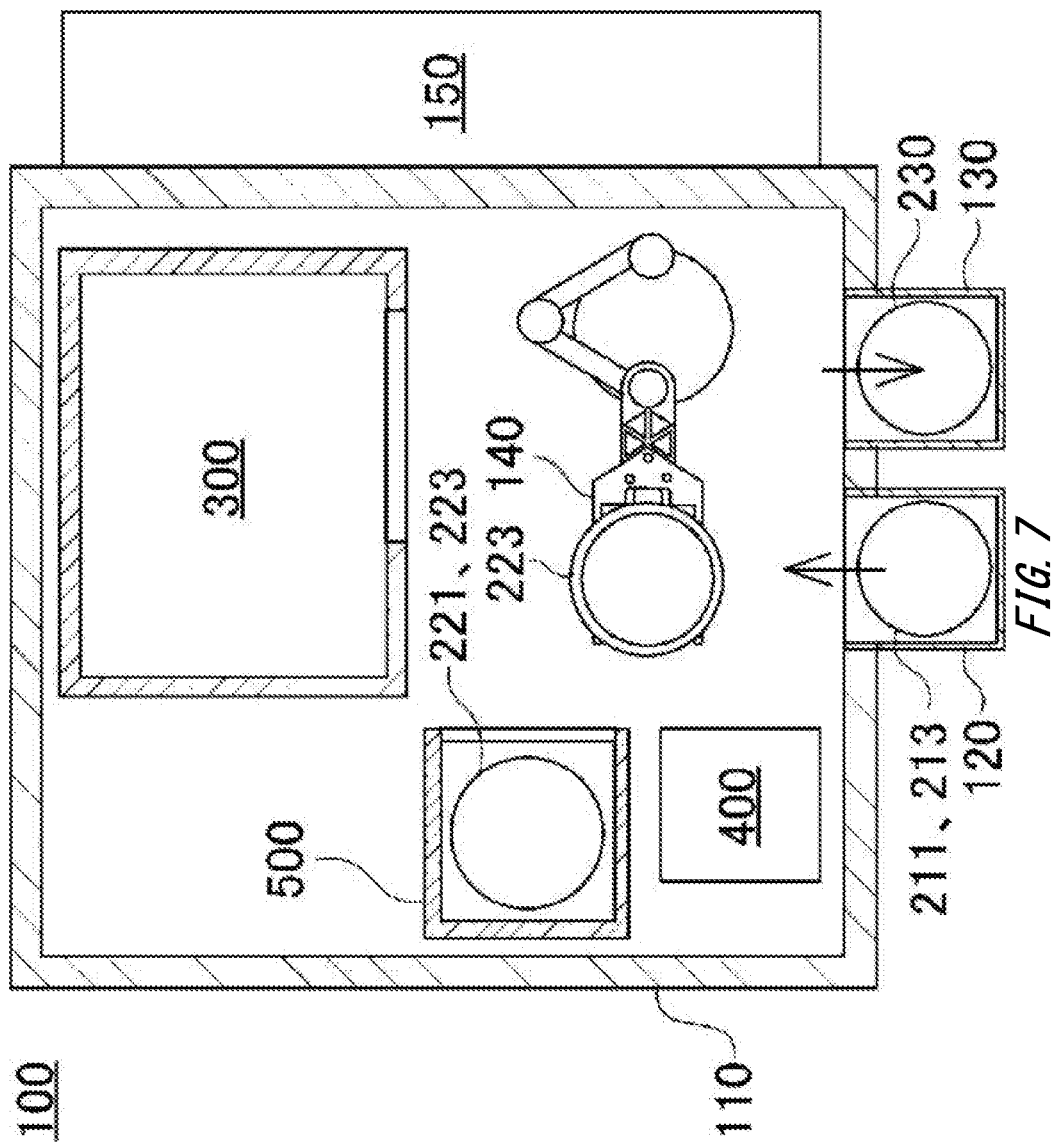
FIG. 7 is a schematic view of a bonding device 100.

FIG. 7 is a schematic plan view of the bonding device 100 that manufactures the stacked substrate 230 by bonding the first substrate 211 and the second substrate 213 to each other. The bonding device 100 includes a casing 110, substrate cassettes 120 and 130, and a control unit 150 attached to the outer side of the casing 110, as well as a conveyance unit 140, a bonding unit 300, a holder stocker 400, and a pre-aligner 500 that are accommodated in the casing 110.

The temperature inside the casing 110 is managed to be maintained at a room temperature, for example. One substrate cassette 120 accommodates the substrates 211 and 213 to be loaded to the bonding device 100 to be bonded to each other. The other substrate cassette 130 accommodates the stacked substrate 230 formed by the bonding and unloaded from the bonding device 100.

The first substrate 211 and the second substrate 213 may be accommodated in the substrate cassette 120 in a state where they are identifiable. The number of substrate cassettes 120 may be increased, so that a substrate cassette 120 for accommodating the first substrate 211 and a substrate cassette 120 for accommodating the second substrate 213 are provided separately.

The control unit 150 controls the operations of the units of the bonding device 100 and makes the units cooperate with each other, to perform overall control on the bonding device 100 as a whole. The control unit 150 further includes a user interface that receives an instruction from the user related to a setting of an operation condition and the like and displays the operation state of the control unit 150 to the user, and a communication unit that receives the information about the first substrate 211, the second substrate 213, and the stacked substrate 230 from the outside, and the like.

The bonding unit 300 forms the stacked substrate 230 by aligning and bonding the first substrate 211 and the second substrate 213 to each other. The configuration and operations of the bonding unit 300 will be described later with reference to FIG. 11 and FIG. 13 to FIG. 16.

The pre-aligner 500 causes substrate holders 221 and 223 to hold the first substrate 211 and the second substrate 213 to be loaded to the bonding unit 300. In the pre-aligner 500, the first substrate 211 and the second substrate 213 are aligned with respect to the substrate holders 221 and 223 with alignment accuracy relatively lower than that in the bonding unit 300. Thus, the positions of the first substrate 211 and the second substrate 213 with respect to the substrate holders 221 and 223 are determined based on the accuracy in the pre-aligner 500, whereby a process time can be shorted in a case where highly accurate alignment is performed in the bonding unit 300.

The first substrate 211 and the second substrate 213 are bonded to each other while having the crystal orientations of the bonding surfaces different from each other in the rotation direction. Thus, the orientations of the first substrate 211 and the second substrate 213 held by the substrate holders 221 and 223 in the pre-aligner 500 are determined by setting the notches 214 to be at different positions. The positions of the first substrate 211 and the second substrate 213 on the substrate holders 221 and 223 may be aligned not with reference to the notches 214, but with reference to the alignment marks 218, for example. In the example illustrated in FIG. 6, the rotation is performed after the notch 214 is formed in the second substrate 213. When the notch 214 is formed after the rotation, the notch 214 may be formed at the 0° position. In this case, the position of the second substrate 213 is determined with reference to the position of the notch 214.

The substrate holder 221, 213 is taken out from the holder stocker 400 and attracts and holds the first substrate 211 or the second substrate 213 in the pre-aligner 500. The substrate holder 221, 223 holding the first substrate 211 or the second substrate 213 is loaded to the bonding unit 300 together with the first substrate 211 or the second substrate 213. When the stacked substrate 230 formed by bonding the first substrate 211 and the second substrate 213 to each other is unloaded from the bonding unit 300, the substrate holder 221, 223 is separated from the stacked substrate 230, and returns to the holder stocker 400. In this manner, the substrate holder 221, 223 is repeatedly used while circulating inside the bonding device 100.

The conveyance unit 140 is positioned inside the casing 110 and conveys any of the first substrate 211 and the second substrate 213 before the bonding, the substrate holder 221, 223, and the substrate holder 221, 223 holding the first substrate 211 or the second substrate 213, and the stacked substrate 230 formed by bonding the first substrate 211 and the second substrate 213 to each other. Specifically, the conveyance unit 140 unloads the substrate holder 221, 223 from the holder stocker 400 and conveys the substrate holder 221, 223 to the pre-aligner 500. The conveyance unit 140 further conveys the first substrate 211 and the second substrate 213, unloaded from the substrate cassette 120, to the pre-aligner 500. Furthermore, the conveyance unit 140 loads the substrate holder 221, 223 holding the first substrate 211 or the second substrate 213 from the pre-aligner 500 to the bonding unit 300, and stores the stacked substrate 230 formed by the bonding unit 300 in the substrate cassette 130.

Figure 8:
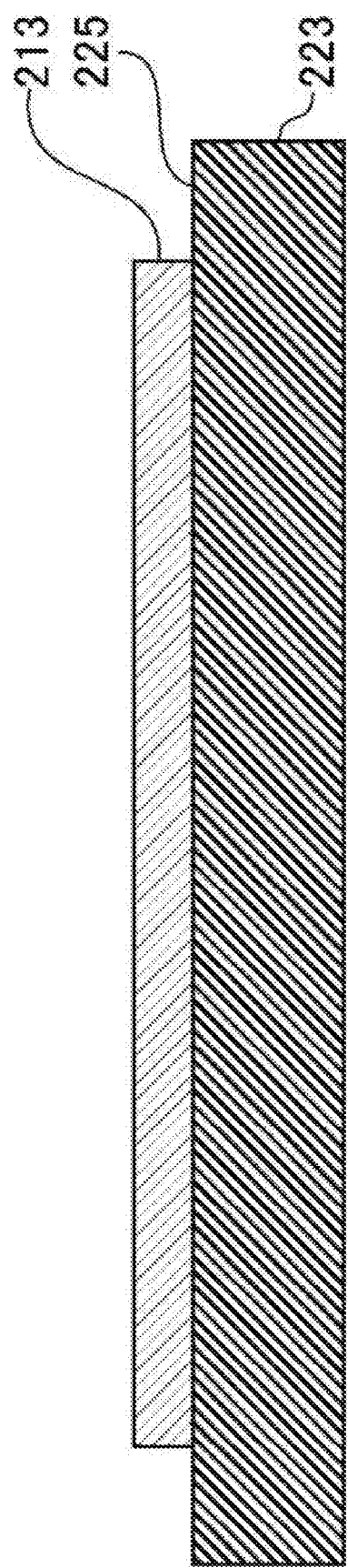
FIG. 8 is a schematic cross-sectional view of a substrate holder 223 holding the substrate 213.

FIG. 8 is a diagram schematically illustrating a state where the substrate holder 223 taken out from the holder stocker 400 is holding the second substrate 213 taken out from the substrate cassette 120. As illustrated in the figure, the substrate holder 223 has a larger thickness and diameter than the second substrate 213, and has a flat attraction surface 225. The attraction surface 225 attracts the substrate 213 by means of an electrostatic chuck, a vacuum chuck, and the like, to integrate the substrate 213 with the substrate holder 223.

Figure 9:
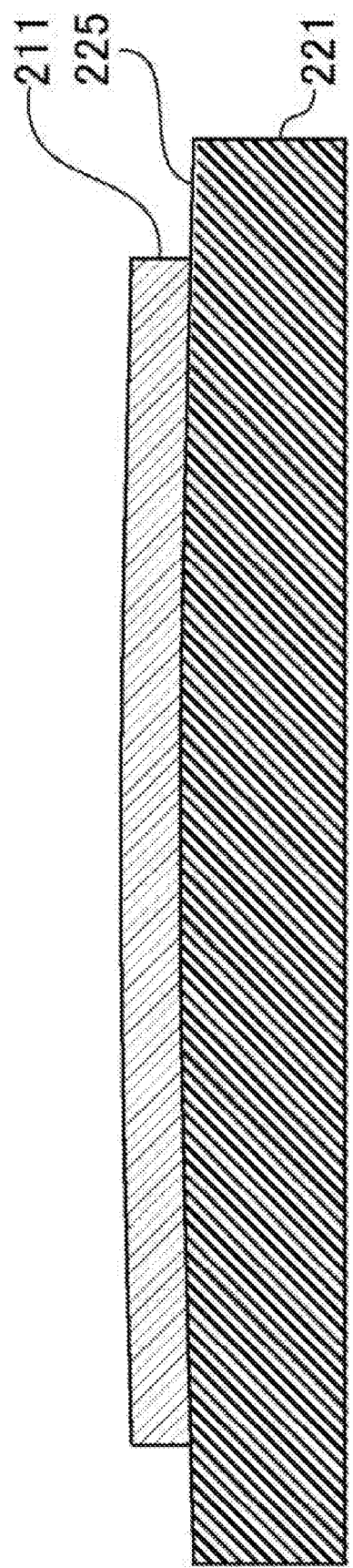
FIG. 9 is a schematic cross-sectional view of a substrate holder 221 holding the first substrate 211.

FIG. 9 is a diagram schematically illustrating a state where the substrate holder 221 taken out from the holder stocker 400 is holding the first substrate 211 taken out from the substrate cassette 120. The substrate holder 221 has a larger thickness and diameter than the first substrate 211 as with the case of the substrate holder 223. On the other hand, the substrate holder 221 is different from the substrate holder 223 illustrated in FIG. 8, in that the attraction surface 225 that attracts the first substrate 211 has a protruding shape with the center part raised.

Figure 10:
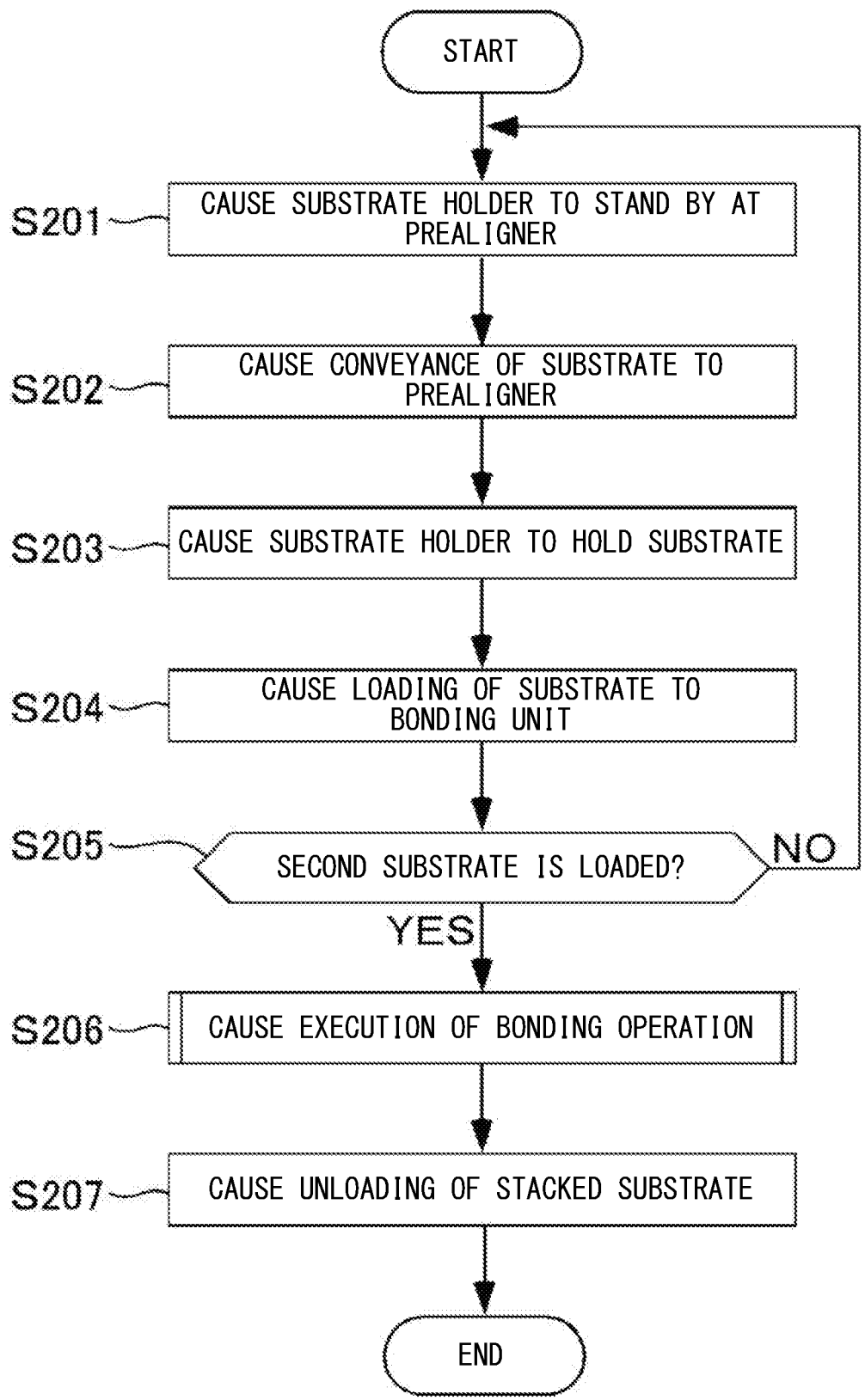
FIG. 10 is a flowchart illustrating a procedure of operations a bonding unit 300.

FIG. 10 is a flowchart illustrating a procedure for forming the stacked substrate 230 by using the bonding device 100. First of all, the control unit 150 causes the conveyance unit 140 to take out the substrate holder 223 that is one of the plurality of substrate holders 221 and 223 accommodated in the holder stocker 400 and to make the substrate holder 223 stand by at the pre-aligner 500 (step S201). Next, the control unit 150 causes the conveyance unit 140 to take out the second substrate 213, accommodated in the substrate cassette 120, from the cassette 120 (step S202), and to make the substrate holder 223 attract and hold the second substrate 213 in the pre-aligner 500 (step S203). Furthermore, the control unit 150 causes the conveyance unit 140 to load the substrate 213 held by the substrate holder 223 to the bonding unit 300 (step S204).

Here, the control unit 150 checks whether the substrate 213 loaded to the bonding unit 300 in step S201 to step S204 is the first one or the second one of the pair of substrates to be bonded to each other (step S205). When the substrate that has just been loaded is the first substrate (step S205: NO), the control unit 150 repeats step S201 to step S204 described above to cause the first substrate 211 as the second substrate to be loaded to the bonding unit 300 together with the substrate holder 221 (step S204).

Specifically, the control unit 150 causes the conveyance unit 140 to take out the substrate holder 221 that is the other of the plurality of substrate holders 221 and 223 accommodated in the holder stocker 400 and to make the substrate holder 221 stand by at the pre-aligner 500 (step S201). Next, the control unit 150 causes the conveyance unit 140 to take out the first substrate 211, accommodated in the substrate cassette 120, from the cassette 120 (step S202), and to make the substrate holder 221 attract and hold the first substrate 211 in the pre-aligner 500 (step S203). Furthermore, the control unit 150 causes the conveyance unit 140 to load the first substrate 211 held by the substrate holder 221 to the bonding unit 300 (step S204).

When the first substrate 211 and the second substrate 213 are thus loaded to the bonding unit 300, the first substrate 211 loaded to the bonding unit 300 is determined to be the second substrate in step S205 (step S205: YES). Then, the control unit 150 causes the bonding unit 300 to perform the bonding operation of bonding the first substrate 211 and the second substrate 213 to each other (step S206). Then, the control unit 150 causes the conveyance unit 140 to unload the stacked substrate 230 formed by bonding the first substrate 211 and the second substrate 213 to each other from the bonding unit 300 (step S207) to be stored in the substrate cassette 130. The control unit 150 causes the substrate holders 221 and 223, separated from the stacked substrate 230 unloaded from the bonding unit 300, to return to the holder stocker 400. Thus, the bonding operation by the bonding unit 300 is completed.

Figure 11:
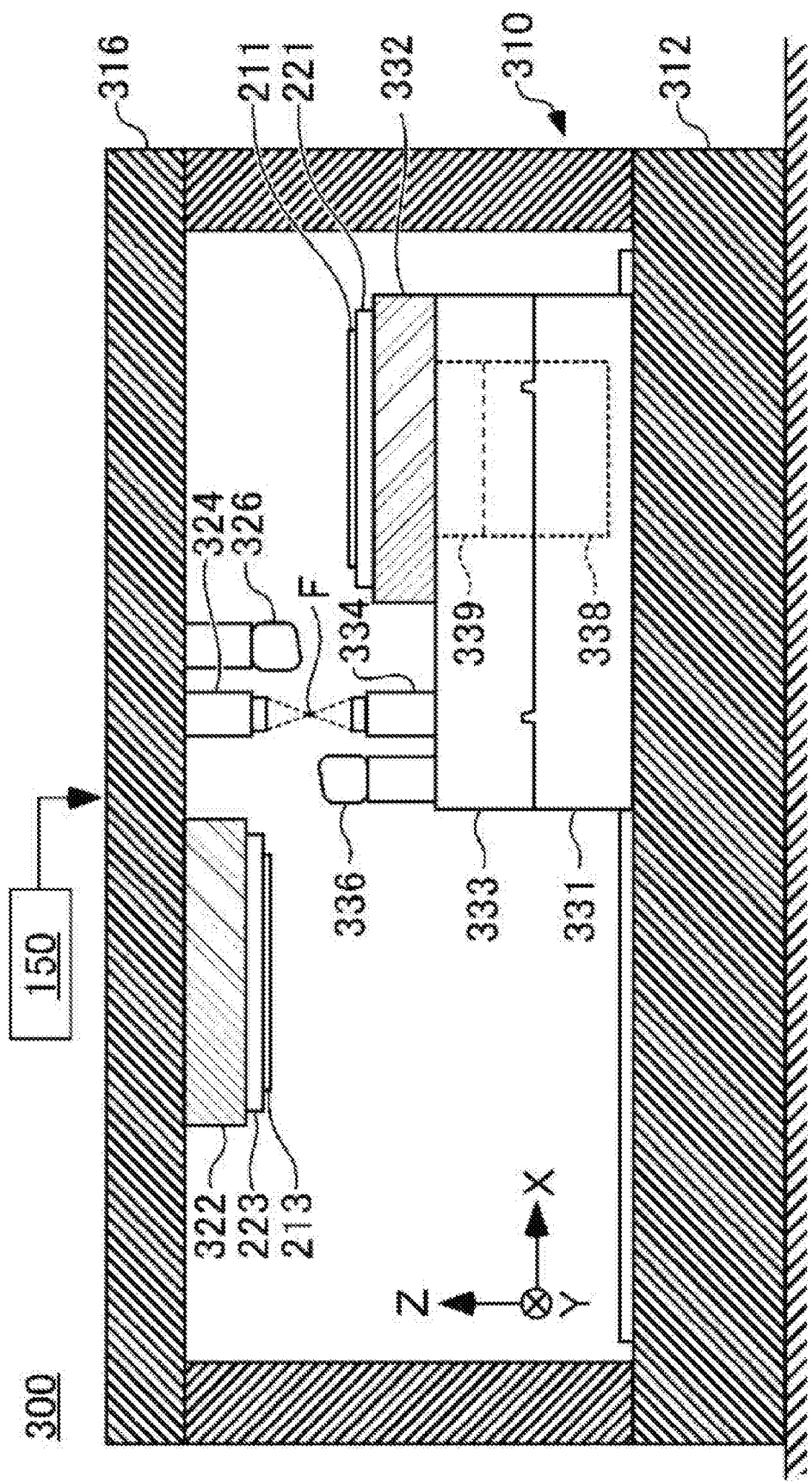
FIG. 11 is a schematic cross-sectional view of the bonding unit 300.

FIG. 11 is a schematic cross-sectional view of the bonding unit 300. The bonding unit 300 includes a frame body 310, an upper stage 322, and a lower stage 332.

The frame body 310 includes a bottom plate 312 and a top plate 316 that are each horizontal. The top plate 316 of the frame body 310 supports the upper stage 322 fixed while facing downward. The upper stage 322 includes at least one of a vacuum chuck and an electrostatic chuck, and attracts and holds the substrate holder 223 loaded in a state of holding the substrate 213.

The top plate 316 further has a microscope 324 and an activation device 326 fixed to a position lateral to the upper stage 322. When the lower stage 332 moves downward, the upper surface of the first substrate 211 on the lower stage can be observed with the microscope 324. When the lower stage 332 moves downward, the activation device 326 generates plasma to clean the upper surface of the first substrate 211 held by the lower stage 332.

The bottom plate 312 of the frame body 310 is provided with an X direction driving unit 331, a Y direction driving unit 333, a lifting and lowering driving unit 338, and a rotation driving unit 339 that are stacked in this order. The X direction driving unit 331 moves in parallel with the bottom plate 312 as indicated by an arrow X in the figure.

The Y direction driving unit 333 moves on the X direction driving unit 331 in a direction parallel with the bottom plate 312 and different from that of the X direction driving unit 331, as indicated by an arrow Y in the figure. With the operations of the X direction driving unit 331 and the Y direction driving unit 333 combined, the lower stage 332 moves two-dimensionally in parallel with the bottom plate 312.

The lifting and lowering driving unit 338 has one end fixed to the Y direction driving unit 333 and the other end fixed to one end of the rotation driving unit 339. The other end of the rotation driving unit 339 supports the lower stage 332. The lifting and lowering driving unit 338 causes the rotation driving unit 339 to be vertically shifted with respect to the bottom plate 312 as indicated by an arrow Z in the figure. The rotation driving unit 339 causes the lower stage 332 to rotate about an axis orthogonal to the bottom plate 312. The movement amount of the lower stage 332 as a result of the respective operations of the X direction driving unit 331, the Y direction driving unit 333, the lifting and lowering driving unit 338, and the rotation driving unit 339 is measured precisely using an interferometer and the like not illustrated.

The Y direction driving unit 333 supports a microscope 334 and an activation device 336 positioned lateral to the lower stage 332, as well as the lifting and lowering driving unit 338, the rotation driving unit 339, and the lower stage 332 described above. The microscope 334 and the activation device 336 move together with the lower stage 332 in a direction in parallel with the bottom plate 312, in accordance with an operation of the X direction driving unit 331 and the Y direction driving unit 333. A tilt driving unit that makes the lower stage 332 tilt about a rotation axis in parallel with the bottom plate 312, may be further provided between the lower stage 332 and the rotation driving unit 339.

With this configuration, when the lower stage 332 moves to be below the upper stage 322, the lower surface of the substrate 213 held by the upper stage can be observed with the microscope 334. When the lower stage 332 moves to be below the upper stage 322, the activation device 336 generates plasma to clean the lower surface of the substrate 213 held by the upper stage 322.

In a state illustrated in FIG. 11, the substrate holder 223 with the flat attraction surface 225 holding the substrate 213 is held by the upper stage 322 of the bonding unit 300 to which the substrate holder 223 has been loaded. Furthermore, the substrate holder 221 with the attraction surface 225 having a protruding shape holding the first substrate 211 is held by the lower stage 332 of the bonding unit 300 to which the substrate holder 221 has been loaded. The control unit 150 calibrates the relative positions of microscopes 324 and 334, by making the microscopes 324 and 334 in focus with each other.

Figure 12:
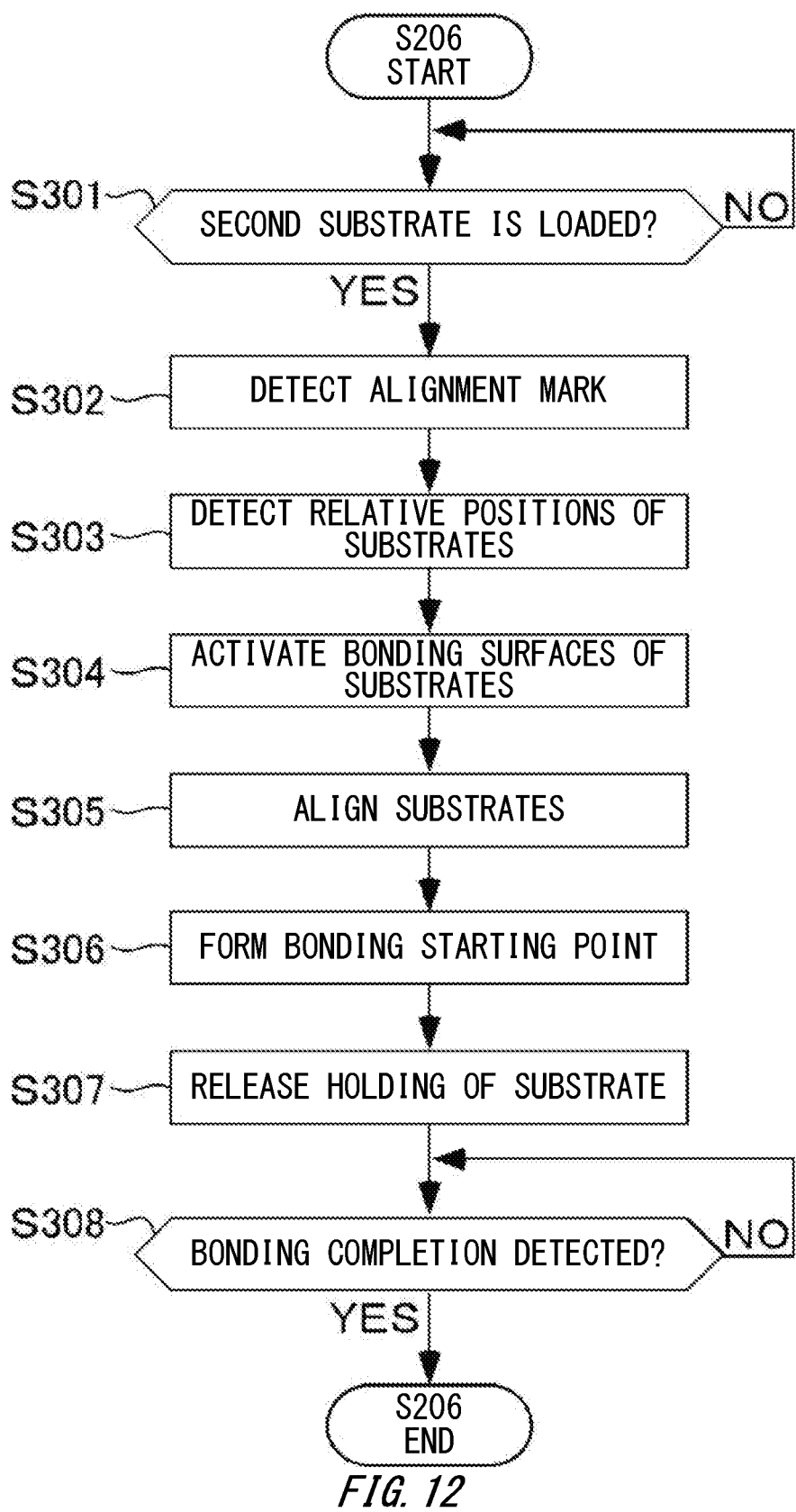
FIG. 12 is a flowchart illustrating a procedure of a bonding operation in the bonding unit 300.

FIG. 12 is a flowchart illustrating a procedure of a bonding operation in the bonding unit 300. The control unit 150 starts the bonding operation when the first substrate 211 and the second substrate 213 to be bonded to each other are loaded (step S301: YES) to the bonding unit 300 which has been standing by (step S301: NO) until both the first substrate 211 and the second substrate 213 to be bonded to each other are loaded. When the bonding operation starts, the control unit 150 detects the positions of the plurality of alignment marks 218 of each of the first substrate 211 and the second substrate 213 by using the microscopes 324 and 334 (step S302).

Figure 13:
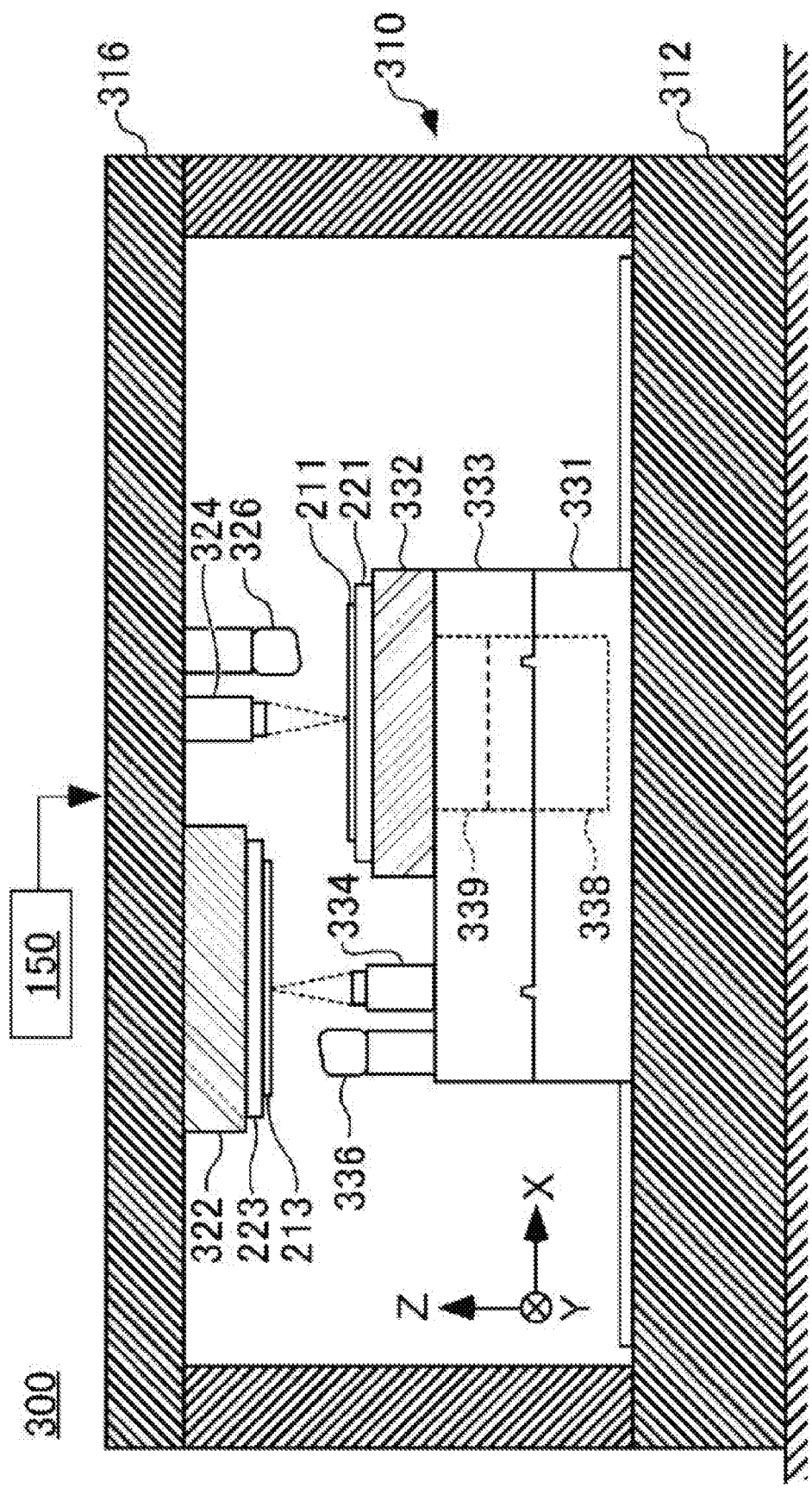
FIG. 13 is a schematic cross-sectional view of the bonding unit 300.

FIG. 13 is a schematic cross-sectional view illustrating a state of the bonding unit 300 in step S302 described above. As illustrated in the figure, the control unit 150 operates the X direction driving unit 331 and the Y direction driving unit 333 to move the lower stage 332 and the microscope 334.

As a result, the microscope 324 is in a state capable of observing the alignment marks 218 on the first substrate 211. The control unit 150 can recognize the positions of the alignment marks 218 to be observed accurately, based on the movement amount of the lower stage 332 until the alignment marks 218 reach a predetermined position in the field of view of the microscope 324. Similarly, the control unit 150 can accurately recognize the positions of the alignment mark 218 on the substrate 213 by observing the alignment marks 218 on the substrate 213 by using the microscope 334.

Next, the control unit 150 calculates the relative positions of the first substrate 211 and the second substrate 213, based on the positions of the alignment marks 218 detected in step S302 (step S303). Thus, the control unit 150 can recognize the relative positions of the first substrate 211 and the second substrate 213, by detecting the positions of the alignment marks 218 on the first substrate 211 and the second substrate 213 by using the microscopes 324 and 334 whose initial relative positions are known.

Thus, when the first substrate 211 and the second substrate 213 are aligned, the relative movement amounts of the first substrate 211 and the second substrate 213 may be calculated so that the misalignment between the alignment marks 218 on the first substrate 211 and the second substrate 213 corresponding to each other does not exceed a threshold, or so that the misalignment between the circuit regions 216 or connection portions of the first substrate 211 and the second substrate 213 corresponding to each other does not exceed a threshold.

The alignment marks 218 of the first substrate 211 and the second substrate 213 are arranged at different angles with respect to the crystal orientation of the bonding surface, at a stage when the first substrate 211 and the second substrate 213 are prepared. Thus, the alignment marks 218 of at least one of the first substrate 211 and the second substrate 213 are formed to be in a direction different from the crystal orientation in a direction in parallel with the bonding surface. Thus, when the alignment marks 218 of the first substrate 211 and the second substrate 213 are aligned, the first substrate 211 and the second substrate 213 are in a state of having crystal orientations different from each other in the bonding surfaces.

Figure 14:
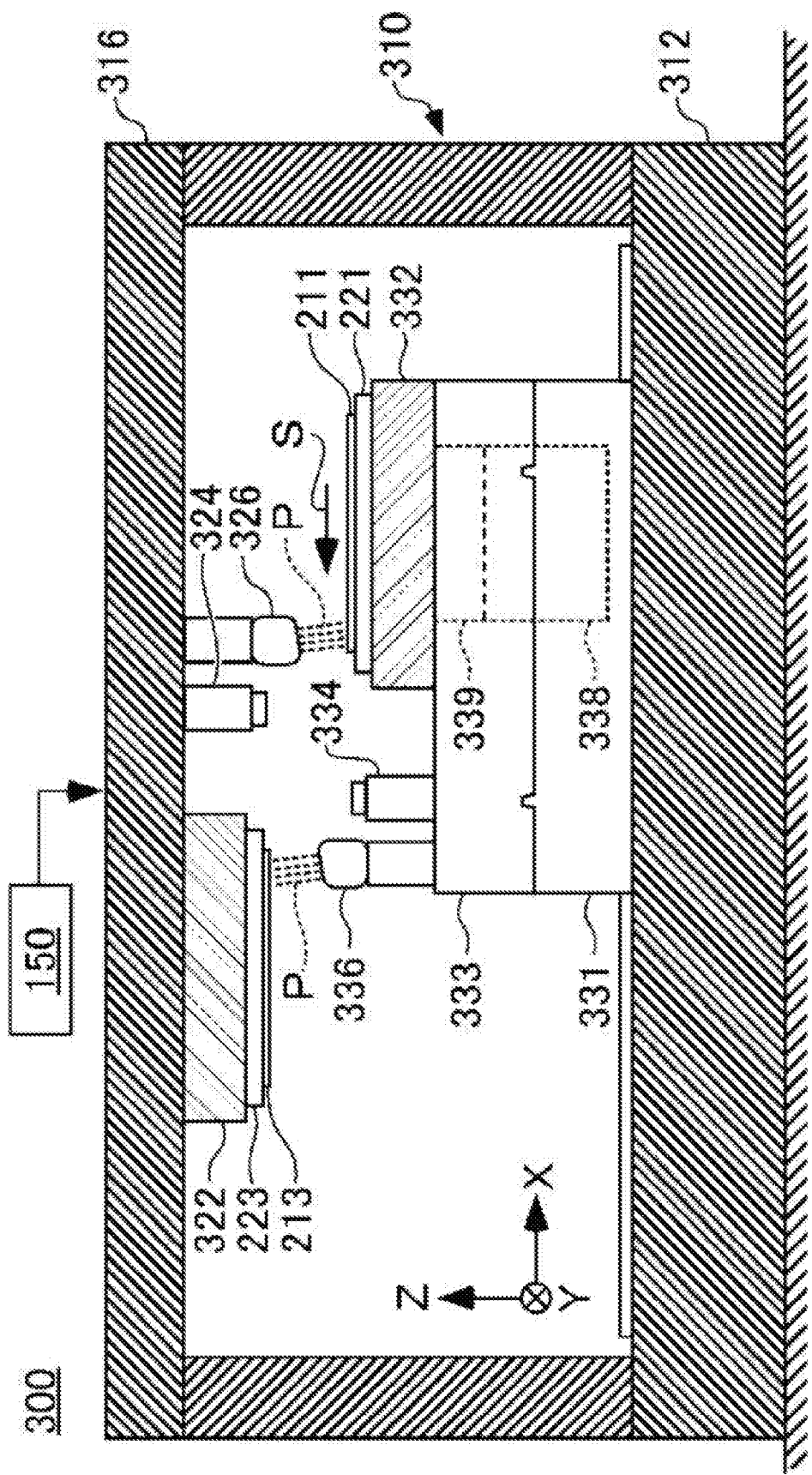
FIG. 14 is a schematic cross-sectional view of the bonding unit 300.

FIG. 14 is a schematic cross-sectional view illustrating another state of the bonding unit 300 in step S304. Subsequent to the state illustrated in FIG. 13, the control unit 150 activates the bonding surfaces of the first substrate 211 and the second substrate 213 (step S304). As illustrated in the figure, the control unit 150 operates the activation devices 326 and 336 to generate plasma while moving the lower stage 332, so that the respective surfaces of the first substrate 211 and the second substrate 213 are exposed to the plasma. As a result, the bonding surfaces of the first substrate 211 and the second substrate 213 are highly cleaned to feature high chemical activity.

The bonding surfaces may be activated using a method other than exposure to plasma. The surfaces of the first substrate 211 and the second substrate 213 may be activated by sputter etching using inactive gas, or by using ion beam or fast atomic beam, or the like. When ion beam or fast atomic beam is used, the bonding unit 300 is entirely placed under reduced pressure. The first substrate 211 and the second substrate 213 may also be activated by ultraviolet irradiation, or by using an ozone asher and the like. Furthermore, for example, the surfaces of the first substrate 211 and the second substrate 213 may be chemically cleaned by using a liquid or gas etchant to be activated. Furthermore, after the surfaces of the first substrate 211 and the second substrate 213 have been activated, the surfaces of the first substrate 211 and the second substrate 213 may be hydrophilized by using a hydrophilizing device.

The activation devices 326 and 336 provided inside the bonding unit 300 may be disposed at a location different from the bonding unit 300, and the first substrate 211 and the second substrate 213 activated may be loaded to the bonding unit 300. The first substrate 211 and the second substrate 213 may be bonded to each other with any one of the bonding surfaces of the first substrate 211 and the second substrate 213 activated and without activating the other one.

Next, the control unit 150 aligns the first substrate 211 and the second substrate 213 (step S305).

Figure 15:
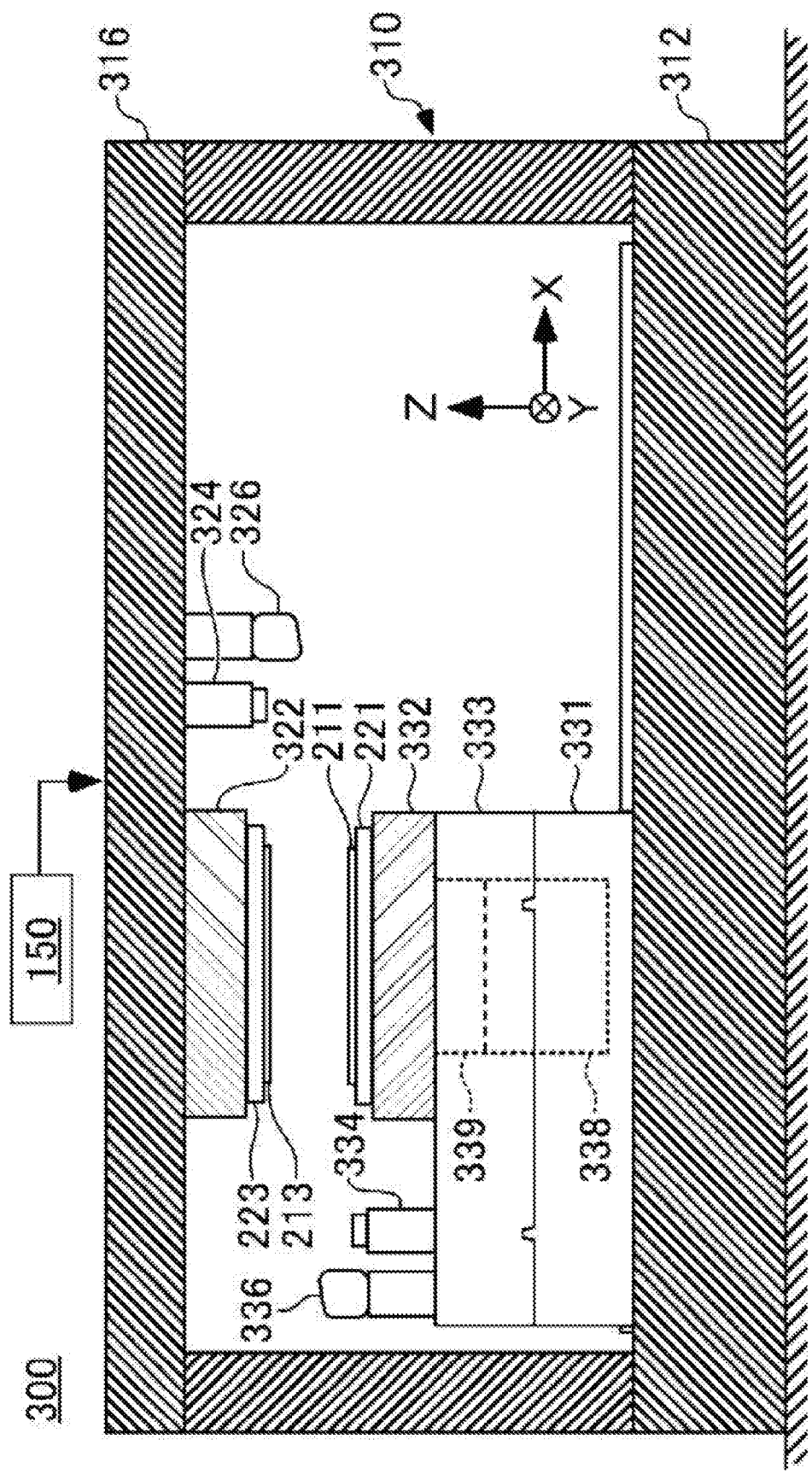
FIG. 15 is a schematic cross-sectional view of the bonding unit 300.

FIG. 15 is a schematic cross-sectional view illustrating a state of the bonding unit 300 in step S305. As illustrated in the figure, the first substrate 211 and the second substrate 213 are aligned with each other by moving the lower stage 332 by the movement amount based on the relative positions of the alignment marks 218 detected in step S303, so that the positions of the alignment marks 218 of the first substrate 211 and the second substrate 213 match.

When the first substrate 211 and the second substrate 213 are aligned, the control unit 150 makes parts of the first substrate 211 and the second substrate 213 come into contact with each other to form a starting point of bonding (step S306).

Figure 16:
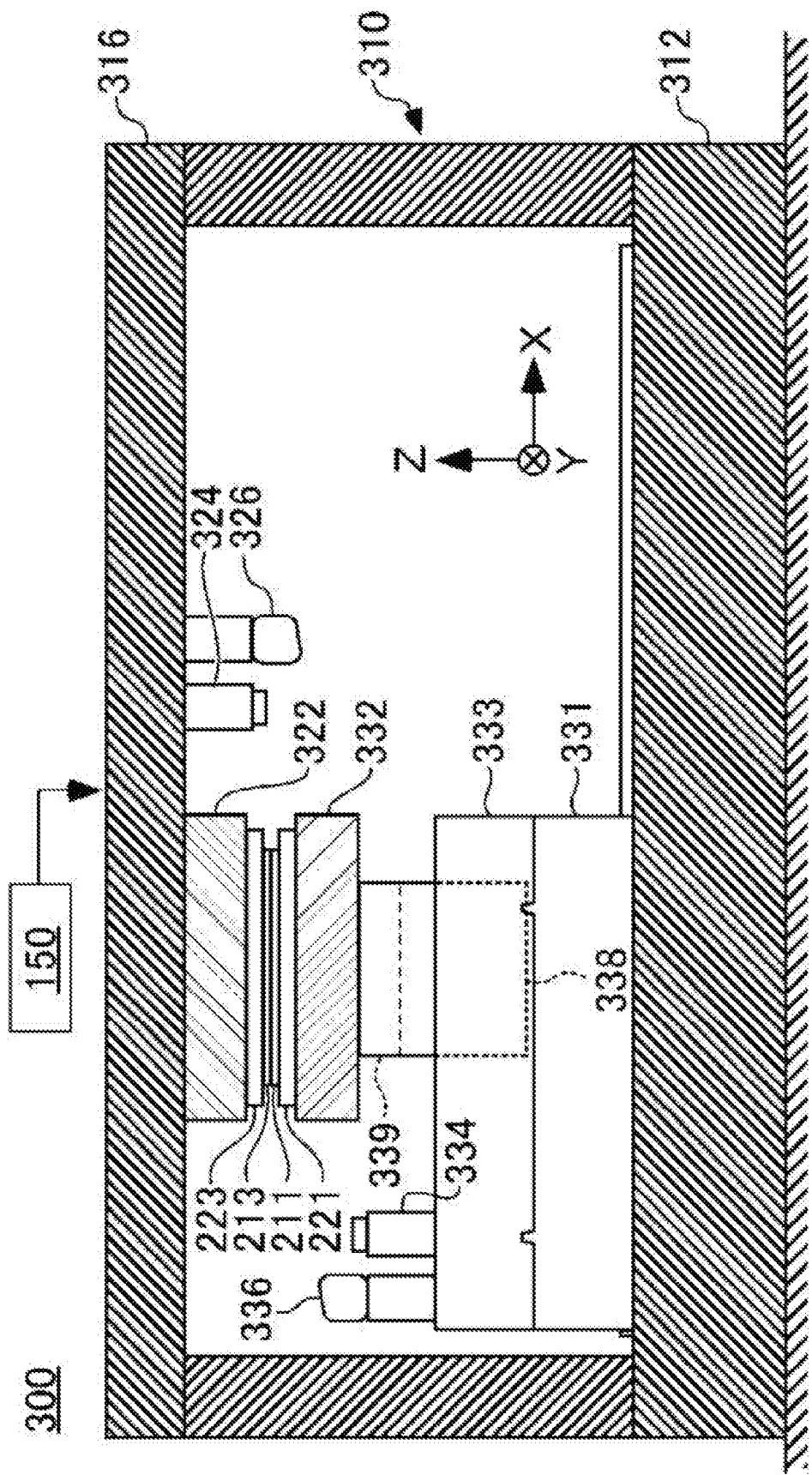
FIG. 16 is a schematic cross-sectional view of the bonding unit 300.

FIG. 16 is a schematic cross-sectional view illustrating a state of the bonding unit 300 in step S306. As illustrated in the figure, the control unit 150 causes the lifting and lowering driving unit 338 to operate to make parts of the bonding surfaces of the first substrate 211 and the second substrate 213 come into contact with each other to form the starting point of bonding.

At this stage, the first substrate 211 and the second substrate 213 are respectively held by the substrate holders 221 and 213. The substrate holder 223 holding the substrate 213 has the flat attraction surface 225, whereas the substrate holder 221 holding the first substrate 211 has the protruding attraction surface 225. Thus, the first substrate 211 is deformed to also protrude toward the substrate 213, so that the parts of the bonding surfaces of the first substrate 211 and the second substrate 213 contact at parts of the bonding surfaces at the beginning of contact. The first substrate 211 and the second substrate 213 are held by the substrate holders 221 and 223, so that the first substrate 211 and the second substrate 213 do not come into contact with each other in a region other than the initial contact region.

As described above, the surfaces of the first substrate 211 and the second substrate 213 are activated, so that the first substrate 211 and the second substrate 213 are permanently bonded to each other due to intermolecular force in the contact region. In this manner, the starting point of bonding is formed at the parts of the first substrate 211 and the second substrate 213.

Then, the control unit 150 releases the holding of one of first substrate 211 and the second substrate 213, that is, the holding by the substrate holder 223 for the substrate 213 held on the upper stage 322, for example (step S307). As a result, a bonding wave of the bonded region of the first substrate 211 and the second substrate 213 gradually spreading to the edges of the first substrate 211 and the second substrate 213 occurs, so that the first substrate 211 and the second substrate 213 are entirely bonded in the end. In this manner, the partial contact between the first substrate 211 and the second substrate 213 spreads so that the substrates are entirely laid one on top of the other, whereby bubbles and the like can be prevented from remaining between the first substrate 211 and the second substrate 213.

After releasing the holding of the substrate 213 in step S307, the control unit 150 monitors the spreading of the bonded region, and detects the completion of the bonding between the first substrate 211 and the second substrate 213 (step S308: YES) when, for example, the bonded region has spread to reach the edges of the first substrate 211 and the second substrate 213. In other words, the control unit 150 lets the bonded region keep spreading with the lower stage 332 fixed as long as the bonding between the first substrate 211 and the second substrate 213 is not completed (step S308: NO). When the stacked substrate 230 is thus formed (step S206: FIG. 10), the stacked substrate 230 is unloaded from the bonding unit 300 (step S207: FIG. 10), to be stored in the substrate cassette 130.

The control unit 150 may release the holding of the substrate 213 by the substrate holder 223 partially or step by step, in the process of spreading the contact region between the first substrate 211 and the second substrate 213. The bonding between the first substrate 211 and the second substrate 213 may progress with the first substrate 211 released on the lower stage 332 without releasing the substrate 213 on the upper stage 322.

Furthermore, both of the two substrates, that is, the first substrate 211 and the second substrate 213 may be released. The first substrate 211 and the second substrate 213 may be bonded by deforming at least one of the upper stage 322 and the lower stage 332 with the upper stage 322 and the lower stage 332 further moved close to each other, while the substrates 213 and 211 are respectively being held by the upper stage 322 and the lower stage 332.

Even in the stacked substrate 230 obtained by the alignment and bonding as described above, misalignment between the first substrate 211 and the second substrate 213 may remain. The remaining misalignment includes those due to variation in individual distortion on the first substrate 211 and the second substrate 213, and to an alignment error. The cause of the misalignment remaining in the stacked substrate 230 further includes other distortions produced during the bonding process of the first substrate 211 and the second substrate 213 involving the generation of the bonding wave.

Figure 17:
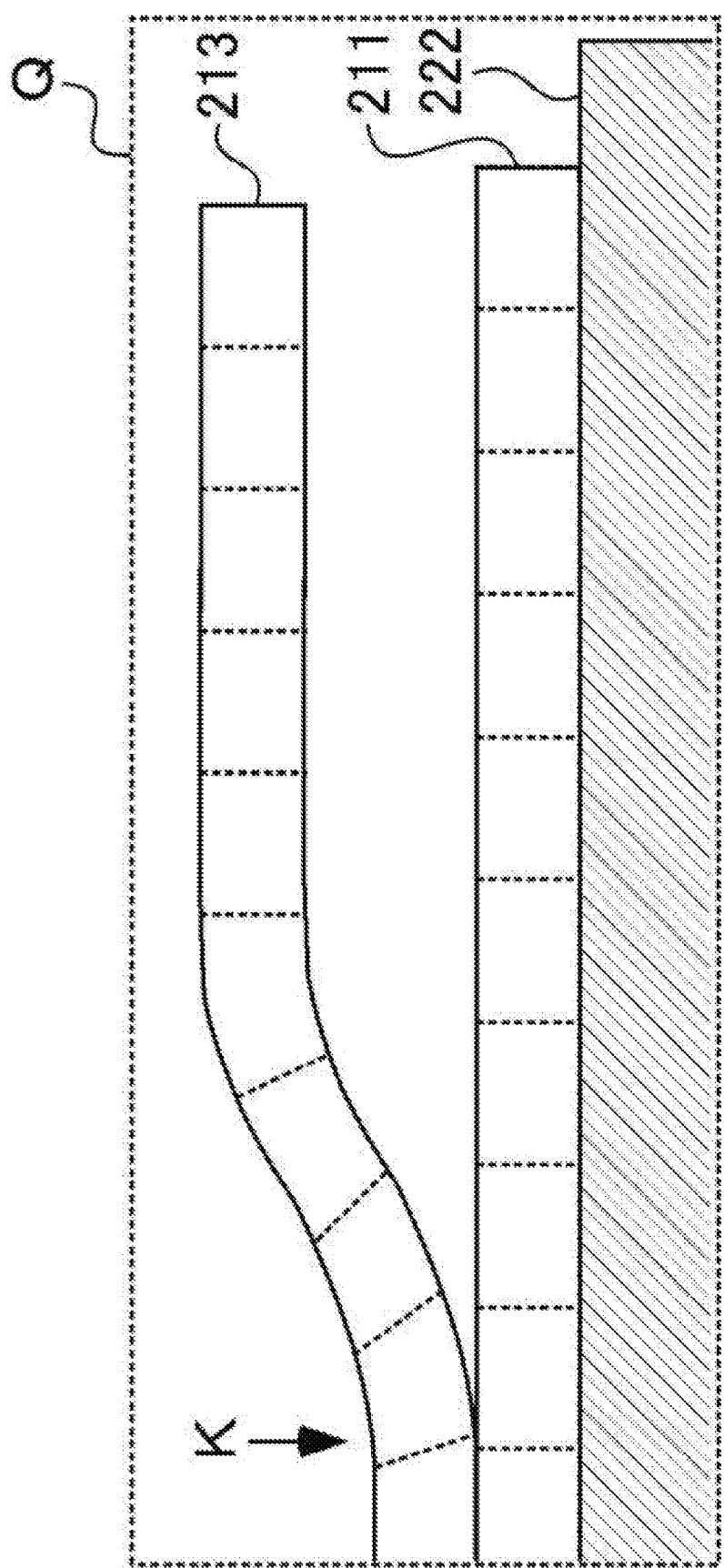
FIG. 17 is a partially enlarged view illustrating a process of bonding the first substrate 211 and the second substrate 213.
Figure 18:
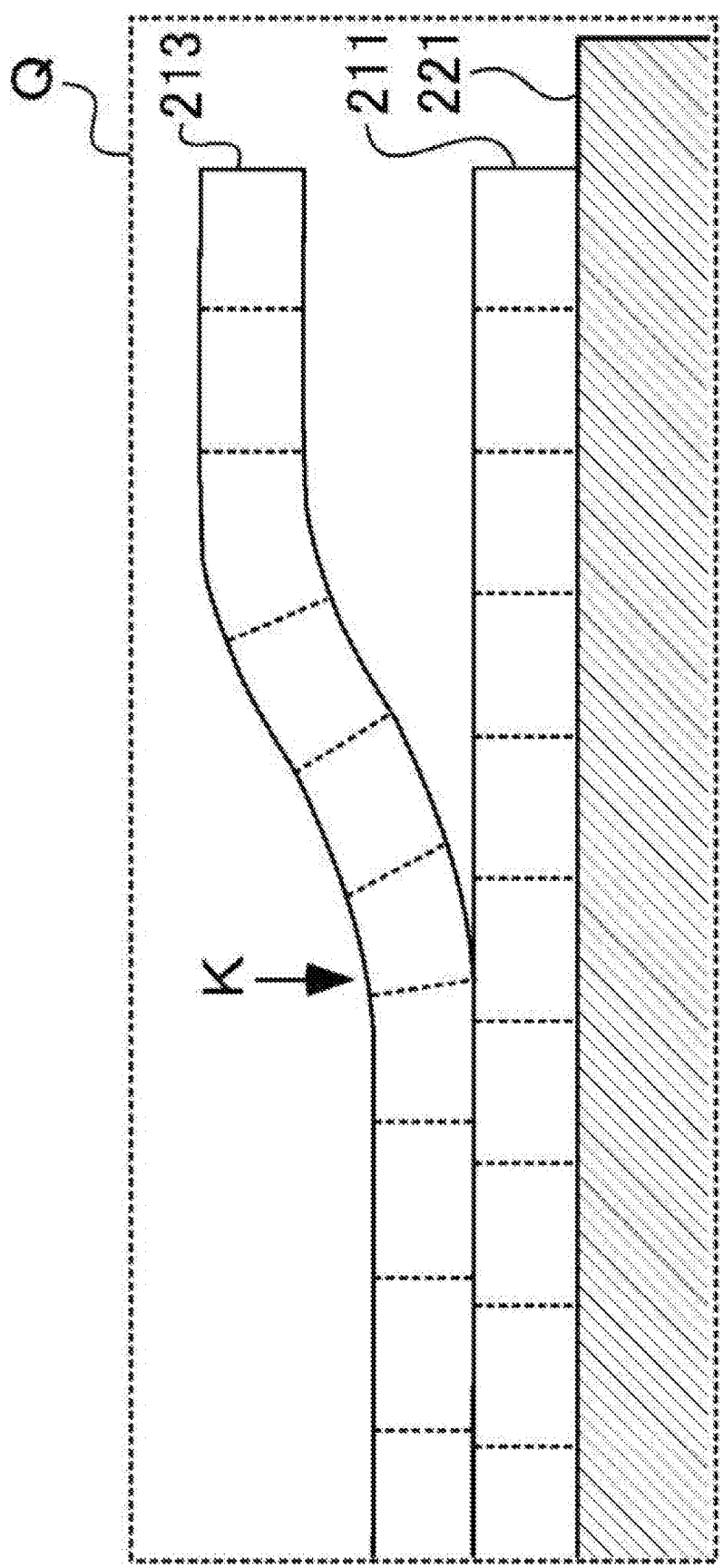
FIG. 18 is a partially enlarged view illustrating a process of bonding the first substrate 211 and the second substrate 213.
Figure 19:
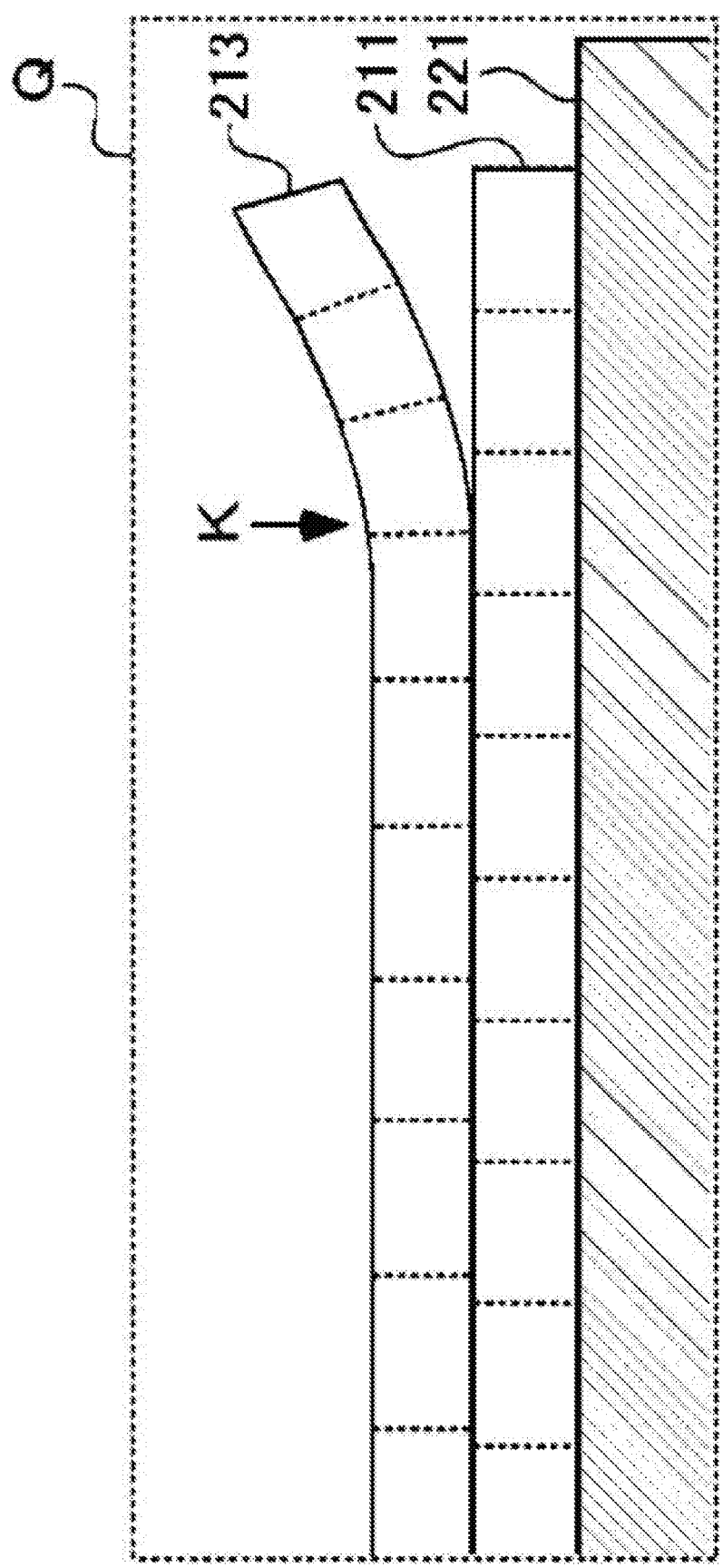
FIG. 19 is a partially enlarged view illustrating a process of bonding the first substrate 211 and the second substrate 213.

FIGS. 17, 18, and 19 are diagram illustrating distortion produced between the first substrate 211 and the second substrate 213 during the bonding process involving generation of the bonding wave. FIGS. 17, 18, and 19 illustrate a region Q around a boundary K between the contact region in which the first substrate 211 and the second substrate 213 are already in contact with each other, and a non-contact region in which the first substrate 211 and the second substrate 213 are yet to come into contact with each other, in the bonding process in the bonding unit 300.

As illustrated in FIG. 17, in a process where the area of the contact region spreads from the center to the outer circumference of the two first substrate 211 and the second substrate 213 laid one on top of the other, the boundary K moves from the center side toward the outer circumference side of the first substrate 211 and the second substrate 213. Around the boundary K, the substrate 213 released from the holding by the substrate holder 223 expands. Specifically, at the boundary K, the substrate 213 is expanded on the lower side in the figure and is contracted on the upper side in the figure, with respect to a plane at the center in the thickness direction of the substrate 213.

Thus, as indicated by dotted lines in the figure, at an outer end of a region of the substrate 213 bonded to the first substrate 211, distortion occurs as if the magnification of the circuit region 216 on the surface of the substrate 213 with respect to the design specification is increased over the magnification of the first substrate 211 with respect to the design specification. Thus, as indicated by misalignments between the dotted lines in the figure, misalignment due to the substrate 213 having a different expansion amount, that is, magnification, occurs between the lower side first substrate 211 held on the substrate holder 221 and the upper side substrate 213 released from the substrate holder 223.

As illustrated in FIG. 18, when the first substrate 211 and the second substrate 213 are permanently bonded while being in contact with each other with the deformation amount being different therebetween, the increased magnification of the substrate 213 is fixed. Furthermore, as illustrated in FIG. 19, expansion amount of the substrate 213 fixed by the bonding is accumulated to increase as the boundary K moves toward the outer circumference of the first substrate 211 and the second substrate 213.

Figure 20:
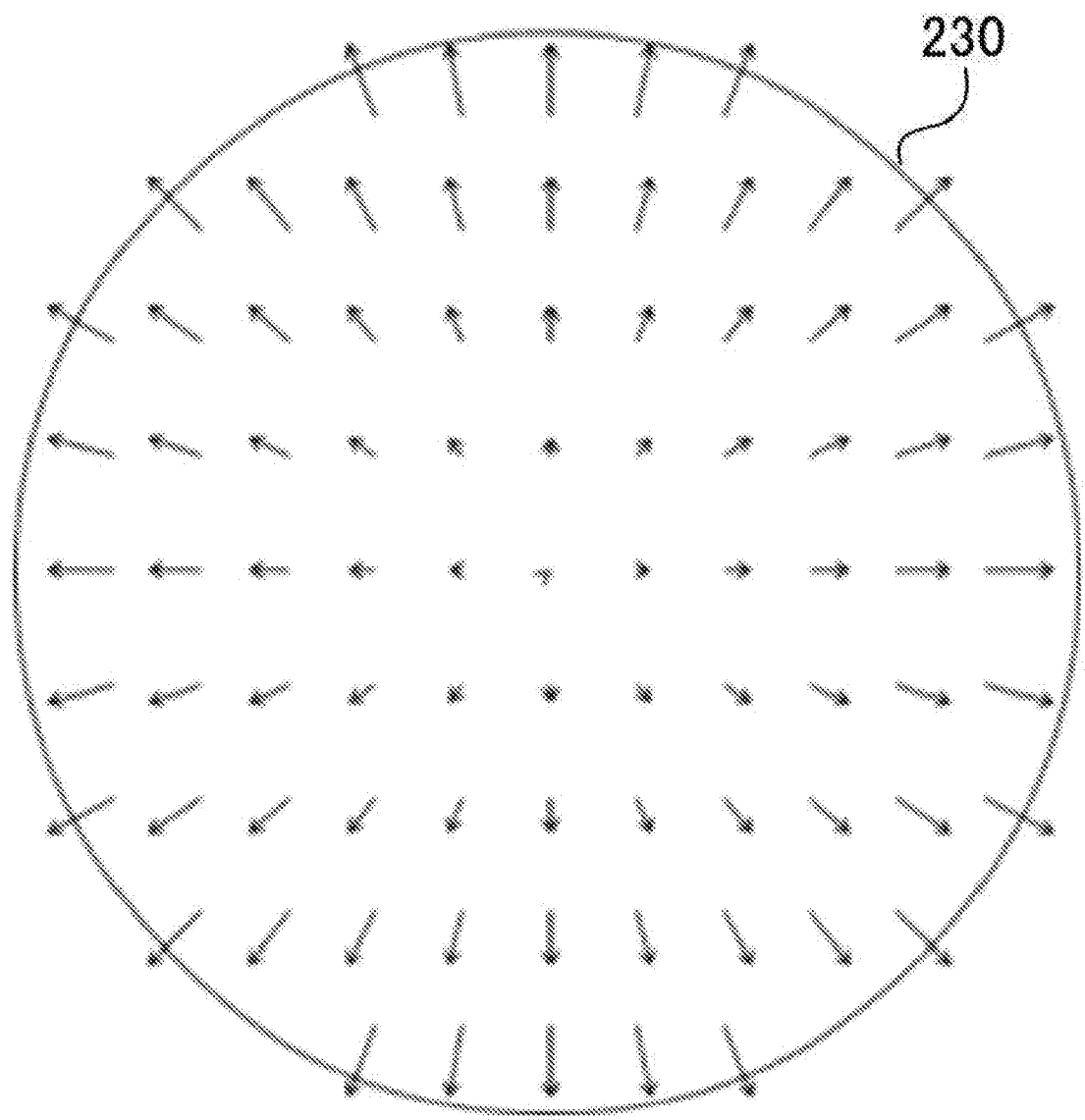
FIG. 20 is a diagram illustrating a misalignment amount distribution in the stacked substrate 230.

FIG. 20 is a diagram illustrating a distribution of misalignment due to a difference in the magnification between the two substrates, i.e. the first substrate 211 and the second substrate 213, forming the stacked substrate 230. For example, the distribution of the misalignment can be handled as a scalar quantity based on the root sum square of the misalignments at parts on the substrate.

The misalignment in the figure has a misalignment amount gradually increasing radially in a planer direction from the center point of the stacked substrate 230. The magnitude of such a misalignment occurring during the bonding process can be calculated based on physical quantities such as the rigidity of the first substrate 211 and the second substrate 213 to be bonded, the viscosity of the atmosphere sandwiched between the first substrate 211 and the second substrate 213, and the magnitude of the intermolecular force acting between the first substrate 211 and the second substrate 213.

The rigidity of the first substrate 211 and the second substrate 213 as referred to herein includes flexural rigidity of the first substrate 211 and the second substrate 213 and in-plane rigidity of the first substrate 211 and the second substrate 213 against deformation in parallel with the bonding surface. These flexural rigidity and in-plane rigidity affect the misalignment between the bonding unit disposed on the surfaces of the first substrate 211 and the second substrate 213. The flexural rigidity is calculated based on the thicknesses of the first substrate 211 and the second substrate 213, in a unit of $Nm^2$. The in-plane rigidity is Young's modulus of the first substrate 211 and the second substrate 213, in a unit of GPa.

As long as the in-plane rigidity of the first substrate 211 and the second substrate 213 is uniform, the misalignment is linearly distributed as illustrated in FIG. 20 and thus can be compensated before the bonding by the adjustment at the stage of manufacturing the first substrate 211 and the second substrate 213 and the like. Unfortunately, the misalignment occurring in the bonding process might be nonlinearly distributed as described below. The misalignment nonlinearly distributed is difficult to compensate by the adjustment at the stage of manufacturing the first substrate 211 and the second substrate 213 and the like.

The distortion occurring in the first substrate 211 and the second substrate 213 is a shift from design coordinates of the structures in first substrate 211 and the second substrate 213, that is, a design position. The distortion occurring in the first substrate 211 and the second substrate 213 includes a planer distortion and a three-dimensional distortion.

The planer distortion is a distortion produced in a direction along the bonding surface of the first substrate 211 and the second substrate 213, and includes a linear distortion and non-linear distortion. With the linear distortion, the shifted position relative to the design position of each structure on the first substrate 211 and the second substrate 213 can be expressed by linear conversion. However, with the non-liner distortion, different from the liner distortion, the displaced position cannot be expressed by linear conversion.

The linear distortion includes a magnification with which the shift amount increases along a radial direction from the center at a certain rate of increase. The magnification is a value, in a unit of ppm, obtained by dividing the misalignment amount from the design value at a point separated from the center of the first substrate 211 and the second substrate 213 by a distance X, by the distance X. The magnification includes an isotropic magnification with a shift vector from the design position including an X component and a Y component of the same amount, and an anisotropic magnification with the shift vector from the design position having components of different amounts.

In the present embodiment, the respective structures on the two substrates laid one on top of the other, that is, the first substrate 211 and the second substrate 213 have the common design positions. Thus, the misalignment amount between the first substrate 211 and the second substrate 213 is a difference in the magnification between the two substrates, that is, the first substrate 211 and the second substrate 213 based on the design position.

The linear distortion includes orthogonal distortion. When an X axis and an Y axis orthogonal to each other are set with the center of the substrate being the origin, the orthogonal distortion is a distortion with a shift in parallel with the X axis direction from the design position, with an amount increasing as the structure gets farther from the origin in the Y axis direction. The shift amount is the same among a plurality of regions that are arranged in parallel to the X axis and across the Y axis, and the absolute value of the shift amount increases as it gets farther from the X axis. The orthogonal distortion has a direction of the shift toward the positive side of the Y axis and a direction of the shift toward the negative side in the Y axis being opposite from each other.

The three-dimensional distortion of the first substrate 211 and the second substrate 213 are misalignment in a direction other than a direction along the bonding surfaces of the first substrate 211 and the second substrate 213, specifically, a direction orthogonal to the bonding surface. The three-dimensional distortion includes curving produced entirely or partially on the first substrate 211 and the second substrate 213, due to entire or partial bending of the first substrate 211 and the second substrate 213. This "bending of the substrate" means that the surfaces of the first substrate 211 and the second substrate 213 change to include a point that does not exist on a plane defined by three points on the first substrate 211 and the second substrate 213.

The curving is a distortion resulting in the substrate having a curved surface, and includes warpage of the first substrate 211 and the second substrate 213 for example. In the present embodiment, the warpage is a distortion remaining in the first substrate 211 and the second substrate 213 in a state where the influence of gravity is eliminated. The distortion of the first substrate 211 and the second substrate 213 as a result of adding the influence of the gravity to the warpage is referred to as deflection. The warpage of the first substrate 211 and the second substrate 213 includes a global warpage with the first substrate 211 and the second substrate 213 being entirely bent with substantially uniform radius of curvature, and a local warpage with the first substrate 211 and the second substrate 213 having a partial change in the radius of curvature.

Figure 21:
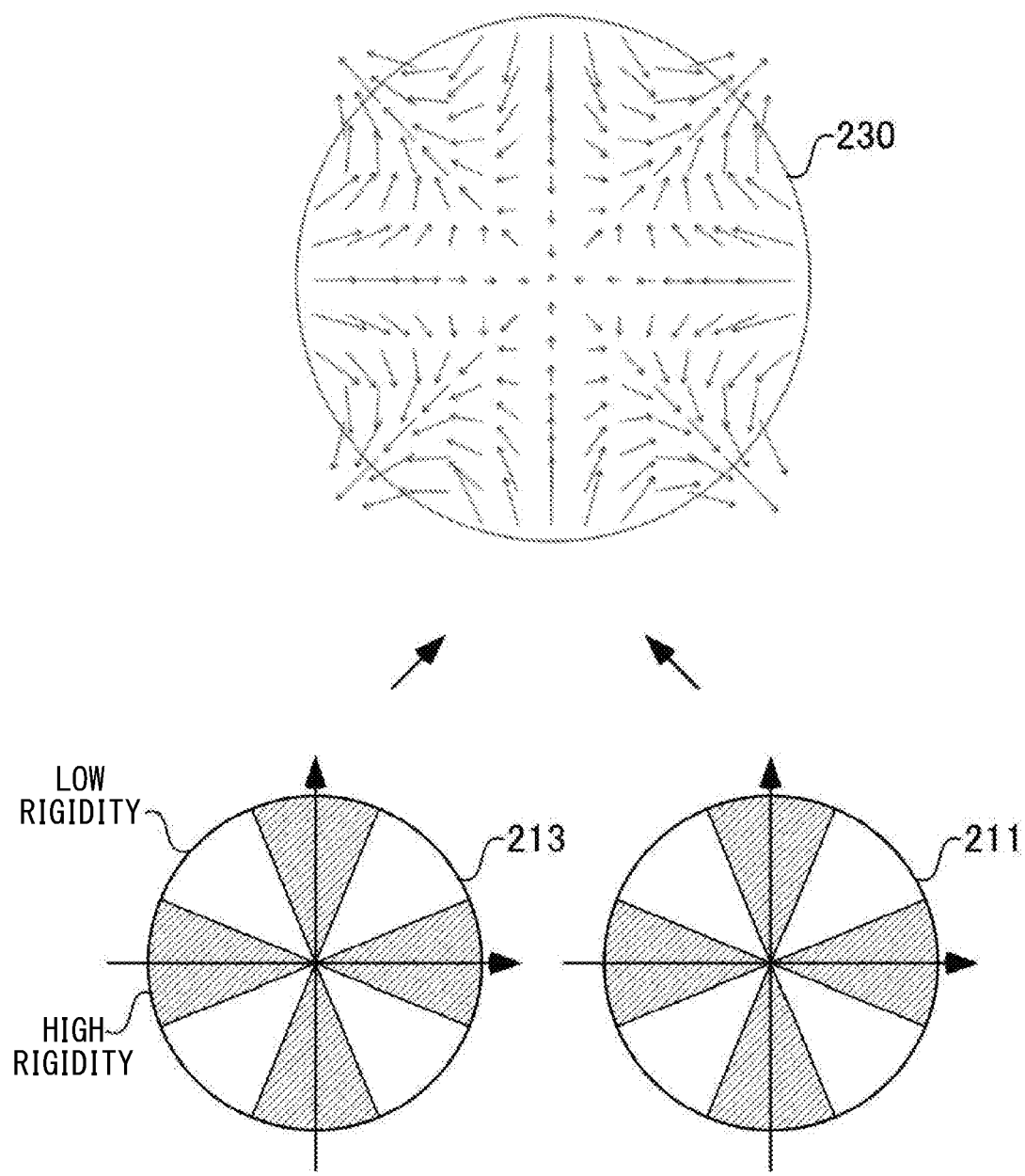
FIG. 21 is a diagram illustrating a misalignment amount distribution in the stacked substrate 230.

FIG. 21 is a diagram illustrating a distribution of amounts of non-linear misalignment occurring during the bonding process, in the stacked substrate 230 manufactured by bonding monocrystalline substrates. In the illustrated example, two Si monocrystalline substrates with a bonding surface being a surface (100), are laid one on top of the other with the crystal orientation matching between the first substrate 211 and the second substrate 213 as illustrated in a lower section in the figure. In the bonding unit 300, the bonding is performed by generating a bonding wave with the bonding stating point formed at the center of the first substrate 211 and the second substrate 213.

As illustrated in the figure, distribution of the misalignment between the first substrate 211 and the second substrate 213 includes a change in the circumference direction of the stacked substrate 230, in addition to a change in the radial direction. Such a misalignment distribution is estimated to be a result of non-linear distortion attributable to a difference in magnification as a result of magnification change being different among crystal orientations in bonding, due to a difference in the rigidity distribution among crystal orientations in the bonding surface of the first substrate 211 and the second substrate 213 as illustrated in the lower section in the figure. Specifically, the non-linear misalignment distribution as illustrated in the figure is estimated to be caused by crystal anisotropy appearing on the surface (100).

Figure 22:
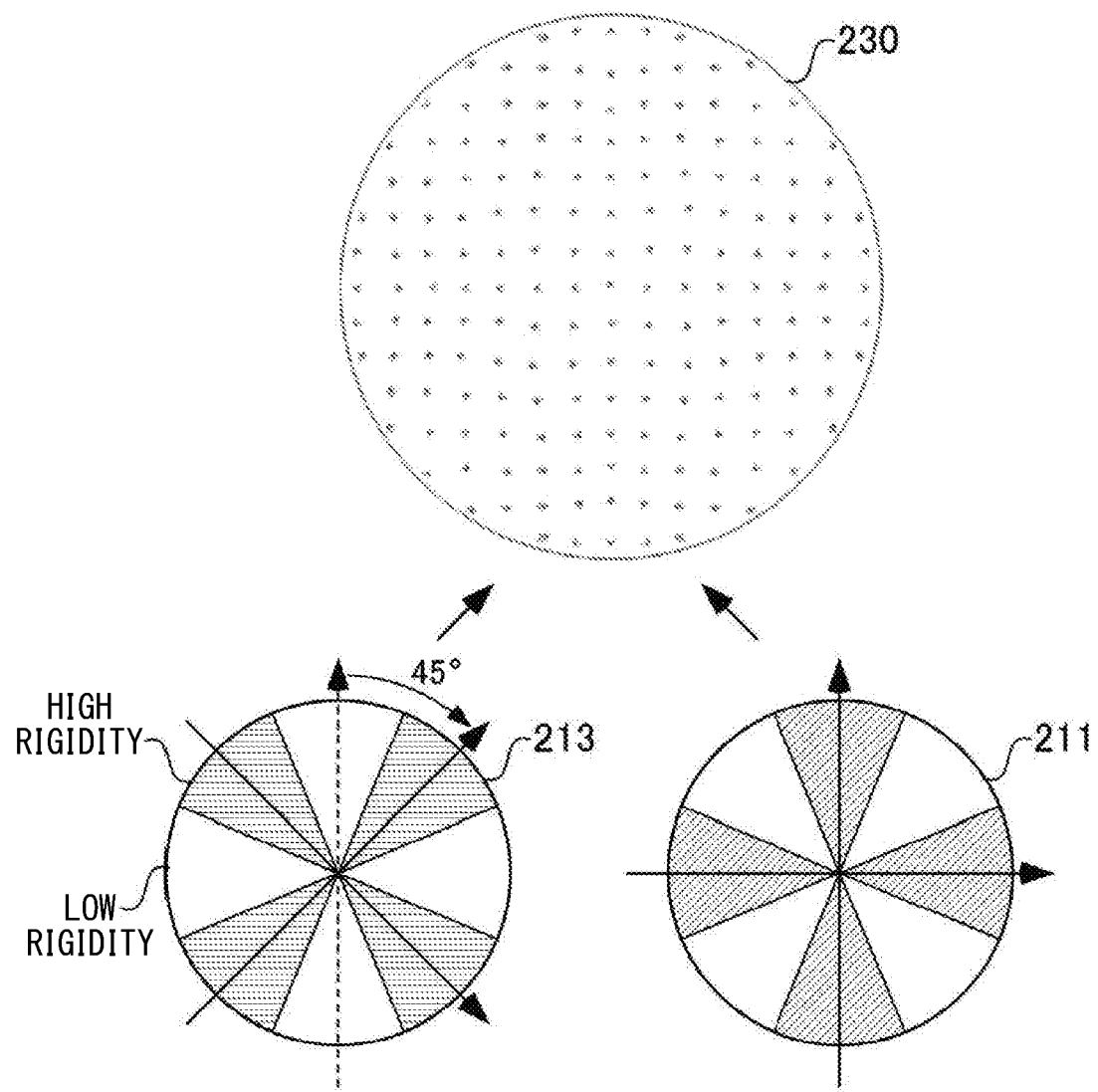
FIG. 22 is a diagram illustrating another misalignment amount distribution in the stacked substrate 230.

FIG. 22 is a diagram illustrating a result of measuring misalignment distribution produced during the bonding process in another stacked substrate 230 manufactured by two Si monocrystalline substrates with the bonding surface being the surface (100). In the illustrated example, as illustrated in a lower section of the figure, the first substrate 211 is bonded to the second substrate 213 with the crystal orientation in the bonding surface rotated by 45°, in accordance with the determination made by the determining unit 640 with reference to the table 629.

As illustrated in the figure, in this stacked substrate 230, the misalignment amounts are each small substantially over the entire stacked substrate 230, and are uniform over the entire stacked substrate 230. This is estimated to be achieved with the misalignment uniformized as a result of a difference in the rigidity distribution uniformized between the first substrate 211 and the second substrate 213 in the bonding surfaces, with the crystal orientation in a direction parallel to the bonding surface rotated by 45°, because the rigidity distribution of the Si monocrystalline substrates with the bonding surface being the surface (100) is at a 90° interval.

As described above, the rotation angle, of the crystal orientation parallel to the bonding surface, with which the misalignment amount distribution can be suppressed varies depending on the plane orientation appearing on the bonding surface of the first substrate 211 and the second substrate 213 bonded. Thus, the table 629 stored in the storage unit 620 of the determination device 600 is created in advance by obtaining rotation angles achieving the misalignment smaller than a predetermined threshold through analysis, simulation, experiment, and the like for a combination of the composition, the crystal structure, and a direction of the crystal orientation in parallel with the bonding surface of the first substrate 211 and the second substrate 213.

In the example described above, bonding is performed with the crystal orientation in parallel with the bonding surface of the first substrate 211 and the second substrate 213 being rotated by 45° in the bonding surface, to obtain a combination with which the rigidity distribution of the bonding surface can be most efficiently offset. However, the crystal orientation of the second substrate 213 may not be rotatable by 45° due to any other reasons such as a relationship between the plane orientation of the bonding surface and the characteristics and the like in an element such as a transistor formed on the bonding surface.

In such a case, the determining unit 640 may determine the rotation angle less than or exceeding 45°, as long as the misalignment occurring in the first substrate 211 and the second substrate 213 does not exceed a predetermined threshold. In other words, the table 629 illustrated in FIG. 5 may include a combination between the crystal orientations with the misalignment amount within a tolerable range, although such combination is not optimal in terms of suppression of the misalignment. In the example described above where the bonding surface is the surface (100), the distortion amount significantly improved compared with the case where the crystal orientations match, also with the rotation angle of the crystal orientation in parallel with the bonding surface of the first substrate 211 and the second substrate 213 being equal to or larger than 22.5° and equal to or smaller than 67.5°.

In the example described above, the table 629 stored in the storage unit 620 stores combinations of substrates with the same plane orientation and different rotation angles. However, the content of the table 629 is not limited to such combinations. For example, the table 629 may store a combination with plane orientations and rotation angles both being different from each other.

Figure 23:
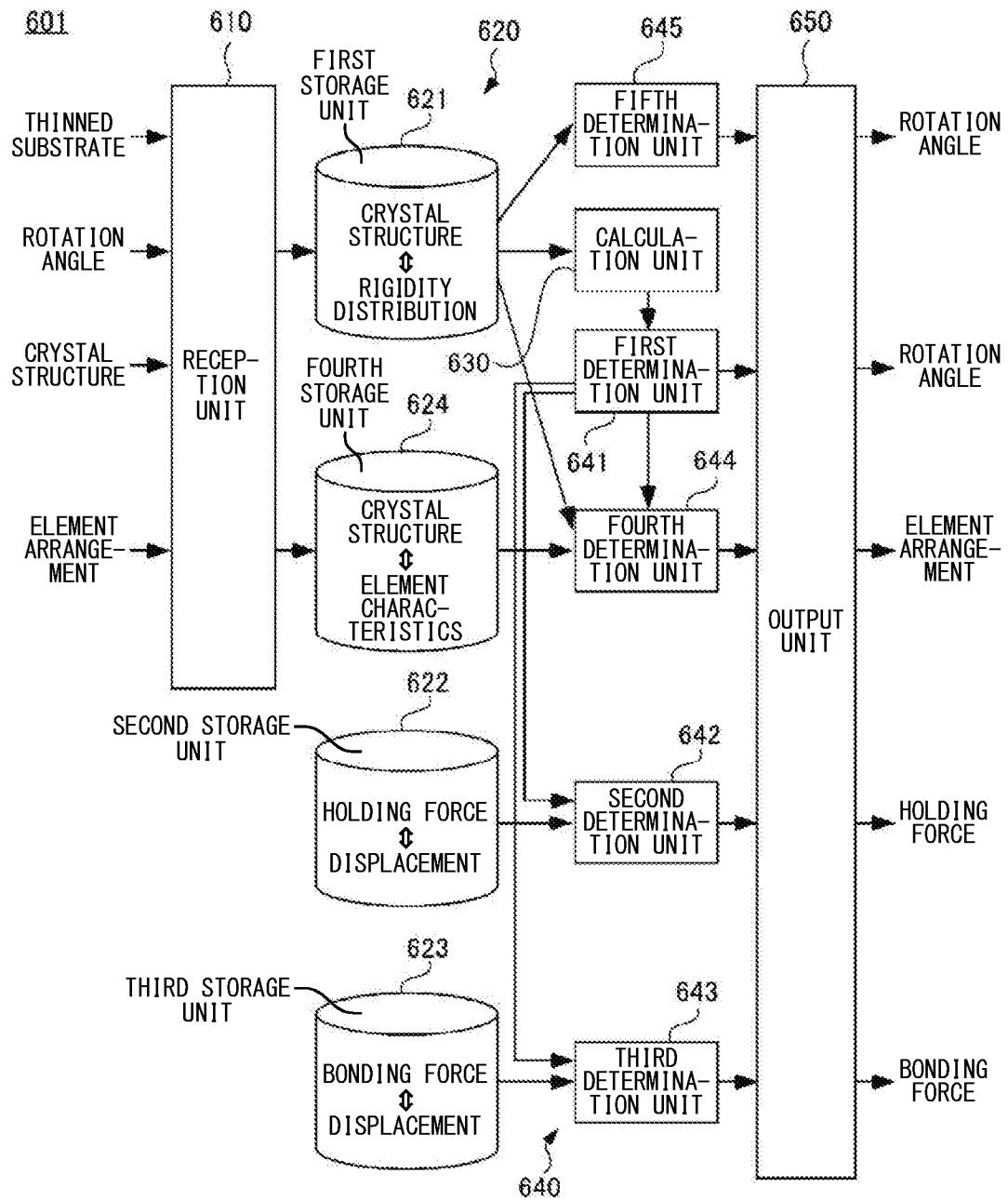
FIG. 23 is a block diagram of a determination device 601.

FIG. 23 is a block diagram illustrating another determination device 601. The determination device 601 includes a reception unit 610, a storage unit 620, a calculation unit 630, a determining unit 640, and an output unit 650. Furthermore, the storage unit 620 includes a first storage unit 621, a second storage unit 622, a third storage unit 623, and a fourth storage unit 624. The determining unit 640 includes a first determining unit 641, a second determining unit 642, a third determining unit 643, a fourth determining unit 644, and a fifth determining unit 645.

The reception unit 610 receives information about the first substrate 211 and the second substrate 213 forming the stacked substrate 230 in a process of manufacturing a stacked semiconductor device from the outside. The information received by the reception unit 610 includes crystal structures of the first substrate 211 and the second substrate 213, that is, crystal orientations on the bonding surfaces reflecting the compositions and the crystal structures of the first substrate 211 and the second substrate 213.

The information received by the reception unit 610 may include the type, arrangement, and the like of elements of circuit regions formed on the first substrate 211 and the second substrate 213. When any of the first substrate 211 and the second substrate 213 is already a stacked substrate that has been formed by bonding, the reception unit 610 further receives information indicating the thickness of each of the substrates in the stacked substrate, in other words, indicating which of the substrates is thinned.

The information received by the reception unit 610 may be input by a user, and may also be transferred from another device involved in the manufacturing. For example the information about the state of the first substrate 211 and the second substrate 213 may be received from a device involved in a process of forming the structures, such as the circuit region 216, on the first substrate 211 and the second substrate 213. Such information may also be stored in and read from a storage region in the first substrate 211 and the second substrate 213 themselves, or may be received through a communication line.

The information received by the reception unit 610 may be information detected from the first substrate 211 and the second substrate 213 that are design targets, by using a measurement device, a sensor, and the like provided to the bonding device 100 or the determination device 601. For example, the information may be detected by using the pre-aligner 500 in the bonding device 100 and the microscopes 324 and 334 of the bonding unit 300, or a detection result detected by other measurement devices outside may be received through a communication line.

In the present embodiment, the first storage unit 621 stores first reference information in which the crystal orientation on the bonding surfaces of the first substrate 211 and the second substrate 213 are associated with the rigidity distributions on the bonding surface. By referring to such first reference information, for example, the rigidity distributions of the first substrate 211 and the second substrate 213 can be estimated based on the information about the crystal structures of the substrates, whereby a non-linear distortion distribution in the stacked substrate formed by bonding the substrates can be calculated. An example of the first reference information is the table 629 illustrated in FIG. 5.

The second storage unit 622 stores second reference information in which the magnitude of holding force of any of the substrate holders 221 and 223 holding the first substrate 211 or the second substrate 213 when the first substrate 211 and the second substrate 213 are bonded to each other in the bonding unit 300 in the bonding device 100, is associated with misalignment occurring in the stacked substrate 230 formed by bonding the first substrate 211 and the second substrate 213 to each other. By referring to such second reference information, the holding force for bonding the first substrate 211 and the second substrate 213 can be determined under a condition that the misalignment in the stacked substrate 230 formed by the bonding becomes smaller than a predetermined threshold, as will be described later with reference to FIG. 27. When the holding force for the first substrate 211 and the second substrate 213 is fixed, whether the stacked substrate 230 formed by bonding a combination of the first substrate 211 and the second substrate 213 satisfies a predetermined condition can be determined.

The third storage unit 623 stores third reference information in which the magnitude of the bonding force acting between the first substrate 211 and the second substrate 213 when the first substrate 211 and the second substrate 213 are bonded to each other in the bonding unit 300 in the bonding device 100, is associated with misalignment occurring in the stacked substrate 230 formed by stacking the first substrate 211 and the second substrate 213. By referring to such third reference information, the bonding force between the first substrate 211 and the second substrate 213 can be determined under a condition that the misalignment in the stacked substrate 230 formed by the bonding becomes smaller, as will be described later with reference to FIG. 27. When the bonding force between the first substrate 211 and the second substrate 213 is fixed, whether the stacked substrate 230 formed by bonding a combination of the first substrate 211 and the second substrate 213 satisfies a predetermined condition can be determined.

The fourth storage unit 624 stores fourth reference information in which the information about the crystal structure in the bonding surface of the first substrate 211 and the second substrate 213 is associated with the characteristics of the elements formed in the circuit regions 216 of the first substrate 211 and the second substrate 213. By referring to such fourth reference information, the determination device 601 can determine a layout of the substrate 213 with which when the substrate 213 is bonded to the first substrate 211 to form the stacked substrate 230, the misalignment in the stacked substrate is suppressed and the characteristics of the elements on the substrates do not deteriorate as will be described later with reference to FIG. 31.

The calculation unit 630 calculates the distribution of the misalignment occurring in the stacked substrate 230 formed as a result of bonding, by referring to the first reference information when the reception unit 610 receives the information about the crystal structures of the first substrate 211 and the second substrate 213 bonded by the bonding unit 300 of the bonding device 100. By referring to the calculation result output through the output unit 650, bonding that would result in excessive or localized misalignment can be prevented in advance.

When the reception unit 610 receives information about a crystal structure of each of the first substrate 211 and the second substrate 213, that is, the directions of the plane orientation in the bonding surface and the crystal orientation in parallel with the bonding surface, the first determining unit 641 determines the rotation angle involving the minimum misalignment by referring to the result of the calculation by the calculation unit 630 while changing the rotation angle between the crystal orientations in parallel with the bonding surfaces of the first substrate 211 and the second substrate 213. The rotation angle determined is output to the outside through the output unit 650 as the design specification of the first substrate 211 and the second substrate 213. Instead of determining the rotation angle involving the minimum misalignment, the rotation angle involving misalignment smaller than a predetermined threshold may be determined. When information about the crystal structure on one of the first substrate 211 and the second substrate 213 is received, the first determining unit 641 may determine another substrate with a crystal structure involving misalignment smaller than a threshold for the one substrate, while taking the rotation angle into consideration.

The second determining unit 642 acquires, from the first determining unit 641, the information about the direction of the crystal orientation in parallel with the bonding surface, for each of the first substrate 211 and the second substrate 213 in the combination determined by the first determining unit 641 and the like. When information about the crystal structure on each of the first substrate 211 and the second substrate 213 is received, the second determining unit 642 refers to the second reference information in the second storage unit 622 to determine the holding force for the first substrate 211 or the second substrate 213 in the bonding device 100, to minimize the misalignment in the stacked substrate 230 bonded in the bonding unit 300 of the bonding device 100. The holding force determined by the second determining unit 642 is output to the bonding unit 300 through the output unit 650, as a condition for bonding the first substrate 211 and the second substrate 213.

The third determining unit 643 also acquires, from the first determining unit 641, the information about the direction of the crystal orientation in parallel with the bonding surface, for each of the first substrate 211 and the second substrate 213 in the combination determined by the first determining unit 641 and the like. When information about the crystal structure on each of the first substrate 211 and the second substrate 213 is received, the third determining unit 643 refers to the third reference information in the third storage unit 623 to determine the bonding force between the first substrate 211 or the second substrate 213 in the bonding unit 300, to minimize the misalignment in the stacked substrate 230 bonded in the bonding unit 300 of the bonding device 100. The bonding force determined by the third determining unit 643 is output to the bonding unit 300 through the output unit 650, as a condition for bonding the first substrate 211 and the second substrate 213.

When the reception unit 610 receives information about the crystal structure on one of the first substrate 211 and the second substrate 213, that is, the first substrate 211 for example, specifically, the information about the crystal orientation on the bonding surface of the first substrate 211 as well as the type, the arrangement, and the like of the elements in the circuit regions 216 of the first substrate 211, the fourth determining unit 644 refers to the first storage unit 621, and determines the crystal structure of the substrate 213 to be bonded to the first substrate 211, to minimize the misalignment in the stacked substrate 230 formed after the bonding. Furthermore, the fourth determining unit 644 determines the circuit specification such as the arrangement, the formed direction, and the like of the elements of the circuit region 216 on the substrate 213 by referring to the fourth reference information in the fourth storage unit 624, in accordance with the crystal orientation of the bonding surface of the substrate 213. The circuit specification of the substrate 213 determine is output to the outside through the output unit 650.

As will be described later with reference to FIG. 32 to FIG. 36, when one of the substrates bonded in the bonding unit 300 of the bonding device 100 is already the stacked substrate 230 that has been formed by stacking a plurality of substrates, the fifth determining unit 645 refers to the first reference information in the first storage unit 621 to determine the crystal structure on the bonding surface of the other substrate bonded to the stacked substrate 230. The determination result is output to the outside through the determination output unit 650 as the determination identifying the combination of the stacked substrate 230 and the third substrate 215 to be bonded.

In the determination device 601, the output unit 650 outputs the output from any of the calculation unit 630 and the determining unit 640 to the outside. As an output mode in this case, the determination may be displayed on an unillustrated display device, or may be transmitted as an exposure condition or a bonding condition to at least one of the wafer process device 800 and the bonding device 100.

The calculation result, the determination, or the decision obtained by the calculation unit 630 and the determining unit 640 and output from the output unit 650 may further be accumulated in another database and the like to be referable from the outside. Thus, the reference information stored in each storage unit may be updated to improve the accuracy of the determination in the future. Furthermore, the determination output in one manufacturing apparatus 901 may be used by another manufacturing apparatus 901.

The determination device 601 described above receives the information about the crystal structure appearing on a surface of a substrate to be bonded in the bonding device 100, and determines at least one of the design specification of the bonded substrates, a combination of the bonded substrates, a process condition in the wafer process device 800, and a bonding condition in the bonding device 100, as will be described later. Thus, the stacked substrate 230 satisfying a predetermined condition can be reliably manufactured.

Figure 24:
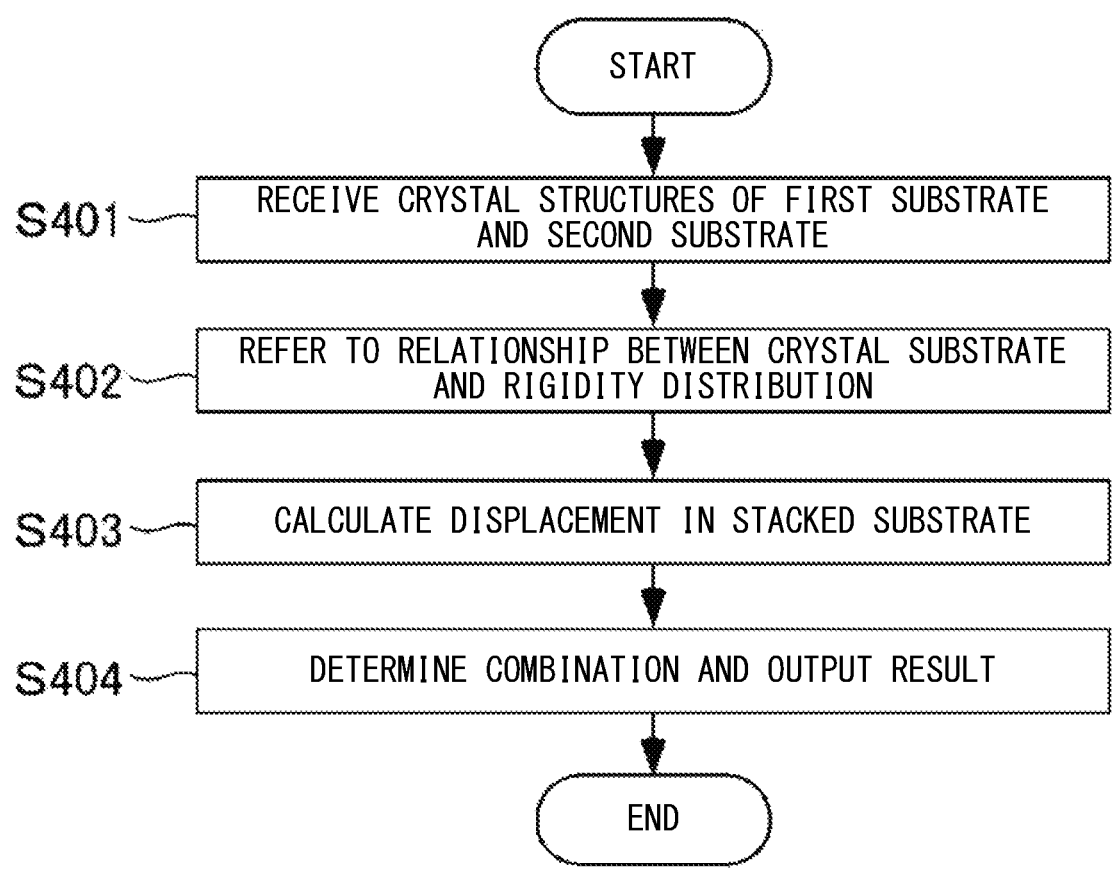
FIG. 24 is a flowchart illustrating a procedure of operations of the determination device 601.

FIG. 24 is a flowchart illustrating one procedure of operations of the determination device 601. Through the procedure illustrated in FIG. 24, the non-linear misalignment to occur in the stacked substrate 230 can be recognized without bonding the first substrate 211 and the second substrate 213.

First of all, the reception unit 610 receives information about the first substrate 211 and the second substrate 213 scheduled to form the stacked substrate 230, or is provisionally combined (step S401). The information thus received by the reception unit 610 includes information about the crystal structure of the first substrate 211 and the second substrate 213, that is, information about the crystal structure appearing on the bonding surface of each of the first substrate 211 and the second crystalline substrate 213 such as the composition of the first substrate 211 and the second substrate 213, information about the plane orientation of the bonding surface, information about a direction of the crystal orientation in parallel with the bonding surface.

Based on the information about the first substrate 211 and the second substrate 213 received by the reception unit 610, the calculation unit 630 refers to the first reference information stored in the first storage unit to acquire the information about the rigidity distributions on the bonding surfaces of the first substrate 211 and the second substrate 213 (step S402). Furthermore, the calculation unit 630 calculates the amount of misalignment occurring in the stacked substrate 230 in accordance with the rigidity distribution when the first substrate 211 and the second substrate 213 are bonded (step S403).

Next, based on the misalignment amount calculated by the calculation unit 630, the first determining unit 641 determines whether the stacked substrate 230 manufactured by bonding a combination of the first substrate 211 and the second substrate 213 satisfies a predetermined condition, specifically, whether the misalignment between the first substrate 211 and the second substrate 213 in the stacked substrate 230 does not exceed the predetermined threshold, and outputs the determination result through the output unit 650 as the determination (step S404). Thus, the determination device 601 outputs the determination result based on the misalignment that will occur as a result of the bonding, before bonding the first substrate 211 and the second substrate 213, whereby the stacked substrate 230 including excessive misalignment can be prevented from being formed by bonding in advance.

It should be noted that since the calculation unit 630 uses the information about the rigidity distribution, the determination device 601 can be regarded as determining whether to select the first substrate 211 and the second substrate 213 to be the mutually bonded combination, based on the information about the rigidity distributions of the substrates. Instead, the reception unit 610 may directly acquire the information about the rigidity distributions of the first substrate 211 and the second substrate 213, and whether the substrates are selected as the mutually bonded combination may be determined based on the information about the rigidity distributions.

Figure 25:
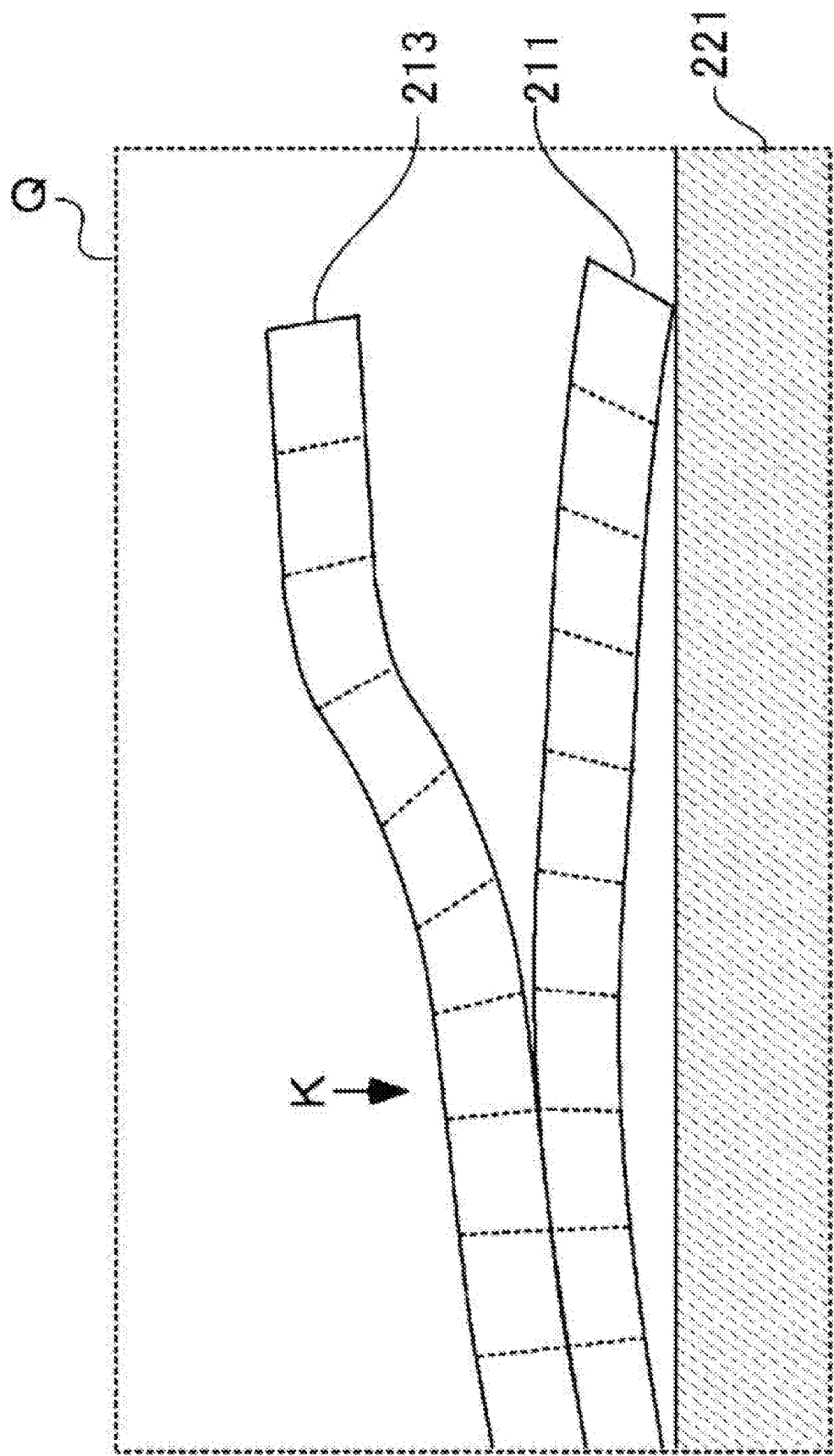
FIG. 25 is a partially enlarged view illustrating a process of bonding the first substrate 211 and the second substrate 213.

FIG. 25 is a diagram illustrating a part of the first substrate 211 and the second substrate 213 during the bonding process in the bonding unit 300. In the illustrated example, during the bonding process of the first substrate 211 and the second substrate 213, the holding of the first substrate 211 by the substrate holder 221 on the lower side is partially released.

During the bonding process with the bonding wave spreading, when the holding of the first substrate 211 positioned on the lower side in the figure by the substrate holder 221 is weakened to be partially released, or when the frictional force against the substrate holder 221 is lowered, in such a region, the first substrate 211 on the lower side is lifted from the substrate holder 221 to be curved due to attraction force acting between the first substrate 211 and the substrate 213 on the upper side. As a result, the magnification of the first substrate 211 on the lower side with respect to the design specification changes, whereby the amount of misalignment occurring in the stacked substrate 230 changes. Thus, the bonding condition of the first substrate 211 and the second substrate 213 further includes a timing at which the holding of the first substrate 211 is released, a size of the released region, and the like.

Figure 26:
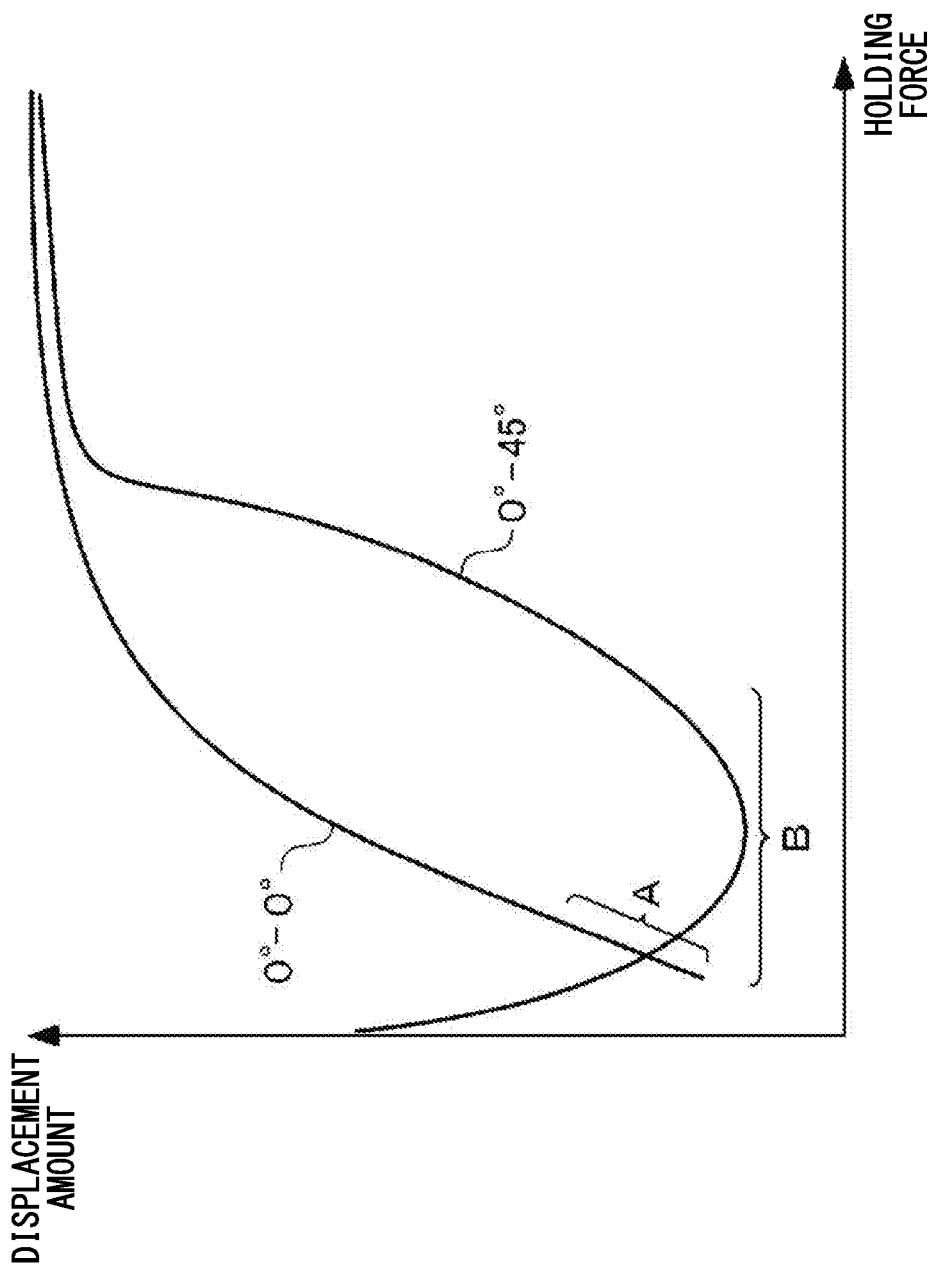
FIG. 26 is a graph illustrating an example of relationship between holding force and a misalignment amount.

FIG. 26 is a graph illustrating an example of relationship between a change in the holding force in the bonding unit 300 and the misalignment amount in the stacked substrate 230 corresponding to the change, for a certain combination between the first substrate 211 and the second substrate 213. Specifically, the graph is an example of the second reference information described above. The figure illustrates the misalignment amount in the stacked substrate 230 corresponding to the change in the holding force, for a combination of the first substrate 211 and the second substrate 213 with the in-plane crystal orientations parallel to the bonding surface matching, and a combination between the first substrate 211 and the second substrate 213 in a relationship with the crystal orientation along the bonding surface rotated by 45°.

As illustrated in the figure, when the holding force for the first substrate 211 or the second substrate 213 in the bonding device 100 changes, the amount of misalignment occurring in the stacked substrate 230 changes. A mode of the change varies depending on the crystal structures on the bonding surface of the first substrate 211 and the second substrate 213 to be bonded. Thus, by referring to the information in the graph illustrated in FIG. 26 for a certain combination between the first substrate 211 and the second substrate 213, ranges A and B of the holding force resulting in a smaller misalignment amount in the stacked substrate 230 formed by bonding the combination can be acquired. The holding force is set to be equal to or lower than 100 Kpa.

Figure 27:
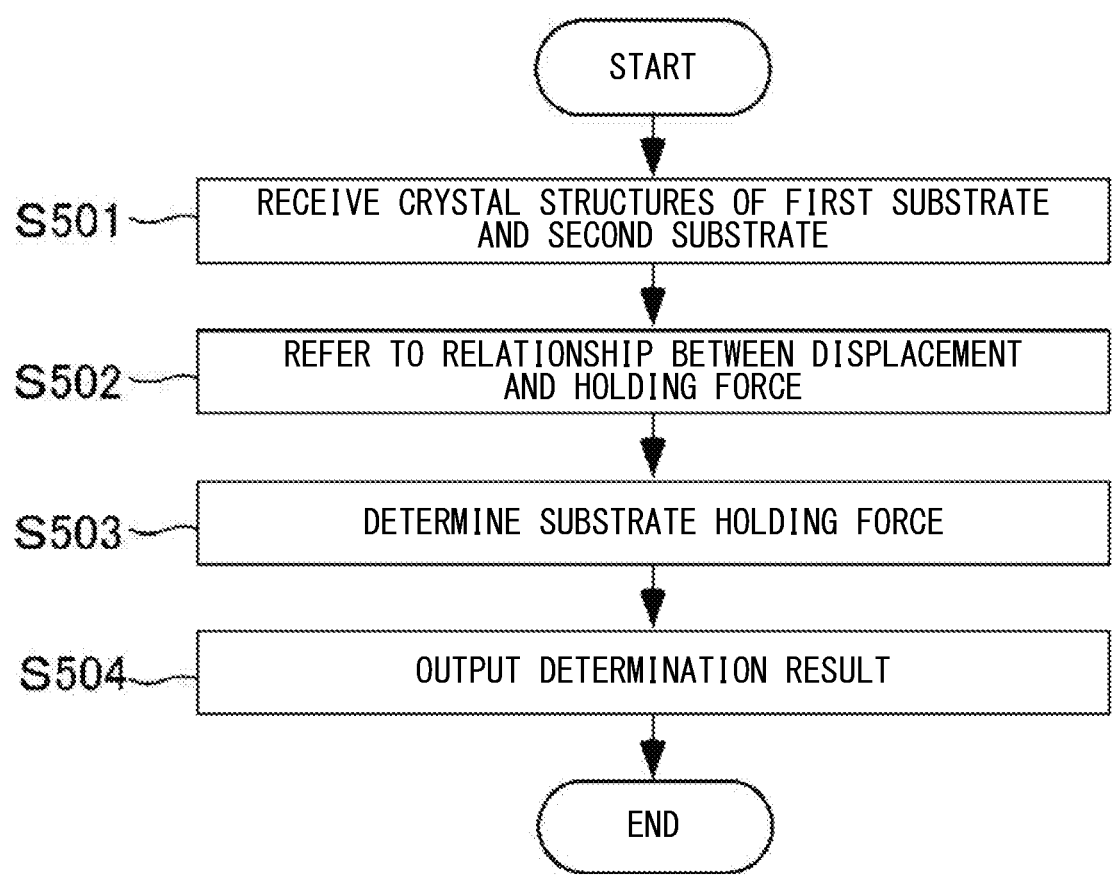
FIG. 27 is a flowchart illustrating another procedure of operations of the determination device 601.

FIG. 27 is a flowchart illustrating a procedure of operations for the second determining unit 642 to determine the holding force for a purpose of suppressing the misalignment amount as described above. First of all, the second determining unit 642 acquires a combination of crystal structures of the first substrate 211 and the second substrate 213 determined by the first determining unit 641, that is, information indicating the amount of rotation of the direction of the crystal orientation in parallel with the bonding surface of each of the first substrate 211 and the second substrate 213 (step S501).

Next, the second determining unit 642 refers to the second reference information in the second storage unit 622 (step S502), and determines the holding force for the first substrate 211 or the second substrate 213 in the bonding unit 300 (step S503). Next, the second determining unit 642 outputs the holding force determined in step S503 to the control unit 150 of the bonding unit 300 through the output unit 650, as the bonding condition applied when the first substrate 211 and the second substrate 213 are bonded (step S504).

Figure 28:
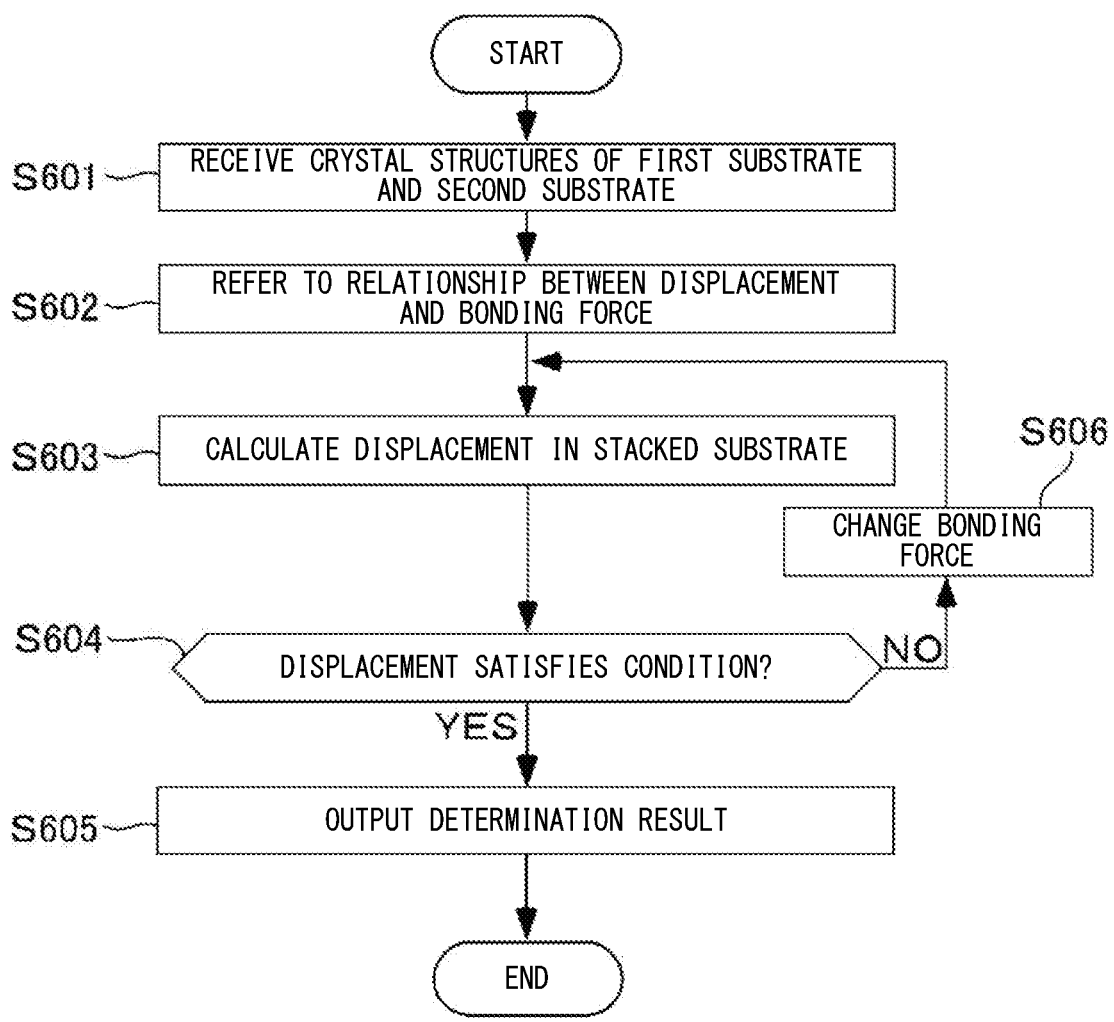
FIG. 28 is a flowchart illustrating another procedure of operations of the determination device 601.

FIG. 28 is a flowchart illustrating a procedure of operations of the third determining unit 643. When the first substrate 211 and the second substrate 213 are bonded, with the magnitude of the bonding force for bonding the first substrate 211 and the second substrate 213 set to be appropriate as described above, the misalignment in the stacked substrate 230 can be suppressed.

Specifically, by changing the bonding force with which the first substrate 211 and the second substrate 213 activated are attracted to each other in the bonding device 100, an effect similar to that obtained by changing the holding force for any of the first substrate 211 and the second substrate 213 as described above can be obtained. Thus, the reception unit 610 of the determination device 601 may output an appropriate bonding force applied to the first substrate 211 and the second substrate 213 through activation using plasma and the like, as a specification of the stacked substrate 230.

The bonding force described above is intermolecular force acting between the first substrate 211 and the second substrate 213 with the bonding surfaces activated in the bonding unit 300 for example. The magnitude of the bonding force can be adjusted by changing the condition of a process of activating the bonding surface of the first substrate 211 and the second substrate 213 in the bonding unit 300.

First of all, the reception unit 610 acquires the information about the crystal structures of the first substrate 211 and the second substrate 213, specifically, information indicating the direction of the crystal orientation in a direction parallel to the bonding surface of each of the first substrate 211 and the second substrate 213 (step S601). Next, the calculation unit 630 refers to the third reference information in the third storage unit 623 (step S602) to set provisional bonding force for the first substrate 211 as one of the substrates, and calculates the amount of misalignment between the first substrate 211 and the second substrate 213 occurring in the stacked substrate 230 obtained by bonding the first substrate 211 and the second substrate 213 with the bonding force thus set (step S603).

Next, the third determining unit 643 checks whether a condition that the misalignment calculated in step S603 does not exceed a threshold set in advance is satisfied (step S604). When the result indicates that the misalignment amount calculated satisfies the condition set in advance (step S604:

YES), the provisional bonding force currently set is output to the bonding unit 300 as the bonding force to be applied for bonding the first substrate 211 and the second substrate 213 (step S605).

When the misalignment amount calculated in step S603 does not satisfy the predetermined condition (step S604: NO), the third determining unit 643 sets different provisional bonding force (step S605) and then repeats the processes in step S603 and 604. In this manner, the determination device 601 determines the bonding force resulting in the minimum amount of misalignment occurring in the stacked substrate 230, and outputs the force to the bonding unit 300 through the output unit 650. It is noted that the a combination of the substrates resulting in bonding force between the substrates overwhelming the holding force of the substrate holder 221 is preferable when the combination is determined.

Figure 29:
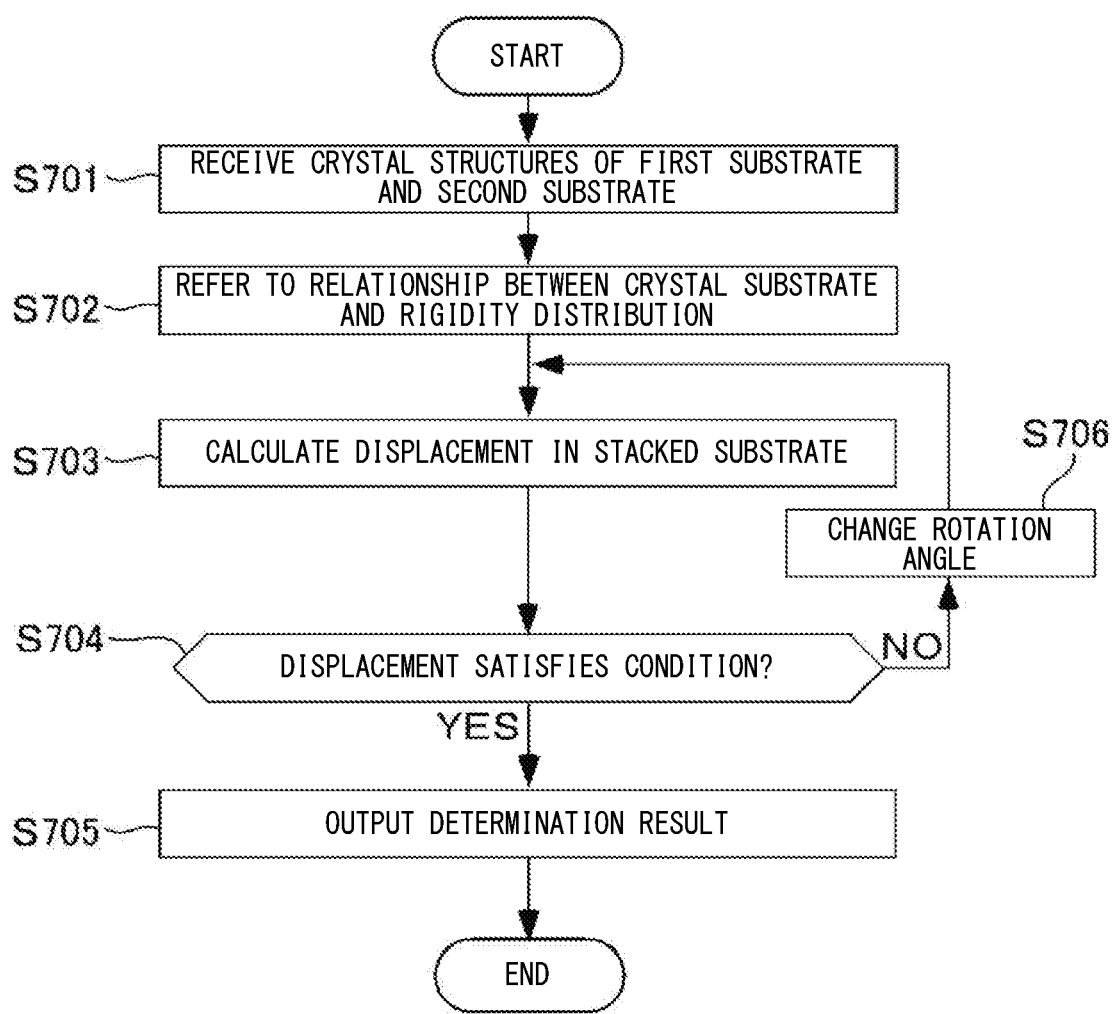
FIG. 29 is a flowchart illustrating another procedure of operations of the determination device 601.

FIG. 29 is a flowchart illustrating still another procedure of operations of the determination device 601. Here, the determination device determines a combination of crystal orientations in parallel with the bonding surface, in the bonding surfaces of the first substrate 211 and the second substrate 213 by referring to the first reference information stored in the first storage unit 621, to suppresses the misalignment amount in the stacked substrate 230 formed by bonding the first substrate 211 and the second substrate 213.

First of all, the reception unit 610 acquires the information about the crystal structures in the bonding surface of the first substrate 211 and the second substrate 213, specifically, information indicating the direction of the crystal orientation in a direction parallel to the bonding surface of each of the first substrate 211 and the second substrate 213 (step S701). Next, the calculation unit 630 refers to the first reference information in the first storage unit 621 (step S702), and calculates the misalignment amount in the stacked substrate 230 in which the first substrate 211 and the second substrate 213 are stacked, based on the rotation angle of the crystal orientation in the combination of the first substrate 211 and the second substrate 213 (step S703).

Figure 30:
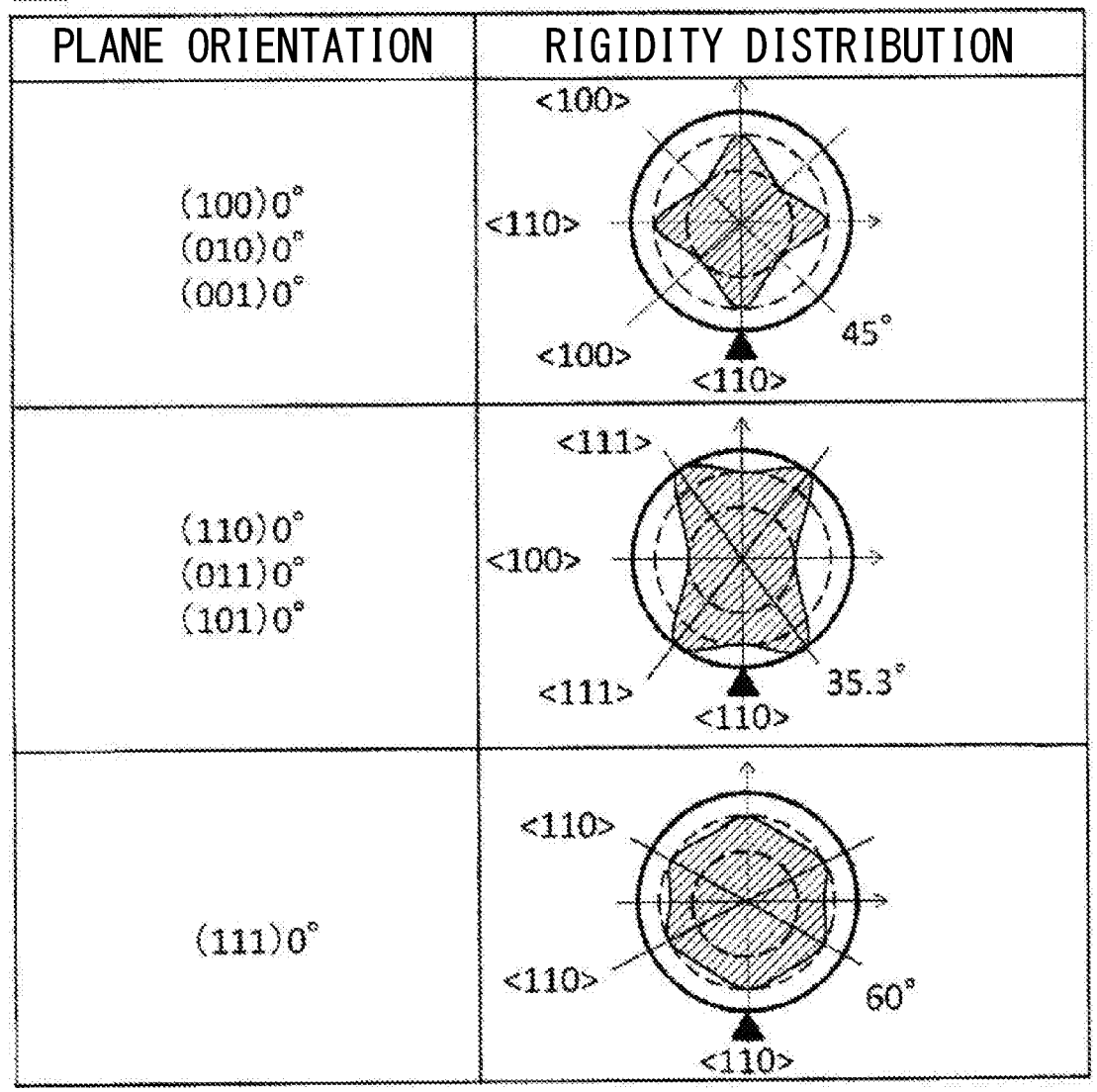
FIG. 30 is a diagram illustrating an example of a table 627 stored in a first storage unit 621.

FIG. 30 is a diagram illustrating an example of a content of the table 627 stored in the first storage unit 621 of the determination device 600. The table 627 stores a combination between plane orientation and crystal orientation as the crystal structure on the bonding surface of the substrate and a pattern of the rigidity distribution on the bonding surface. Thus, the table 627 is also an example of the first reference information. The calculation unit 630 refers to the table 627 to acquire the patterns of the rigidity distribution corresponding to the crystal structures on the bonding surfaces of the first substrate 211 and the second substrate 213 received by the reception unit 610. Furthermore, the calculation unit 630 calculates the misalignment amount in the stacked substrate 230 formed by bonding the first substrate 211 and the second substrate 213 based on the information about the pattern of the rigidity distribution acquired.

Referring back to FIG. 29, the determining unit 640 next compares the misalignment amount calculated by the calculation unit 630 with a predetermined threshold, to determine whether the combination of the first substrate 211 and the second substrate 213 received by the reception unit 610 is appropriate (step S704). As a result, when the distortion in the stacked substrate 230 is determined to exceed a threshold (step S704: NO), the determining unit 640 makes a negative determination on the provisional combination between the first substrate 211 and the second substrate 213 received by the reception unit 610, and causes the output unit 650 to output the determination (step S705).

When the estimation result does not exceed the predetermined threshold (step S704: YES), the determining unit 640 makes a negative determination on the combination between the first substrate 211 and the second substrate 213, and outputs the result through the output unit 650 (step S7059). Thus, the combination between the first substrate 211 and the second substrate 213 is determined based on the first reference information stored in the first storage unit 621.

Furthermore, the determination device 600 may attempt to perform the processes in steps S702 to S705 described above, for a combination different from the combination between the crystal structures on the bonding surfaces of the first substrate 211 and the second substrate 213 received by the reception unit 610. Thus, for example, a combination with the crystal orientation in parallel with the bonding surface rotated, and with the plane orientation on the bonding surfaces of the first substrate 211 and the second substrate 213 received by the reception unit 610 fixed can be determined.

Figure 31:
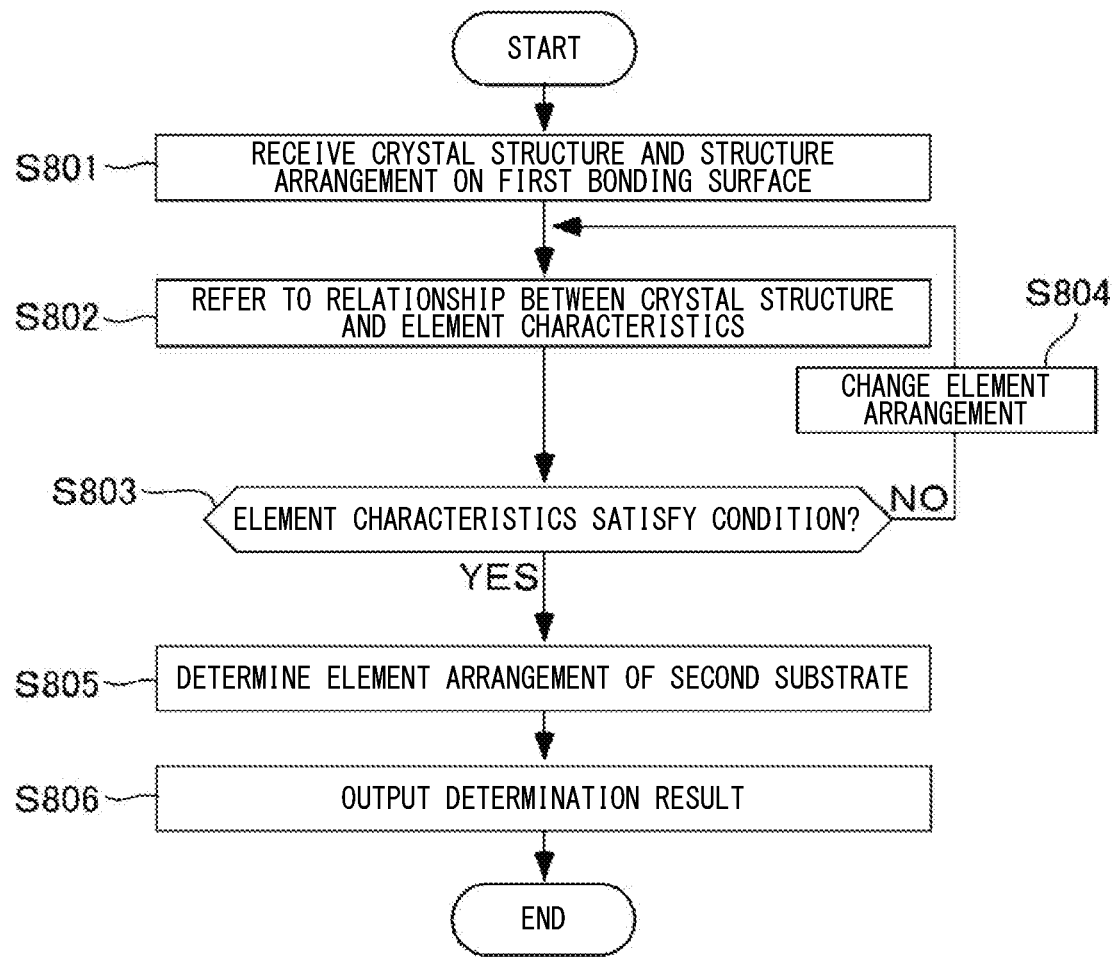
FIG. 31 is a flowchart illustrating another procedure of operations of the determination device 601.

FIG. 31 is a flowchart illustrating still another procedure of operations of the determination device 601. When elements are formed on the semiconductor substrate, the element characteristics may vary depending on the formed direction of the elements due to the anisotropy of the crystal structure of the semiconductor substrate. Thus, the combination between crystal structures appearing on the bonding surfaces is determined for the purpose of suppressing the misalignment between the first substrate 211 and the second substrate 213 in the stacked substrate 230 may result in deterioration of the characteristics of the elements formed on the first substrate 211 and the second substrate 213.

In view of this, in the determination device 601, when the reception unit 610 acquires the crystal structures of the first substrate 211 and the second substrate 213, specifically, the information about the crystal structure on the bonding surface of each of the first substrate 211 and the second substrate 213 (step S801), the fourth determining unit 644 refers to the fourth storage unit 624 to acquire the information about element characteristics corresponding to the crystal structures appearing on the bonding surfaces of the first substrate 211 and the second substrate 213 received by the reception unit 610 (step S802).

Next, the fourth determining unit 644 checks whether the elements formed on the first substrate 211 and the second substrate 213 each satisfy a condition of not falling below a predetermined threshold (step S803). As a result, when the element characteristics satisfy the condition (step S803: YES), the rotation angle received by the reception unit 610 is determined as the specification of the first substrate 211 and the second substrate 213 to be output to the wafer process device 800.

When the element characteristics do not satisfy the condition (step S803: NO), the specification of the substrate failed to achieve the element characteristics satisfying the condition is changed (step S804), and the process returns to step S803 based on the specification changed. Thus, the formed direction of the elements satisfying both the condition related to the misalignment amount in the stacked substrate 230 and the condition related to the element characteristics are finally determined, and the determination is output to the wafer process device 800 through the output unit 650 (step S805).

Thus, the determination device 601 outputs a condition for manufacturing the stacked substrate 230 with which the misalignment between the first substrate 211 and the second substrate 213 is suppressed by rotating the crystal orientation and with which element characteristics in the each of the first substrate 211 and the second substrate 213 are efficiently exerted (step S806).

FIG. 32 to FIG. 36 are diagrams illustrating a manufacturing process for another stacked substrate 240. The stacked substrate 240 manufactured herein is formed by bonding three substrates with the contact surfaces being the surfaces (100) that are the first substrate 211, the second substrate 213, and a second substrate 215. When such a stacked substrate 240 of a three layer structure is designed, the determination device 600 first determines a combination related to crystal structures on the bonding surfaces for bonding the first substrate 211 and the second substrate 213. Next, the determination device 600 determines the crystal structure on the bonding surface of the third substrate 215 bonded to the stacked substrate 230.

Figure 32:
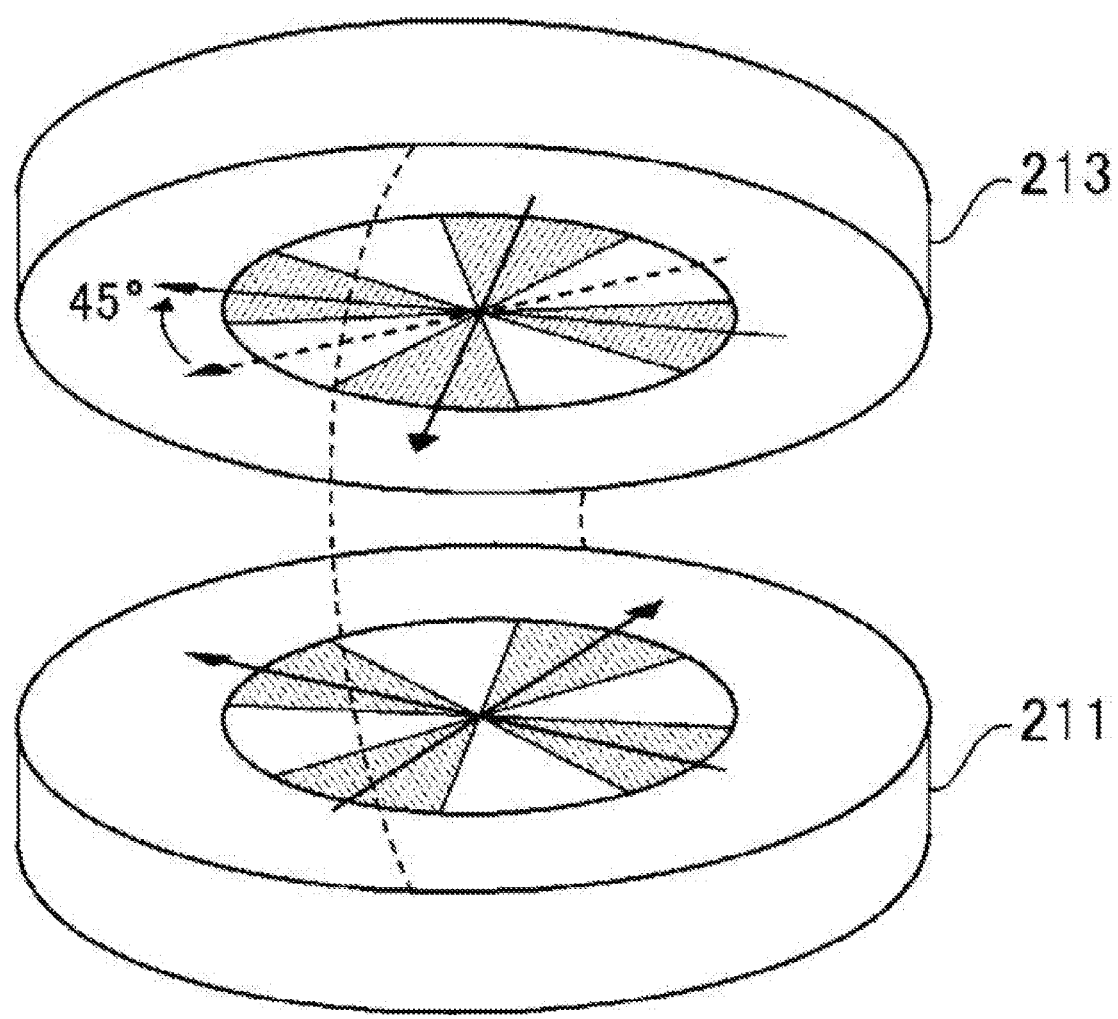
FIG. 32 is a schematic perspective view illustrating a manufacturing process for a stacked substrate 240.
Figure 33:
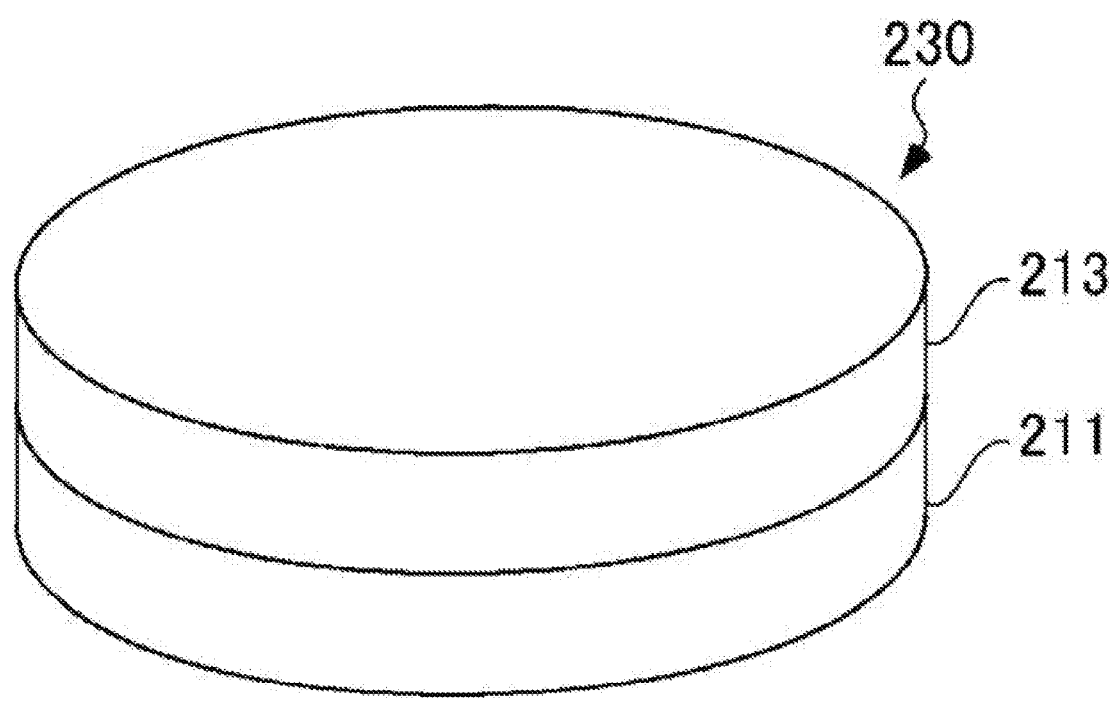
FIG. 33 is a schematic perspective view illustrating a manufacturing process for a stacked substrate 240.

First, as illustrated in FIG. 32, the substrate 213 is bonded to the first substrate 211. At this stage, the bonding surface of the substrate 213 is bonded to the bonded surface of the first substrate 211, with the crystal orientation in parallel with the bonding surface of the substrate 213 rotated by 45° with respect to the crystal orientation in parallel with the bonding surface of the first substrate 211. When the substrates 211 and 213 are substrates with surfaces having patterns, a circuit pattern is formed on the substrate 213 in such a manner that the arrangement of the circuit pattern corresponds to the arrangement of the circuit pattern of the substrate 211 in a state where the crystal orientation of the substrate 213 rotated by 45° with respect to the crystal orientation of the substrate 211. Thus, as described above and as illustrated in FIG. 33, the stacked substrate 230 with two layers is formed with the misalignment distribution due to the crystal anisotropy suppressed.

Figure 34:
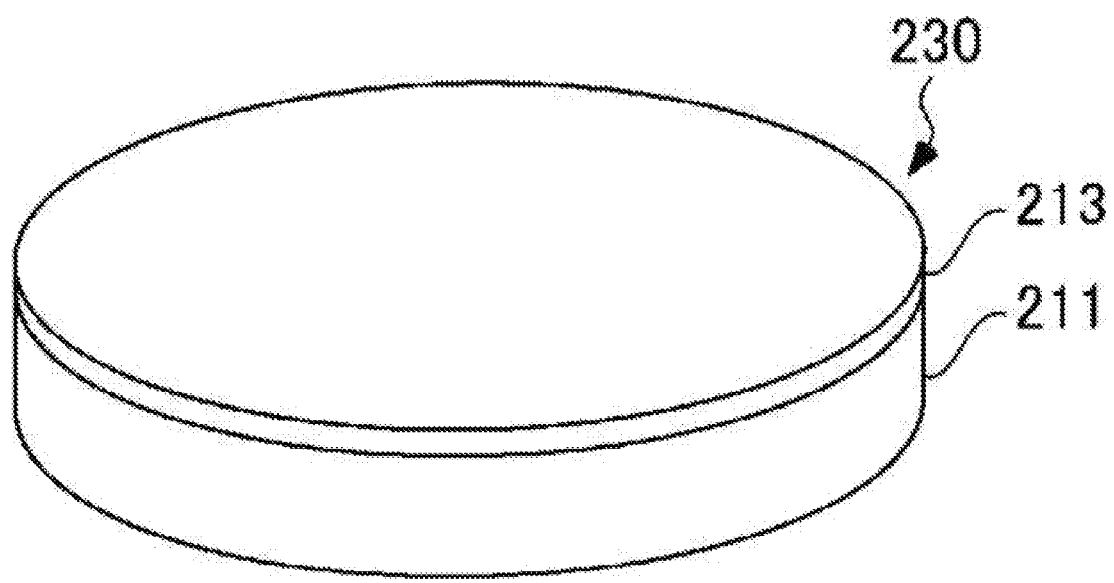
FIG. 34 is a schematic perspective view illustrating a manufacturing process for a stacked substrate 240.

Then, as illustrated in FIG. 34, the substrate 213 in the stacked substrate 230 is thinned by mechanical chemical polishing. The new surface of the substrate 213 that has appeared as a result of the thinning serves as the bonding surface with which the stacked substrate 230 is bonded to another substrate. At this timing, the substrate 215 as the third layer with the bonding surface to be bonded to the new bonding surface is prepared.

Figure 35:
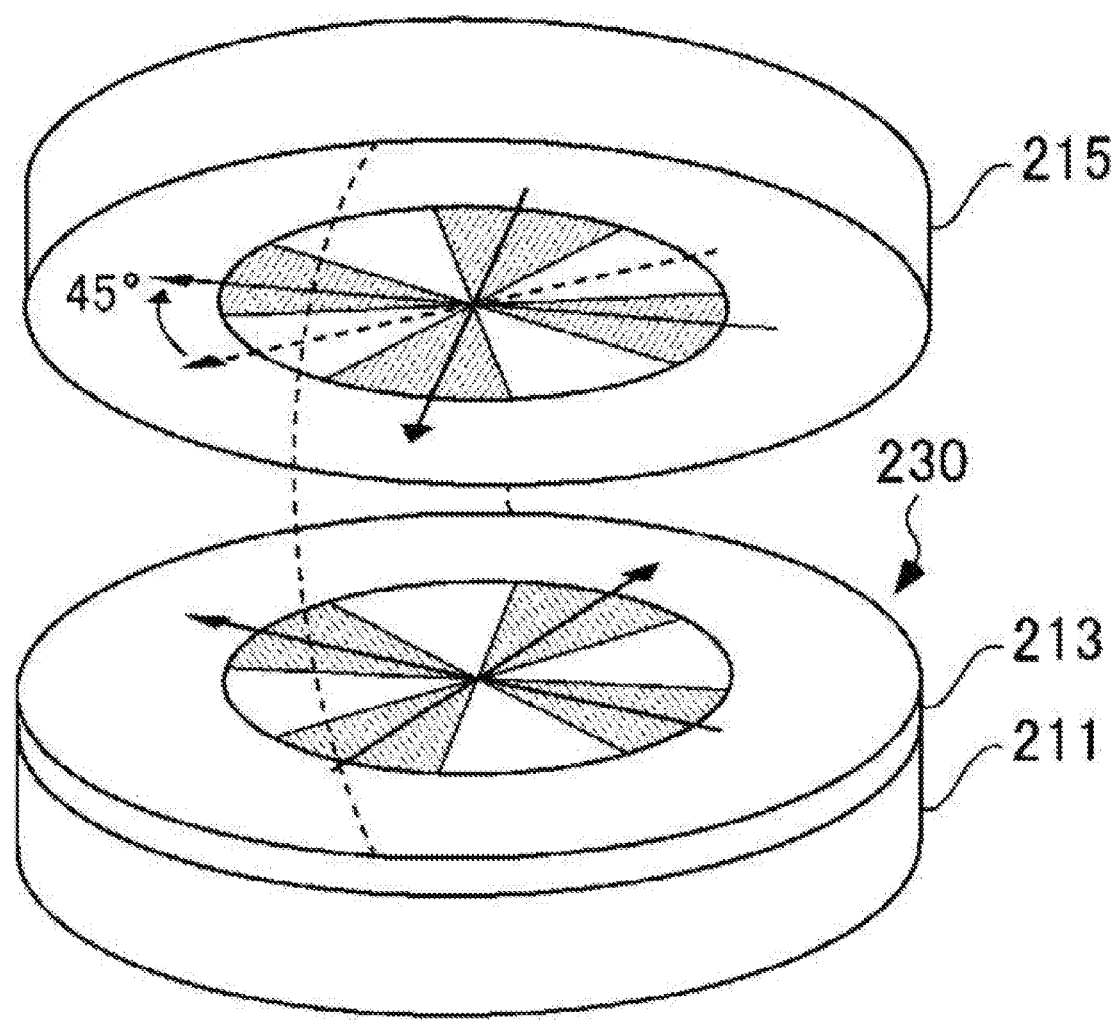
FIG. 35 is a schematic perspective view illustrating a manufacturing process for a stacked substrate 240.

In the stacked substrate 230 with the substrate 213 side thinned, a thickness corresponding to the substrate 213 is much thinner than a thickness corresponding to the first substrate 211. Thus, as illustrated in FIG. 35, the rigidity distribution in the bonding surface newly formed by thinning the substrate 213 reflects the rigidity distribution of the bonding surface of the first substrate 211 not thinned.

Figure 36:
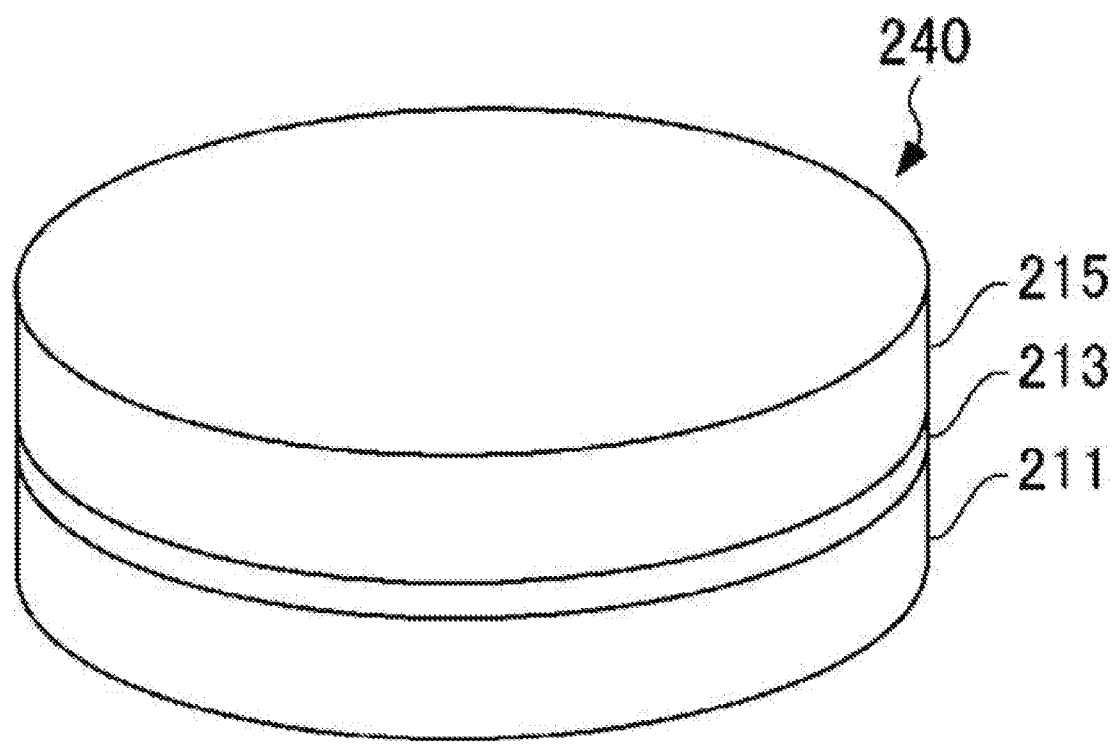
FIG. 36 is a schematic perspective view illustrating a structure of a stacked substrate 240.

Thus, the substrate 215 as the third layer is bonded with the substrate 213 with the crystal orientation in parallel with the bonding surface of the surface 215 rotated by 45° with respect to the crystal orientation in parallel with the bonding surface of the first substrate 211 as the first layer, and not with respect to the crystal orientation of the substrate 213 with which the substrate 215 is directly bonded. Thus, the misalignment can also be suppressed in the stacked substrate 240 formed by bonding three layers. In this manner, the stacked substrate 240 with three layers with misalignment due to crystal anisotropy suppressed is manufactured as illustrated in FIG. 36. Note that although an example where the substrate 213 rotated by 45° is thinned is described, the substrate stacked on the substrate rotated by 45° may be thinned.

As described above, when the stacked substrate 230 already having a stacked structure is bonded to another substrate, the crystal structure on the bonding surface of the substrate 215 bonded is determined not in accordance with the characteristics of the bonding surface of the substrate 213 positioned on the bonding surface of the stacked substrate 230, but is determined in accordance with the crystal structure appearing on the bonding surface of the stacked substrate 230 formed by a plurality of substrates.

With the determining unit 640 determining the structure of the bonding surface, when the multi-layer stacked substrate 240 having three or more layers is manufactured, the misalignment occurring in the stacked substrate 240 can also be suppressed. In other words, when the stacked substrate 240 having three or more layers is manufactured, the first substrate 211 as the first layer and the substrate 213 as the second layer may be bonded to the crystal orientation in parallel with the bonding surface rotated, and then, the substrate(s) 215 as the third layer or after may all be bonded to the crystal orientation being the same as that of the substrate 213 as the second layer and with the substrate immediately below thinned. With the determining unit 640 making such a determination, the crystal structures on the bonding surface of the substrates 213 and 215 as the second layer and after can be determined to suppress the misalignment in the stacked substrate 240 without involving complicated design and process for the substrates 213 and 215.

When the stacked substrate 230 is formed by bonding the first substrate 211 and the second substrate 213 and a further substrate 215 is laid and bonded thereto after the second substrate 213 has been thinned, the determination device 601 of the manufacturing apparatus 901 preferably determines the crystal structure on the bonding surface of the substrate 215 in accordance with the crystal structure on the bonding surface of the first substrate 211 that is the dominating bonding surface in the stacked substrate 230, and not in accordance with the crystal structure on the bonding surface of the second substrate 213 to be positioned immediately below the substrate 215 to be bonded.

Figure 37:
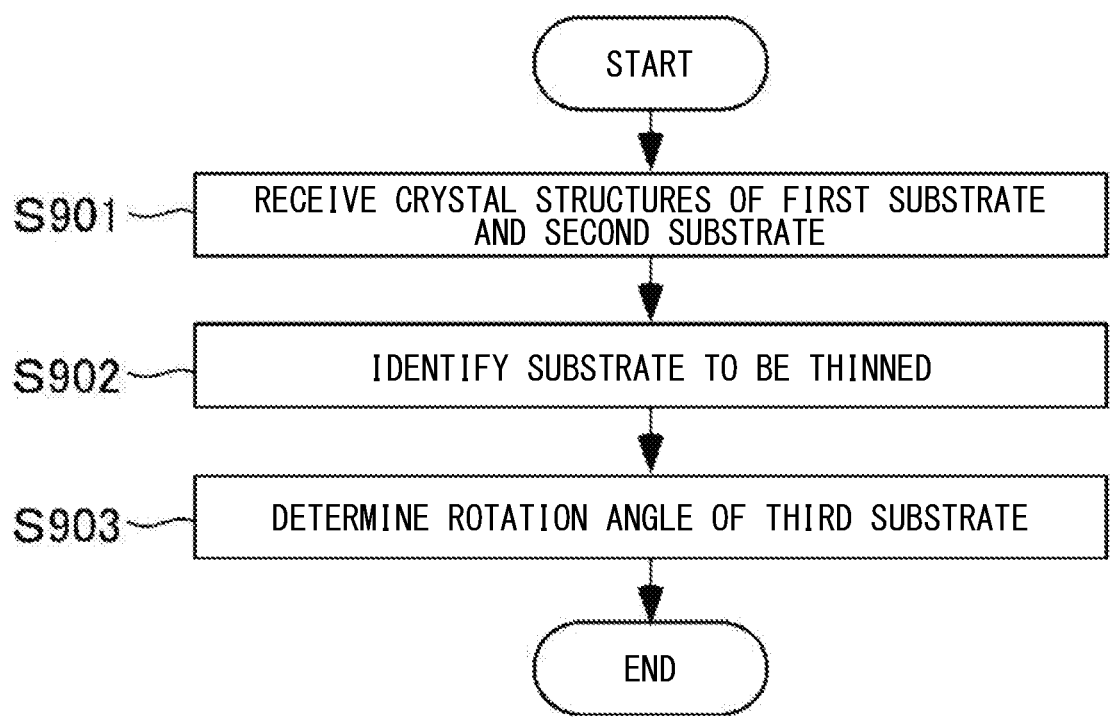
FIG. 37 is a flowchart illustrating another procedure of operations of the determination device 601.

FIG. 37 is a flowchart illustrating a procedure of operations of the determination device 601 in a case where three or more substrates are bonded as described above. In the determination device 601, first of all, the first determining unit 641 and the like determine a combination between the crystal structures of the first substrate 211 and the second substrate 213 forming the stacked substrate 230 (step S901). Next, before the third substrate 215 is stacked, which of the first substrate 211 and the second substrate 213 is thinned is identified (step S902). Then, the fifth determining unit 645 determines the crystal structure on the bonding surface of the third substrate 215 for the stacked substrate 230 by referring to the first reference information in the first storage unit 621. The crystal structure determined is, for example, an amount of rotation of the direction of the crystal orientation in parallel with the bonding surface.

As has been described above, the fifth determining unit 645 determines the direction of the crystal orientation in parallel with the bonding surface of the third substrate 215 by referring to the first reference information in the first storage unit 621, based on the crystal structure on the bonding surface of the first substrate 211 for the second substrate 213, and not on the crystal structure on the second substrate 213 to be directly brought into contact with and bonded to the third substrate 215 (S903). Thus, an appropriate rotation angle of the crystal orientation on the bonding surface of the substrate 215 is determined.

In the example described above, with respect to the direction of the crystal direction in parallel with the bonding surface of one of the first substrate 211 and the second substrate 213, the direction of the crystal orientation of the other one of the substrates is rotated, in a plane in parallel with the bonding surface. However, the combination of the crystal structures on the bonding surfaces of the first substrate 211 and the second substrate 213 bonded is not limited to a combination of the crystal orientations with one rotated with respect to the other. For example, the misalignment can also be reduced by bonding a combination of the first substrate 211 and the second substrate 213 having bonding surfaces with different plane orientations. Furthermore, the misalignment may also be reduceable with a combination of substrates different from each other in both crystal orientation and plane orientation.

It is to be noted that the functions of the determination devices 600 and 601 may be implemented with a program installed in a computer such as a personal computer (PC). The program may be downloaded through communications over the Internet and the like, or may be recorded in a computer-readable medium and read by the computer.

Figure 40:
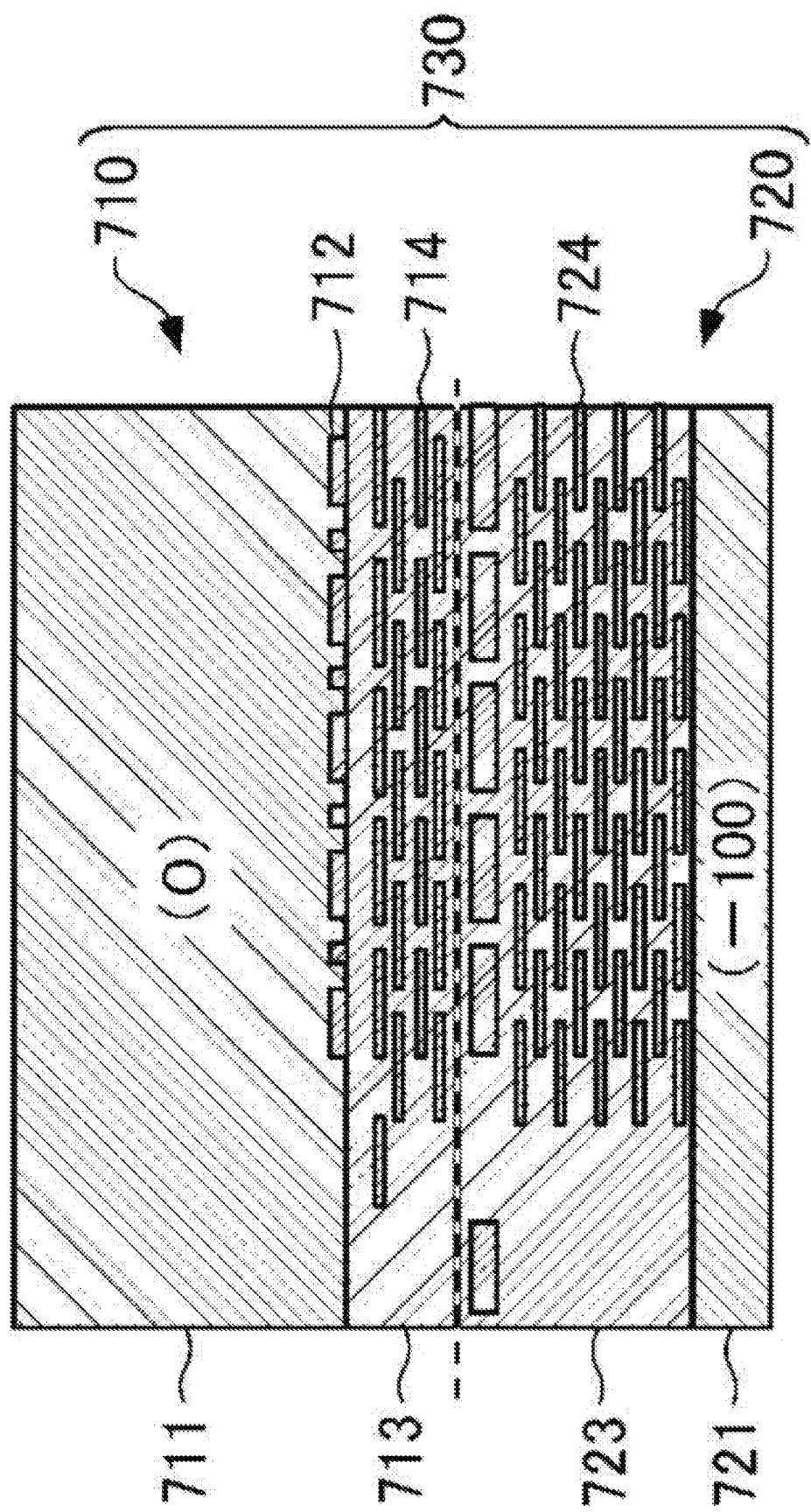
FIG. 40 is a diagram illustrating another stage in the manufacturing process for the image sensor 700.
Figure 41:
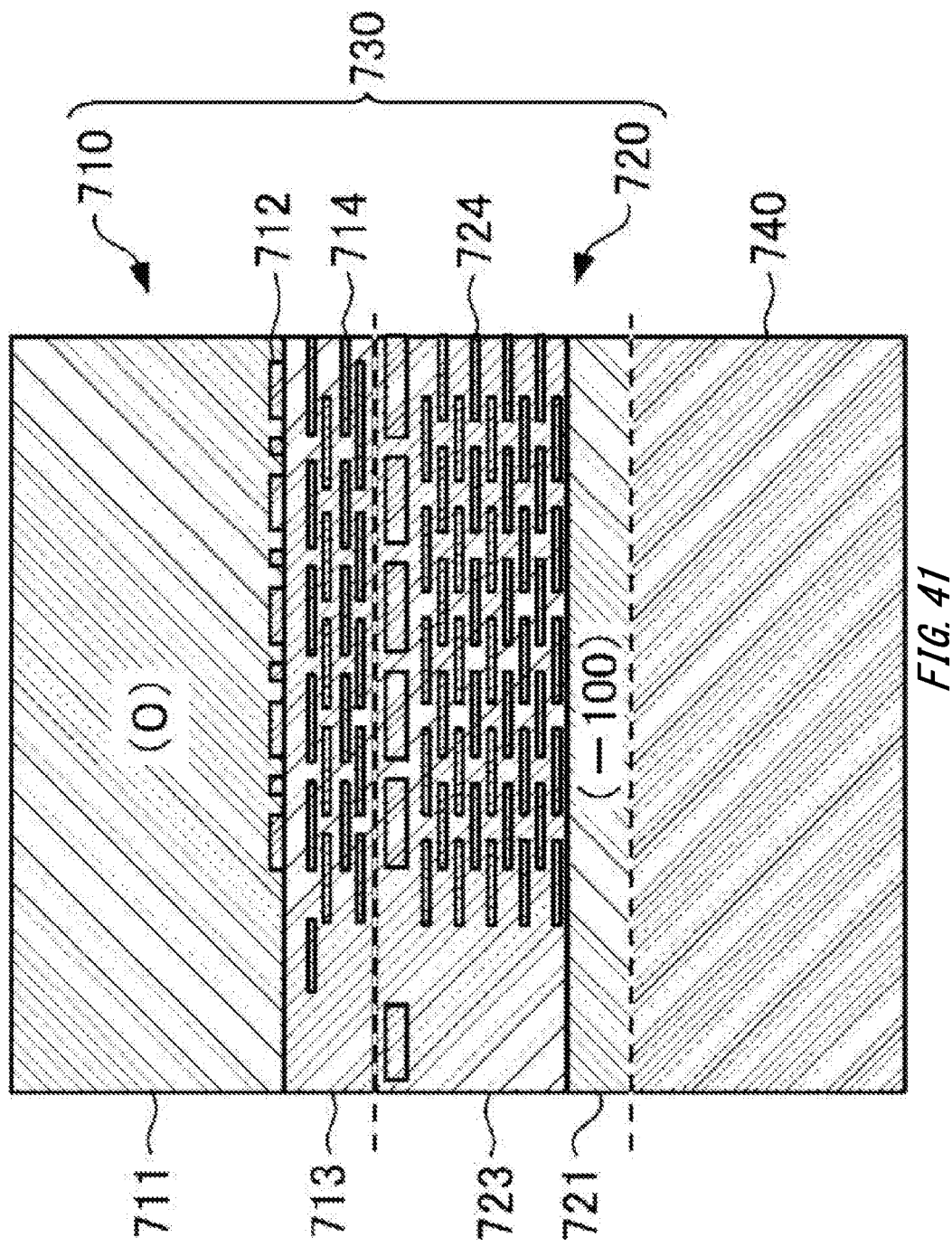
FIG. 41 is a diagram illustrating another stage in the manufacturing process for the image sensor 700.
Figure 42:
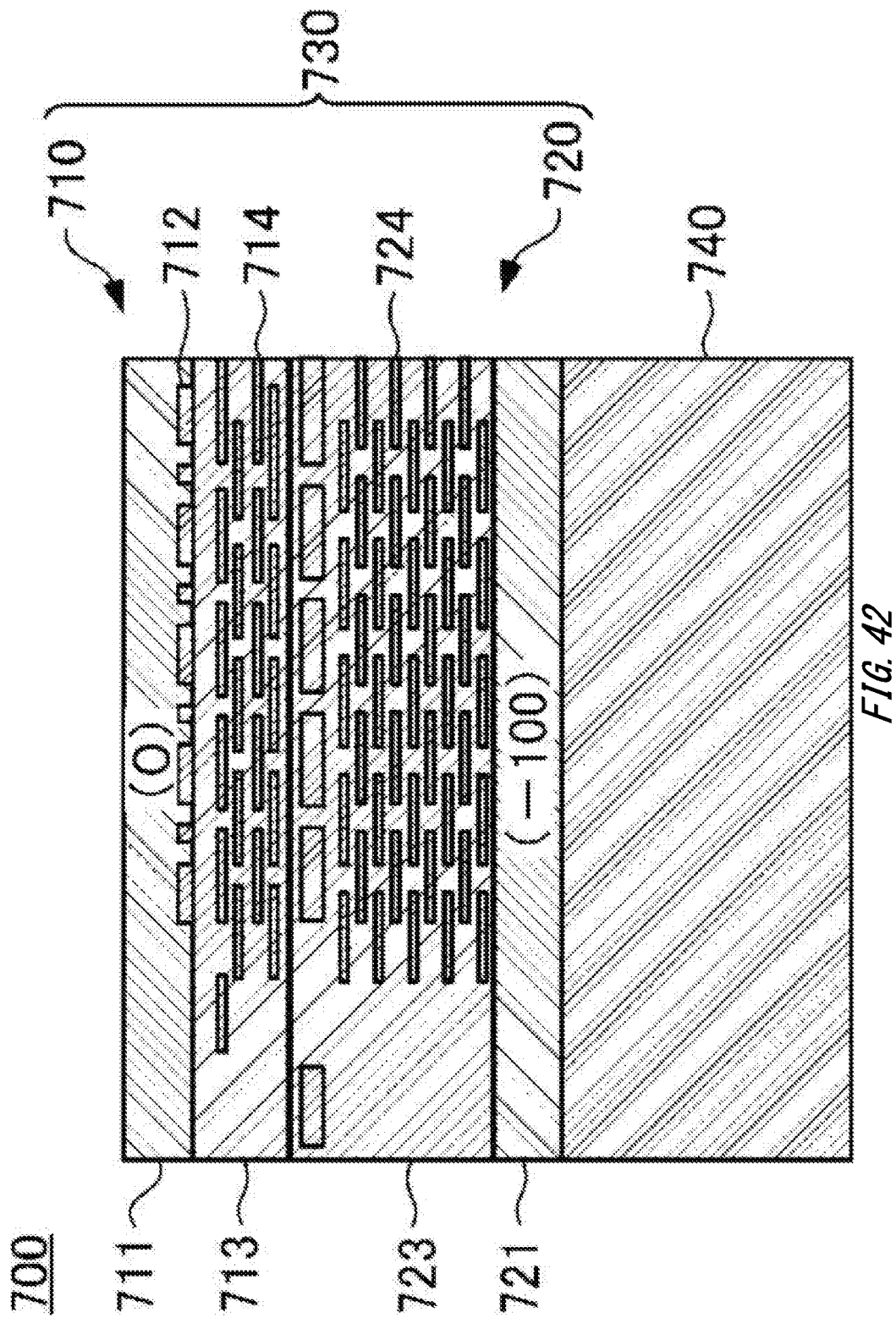
FIG. 42 is a diagram illustrating another stage in the manufacturing process for the image sensor 700.

FIG. 38 to FIG. 42 are cross sectional views illustrating a process of manufacturing an image sensor 700. FIG. 42 illustrates a cross-sectional structure of the image sensor 700 completed.

Figure 38:
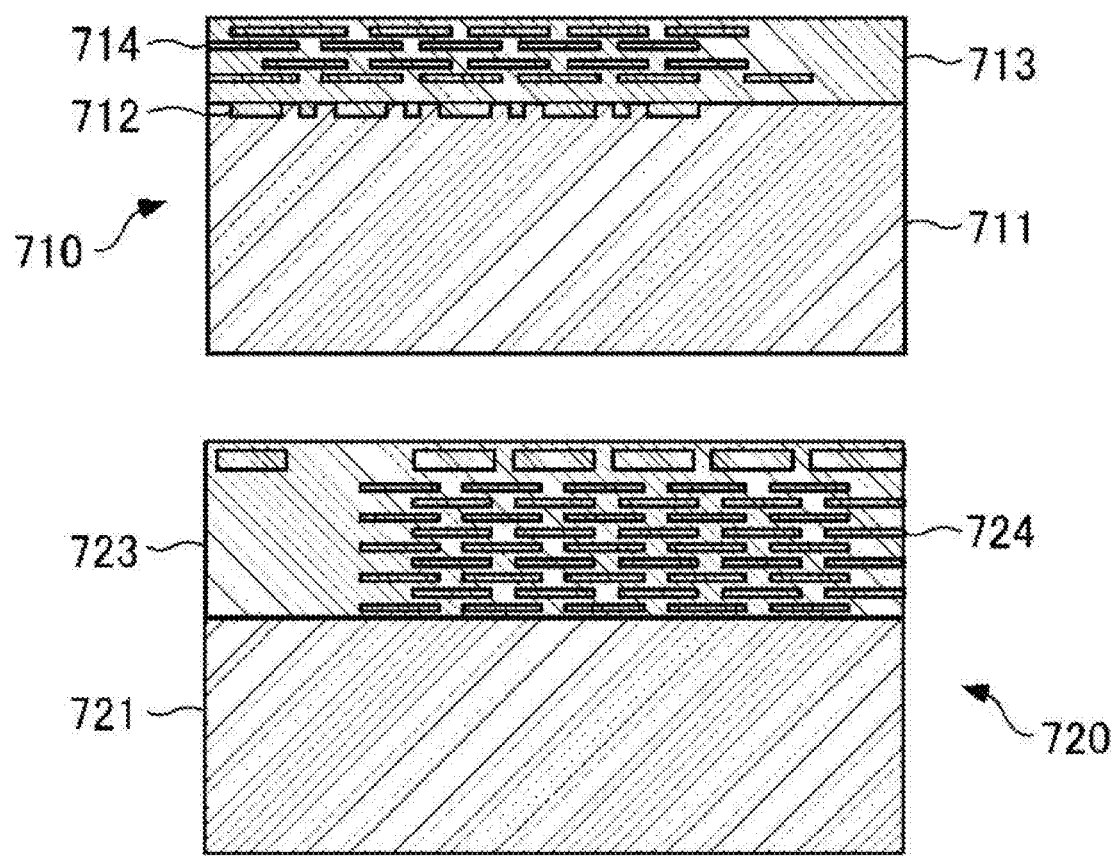
FIG. 38 is a diagram illustrating one stage in a manufacturing process for an image sensor 700.

As illustrated in FIG. 38, the image sensor 700 is manufactured by stacking and bonding the pixel substrate 710 and the circuit substrate 720. The pixel substrate 710 includes a light receiving element 712 formed on a surface of the base substrate 711 and a wiring layer 714 formed in an insulating layer 713 bonded to the base substrate 711. The circuit substrate 720 includes an insulating layer 723 and a wiring layer 724 bonded to the surface of a base substrate 721 as well as various other elements. The thickness of the base substrate 711 of the pixel substrate 710 and the thickness of the base substrate 721 of the circuit substrate 720 are substantially the same.

Figure 39:
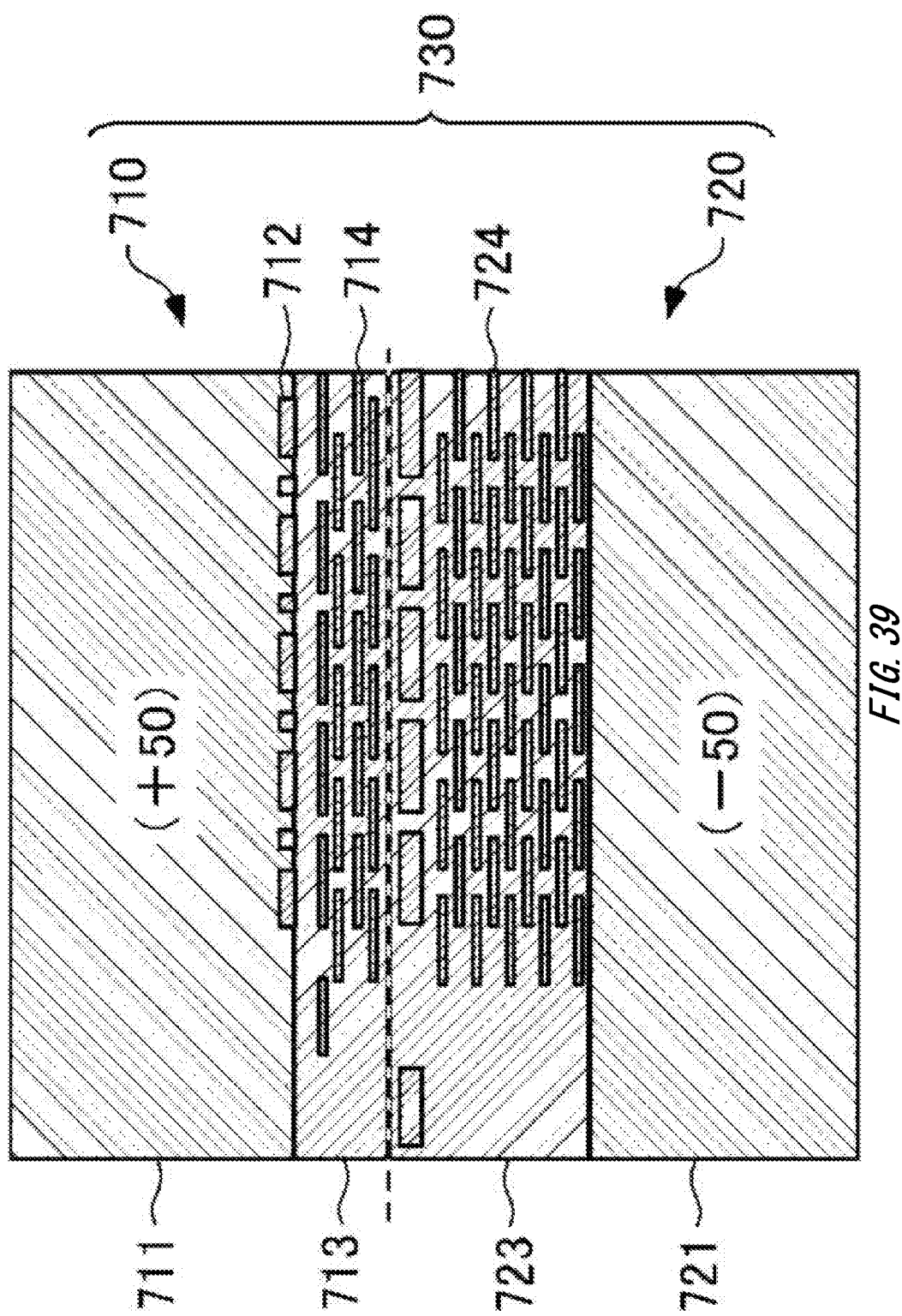
FIG. 39 is a diagram illustrating another stage in the manufacturing process for the image sensor 700.

When the image sensor 700 is manufactured, first of all, the pixel substrate 710 and the circuit substrate 720 are bonded to the pixel substrate 710 flipped upside down so that the insulating layers 713 and 723 are bonded while face each other to form a stacked substrate 730 as illustrated in FIG. 39. Thus, a circuit on the pixel substrate 710 including the light receiving element 712 and the wiring layer 714 is coupled to a circuit on the circuit substrate 720 including the wiring layer 724.

As described above, the respective base substrates 711 and 721 of the pixel substrate 710 and the circuit substrate 720 have substantially the same thickness. Thus, the distortion produced in the base substrates 711 and 721 in the bonding process described above is substantially equally distributed to both the pixel substrate 710 and the circuit substrate 720 in the stacked substrate 730.

For example, when a bonding method in which the pixel substrate 710 is released to cause a bonding wave in the bonding process is performed for the bonding to the circuit substrate 720, the distortion of +50 (relative value) resulting in an increase in the magnification with respect to the design value on the pixel substrate 710 side is produced, and the distortion of −50 (relative value) resulting in a decrease in the magnification with respect to the design value on the circuit substrate 720 side is produced. The stacked substrate 730 at this stage has this ratio of distortion maintained.

Then, as illustrated in FIG. 40, the base substrate 721 in the circuit substrate 721 in the circuit substrate 720 is thinned by mechanical chemical polishing. This results in a state where the thicknesses of the base substrates 711 and 721 are largely different from each other. Thus, the strength of the base substrate 721 in the circuit substrate 720 thus thinned is compromised, resulting in the stress of the base substrate 711 in the pixel substrate 710 being dominant over the entire stacked substrate 730. As a result, as indicated by numerical values (relative values) in the figure, the stress is released and the distortion is (0) in the pixel substrate 710, whereas substantially all the distortion (−100) is concentrated in the circuit substrate 720.

Next, as illustrated in FIG. 41, a supporting substrate 740 is bonded to a surface of the base substrate 721 of the circuit substrate 720 on the lower side in the figure. The supporting substrate 740 has substantially the same thickness as the base substrate 711 and the base substrate 721 before the thinning.

The supporting substrate 740 has no structure such as element and wiring formed, and thus can be bonded to the back surface of the base substrate 721 with a bonding method involving no distortion and without the need for taking the alignment accuracy with respect to the circuit substrate 720 into consideration. Thus, the crystal structure on the bonding surface of the base substrate 721 of the circuit substrate 720 as a bonding target of the supporting substrate 740 is checked, and the determination device 600 determines the crystal structure on the bonding surface of the supporting substrate 740 that can be bonded to the base substrate 721 without producing new distortion.

Thus, the distortion concentrated in the base substrate 721 can be fixed, with no distortion produced due to the bonding of the supporting substrate 740. In other words, with no new distortion produced in the circuit substrate 720, a state where the distortion in the pixel substrate 710 is (0) is maintained.

Next, as illustrated in FIG. 42, the base substrate 711 in the pixel substrate 710 is thinned by mechanical chemical polishing. As a result, incident light that has passed through the base substrate 711 can reach the light receiving element 712, whereby the image sensor 700 of a back illumination type is formed. In the image sensor 700, optical elements such as a color filter and a micro lens may be further stacked on the back surface of the thinned base substrate 711 as a surface on the pixel substrate 710 side which is illustrated as the upper surface in the figure.

In the image sensor 700 as described above, a state where the distortion in the pixel substrate 710 is small is maintained after the stage illustrated in FIG. 40, and the state where the distortion is low is maintained in the image sensor 700 in the completed state. Thus, optical elements such as a micro lens can be formed while being accurately aligned with respect each of the light receiving elements 712, with no distortion of the arrangement of the light receiving element 712.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES 100 bonding device, 110 casing, 120, 130 substrate cassette, 140 conveyance unit, 150 control unit, 211, 213, 215 substrate, 212 scribe line, 214 notch, 216 circuit region, 218 alignment mark, 221, 223 substrate holder, 225 attraction surface, 230, 240 stacked substrate, 300 bonding unit, 310 frame body, 312 bottom plate, 316 top plate, 322 upper stage, 324, 334 microscope, 326, 336 activation device, 331 X direction driving unit, 332 lower stage, 333 Y direction driving unit, 338 lifting and lowering driving unit, 339 rotation driving unit, 400 holder stocker, 500 pre-aligner, 600, 601 determination device, 610 reception unit, 620 storage unit, 621 first storage unit, 622 second storage unit, 623 third storage unit, 624 fourth storage unit, 627, 629 table, 630 calculation unit, 640 determining unit, 641 first determining unit, 642 second determining unit, 643 third determining unit, 644 fourth determining unit, 645 fifth determining unit, 650 output unit, 700 image sensor, 710 pixel substrate, 711, 721 base substrate, 712 light receiving element, 713, 723 insulating layer, 714, 724 wiring layer, 720 circuit substrate, 730 stacked substrate, 740 supporting substrate, 800 wafer process device, 810 coater, 820 exposure device, 830 film forming device, 840 control unit, 901 manufacturing apparatus

What is claimed is:

1. A manufacturing method for manufacturing a stacked substrate by bonding two substrates, the method comprising:
   acquiring information about crystal structures of a plurality of substrates; and
   determining a combination of two substrates to be bonded to each other, based on the information about the crystal structures.

2. The manufacturing method according to claim 1, wherein the information about the crystal structures includes at least one of plane orientations of bonding surfaces of the substrates and crystal orientations in a direction in parallel with the bonding surfaces.

3. The manufacturing method according to claim 1, wherein the determining includes determining a combination of the two substrates with a misalignment amount after bonding being equal to or smaller than a predetermined threshold.

4. The manufacturing method according to claim 1, wherein the determining includes determining a combination of the two substrates with bonding surfaces having plane orientations being a predetermined combination.

5. The manufacturing method according to claim 1, further comprising storing the information about the crystal structures and information about rigidity distributions on bonding surfaces of each of the two substrates which are associated with each other, wherein the determining includes determining a combination of the two substrates with the respective bonding surfaces having rigidity distributions being predetermined rigidity distributions.

6. The manufacturing method according to claim 1, further comprising determining a rotation amount of one of the two substrates with respect to the other within bonding surfaces.

7. The manufacturing method according to claim 6, further comprising outputting an exposure condition for exposure based on the rotation amount to an exposure device.

8. The manufacturing method according to claim 6, further comprising outputting a holding condition for holding at least one of the two substrates when being bonded, based on the rotation amount to a bonding device.

* * * * *